(12) United States Patent
Veeramani

(10) Patent No.: US 12,146,898 B2
(45) Date of Patent: Nov. 19, 2024

(54) MULTI-BEAM PROBES WITH DECOUPLED STRUCTURAL AND CURRENT CARRYING BEAMS AND METHODS OF MAKING

(71) Applicant: Microfabrica Inc., Van Nuys, CA (US)

(72) Inventor: Arun S. Veeramani, Vista, CA (US)

(73) Assignee: Microfabrica Inc., Van Nuys (CA)

( * ) Notice: Subject to any disclaimer, the term of this patent is extended or adjusted under 35 U.S.C. 154(b) by 3 days.

(21) Appl. No.: 17/888,384

(22) Filed: Aug. 15, 2022

(65) Prior Publication Data

US 2024/0094259 A1    Mar. 21, 2024

Related U.S. Application Data

(63) Continuation-in-part of application No. 17/493,802, filed on Oct. 4, 2021.

(60) Provisional application No. 63/233,089, filed on Aug. 13, 2021, provisional application No. 63/087,134, filed on Oct. 2, 2020.

(51) Int. Cl.
*G01R 1/073* (2006.01)
*G01R 1/067* (2006.01)

(52) U.S. Cl.
CPC ..... *G01R 1/07357* (2013.01); *G01R 1/06722* (2013.01); *G01R 1/06738* (2013.01)

(58) Field of Classification Search
CPC ............ G01R 1/07357; G01R 1/06722; G01R 1/06738
See application file for complete search history.

(56) References Cited

U.S. PATENT DOCUMENTS

| 4,027,935 A | 6/1977 | Byrnes et al. |
| 4,116,523 A | 9/1978 | Coberly et al. |
| 4,737,114 A | 4/1988 | Yaegashi |
| 4,764,722 A | 8/1988 | Coughlin et al. |

(Continued)

FOREIGN PATENT DOCUMENTS

| EP | 0897655 B1 | 7/2000 |
| JP | 2734412 B2 | 3/1998 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — G. M. A Hyder
(74) *Attorney, Agent, or Firm* — Holland & Hart LLP

(57) ABSTRACT

Probe structures having multiple beams are joined at their ends with at least one functioning as a current carrying beam (i.e. an electrical beam) and at least one functioning as a structural beam (i.e. non-current carrying beam) that conveys desired mechanical or structural parameters for the probe such as spring force, scrubbing, over travel, operational stability and repeatability, and the like. The current carrying beam provides little with regard to mechanical properties, and the structural beam is separated from the current carrying beam along a majority of its length and does not pass current between the probe ends due to its dielectric nature or the presence of at least one dielectric barrier located at an end or along its length.

50 Claims, 47 Drawing Sheets

(56) References Cited

U.S. PATENT DOCUMENTS

| | | |
|---|---|---|
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,286,208 A | 2/1994 | Matsuoka |
| 5,321,685 A | 6/1994 | Nose et al. |
| 5,476,211 A | 12/1995 | Khandros |
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,967,856 A | 10/1999 | Meller |
| 5,994,152 A | 11/1999 | Khandros et al. |
| 6,043,563 A | 3/2000 | Eldridge et al. |
| 6,184,053 B1 | 2/2001 | Eldridge et al. |
| 6,190,181 B1 | 2/2001 | Affolter et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,359,455 B1 | 3/2002 | Takekoshi |
| 6,414,501 B2 | 7/2002 | Kim et al. |
| 6,426,638 B1 | 7/2002 | Di Stefano |
| 6,471,524 B1 | 10/2002 | Nakano et al. |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,677,772 B1 | 1/2004 | Faull |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,220,134 B2 | 5/2007 | Goodman et al. |
| 7,256,593 B2 | 8/2007 | Treibergs |
| 7,273,812 B2 | 9/2007 | Kim et al. |
| 7,279,917 B2 | 10/2007 | Williams et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,504,839 B2 | 3/2009 | Feigenbaum et al. |
| 7,504,840 B2 | 3/2009 | Arat et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |
| 8,299,394 B2 | 10/2012 | Theppakuttai et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 11,262,383 B1 | 3/2022 | Smalley |
| 2002/0013085 A1 | 1/2002 | Boyle et al. |
| 2002/0196038 A1 | 12/2002 | Okuno et al. |
| 2003/0001606 A1 | 1/2003 | Bende et al. |
| 2004/0051541 A1 | 3/2004 | Zhou et al. |
| 2005/0070170 A1 | 3/2005 | Zhang et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0253606 A1 | 11/2005 | Kim et al. |
| 2005/0280433 A1* | 12/2005 | Nelson ............... G01R 1/06722 324/755.05 |
| 2006/0006888 A1 | 1/2006 | Kruglick et al. |
| 2006/0051948 A1 | 3/2006 | Kim et al. |

(56) References Cited

U.S. PATENT DOCUMENTS

| | | |
|---|---|---|
| 2006/0053625 A1 | 3/2006 | Kim et al. |
| 2006/0170440 A1 | 8/2006 | Sudin |
| 2006/0238209 A1 | 10/2006 | Chen et al. |
| 2006/0279301 A1 | 12/2006 | Treibergs |
| 2007/0144841 A1 | 6/2007 | Chong et al. |
| 2007/0200576 A1 | 8/2007 | Laurent et al. |
| 2008/0106280 A1 | 5/2008 | Chen et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2008/0211524 A1 | 9/2008 | Chen et al. |
| 2009/0066351 A1 | 3/2009 | Arat et al. |
| 2009/0079455 A1 | 3/2009 | Gritters |
| 2009/0256583 A1 | 10/2009 | Chen et al. |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2010/0207654 A1 | 8/2010 | Hsu |
| 2011/0050263 A1 | 3/2011 | Sato et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0071037 A1 | 3/2012 | Balucani |
| 2012/0176122 A1 | 7/2012 | Hirata et al. |
| 2014/0065893 A1 | 3/2014 | Vinther |
| 2014/0231264 A1 | 8/2014 | Chen et al. |
| 2015/0015289 A1* | 1/2015 | Eldridge ............ G01R 1/06733 324/754.03 |
| 2017/0307657 A1 | 6/2017 | Crippa |
| 2017/0219623 A1 | 8/2017 | Choi et al. |
| 2017/0346211 A1 | 11/2017 | Kimura et al. |
| 2018/0024166 A1 | 1/2018 | Acconcia et al. |
| 2019/0383857 A1 | 12/2019 | Kister et al. |
| 2020/0064373 A1 | 2/2020 | Treibergs et al. |
| 2020/0241042 A1 | 7/2020 | Jeong et al. |
| 2023/0028352 A1 | 1/2023 | Vallauri et al. |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 4014040 B2 | 11/2007 |
| JP | 2008032400 A | 2/2008 |
| KR | 102202827 | 1/2021 |
| WO | 2007097559 A1 | 8/2007 |
| WO | 2021122326 A1 | 12/2020 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of the Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

"International Search Report and Written Opinion of the International Searching Authority," issued in connection with Int'l Appl. No. PCT/US2023/030219, dated Nov. 24, 2023 (11 pages).

International Search Report and Written Opinion, PCT/US2023/029598, mailed on Mar. 18, 2024.

\* cited by examiner

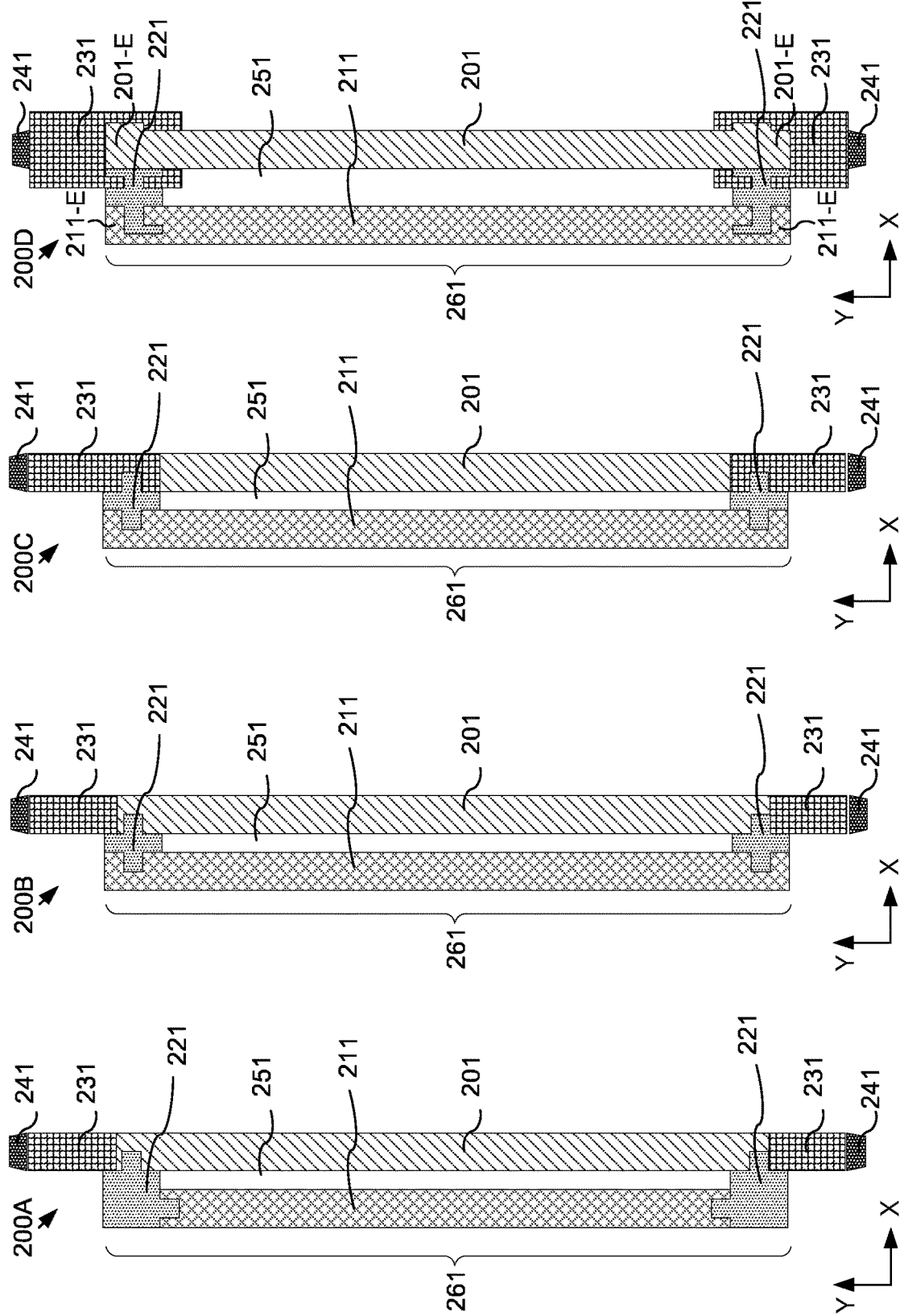

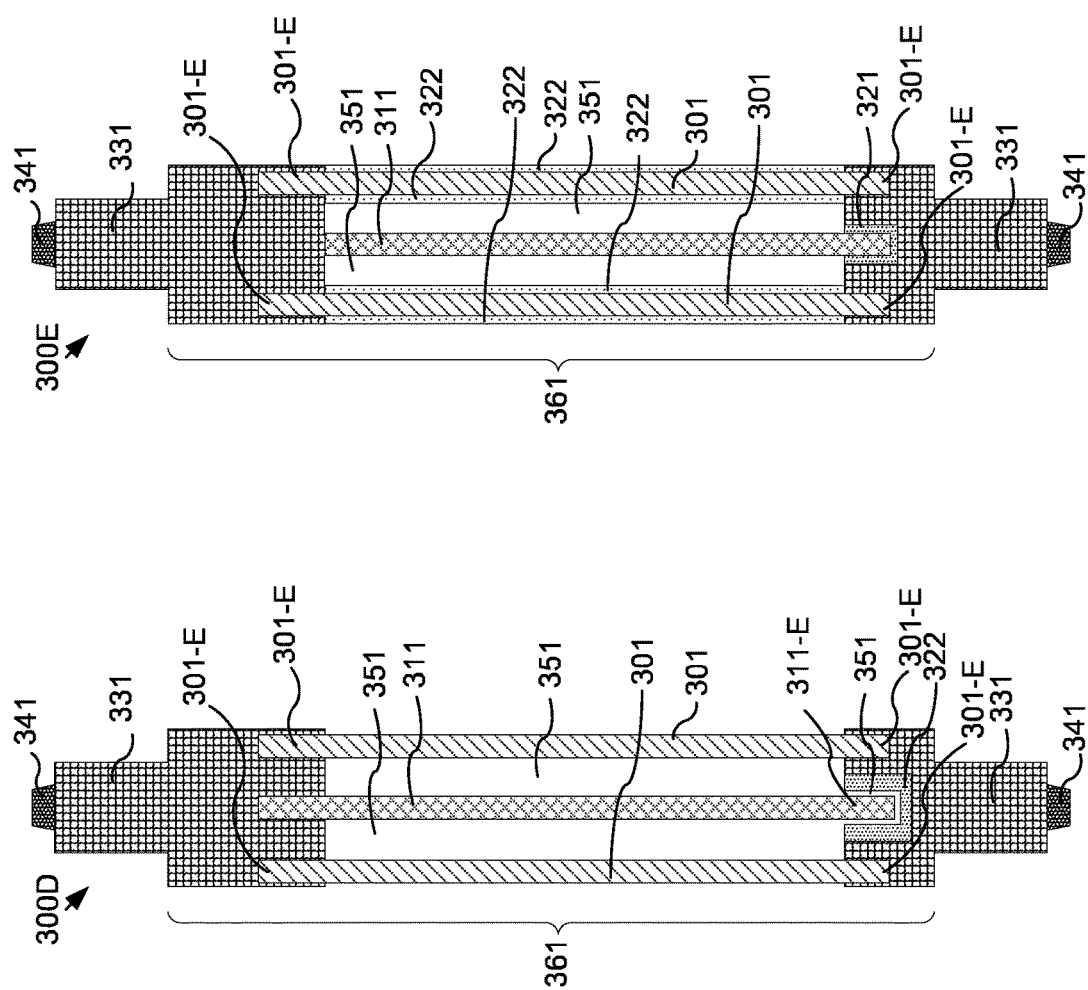

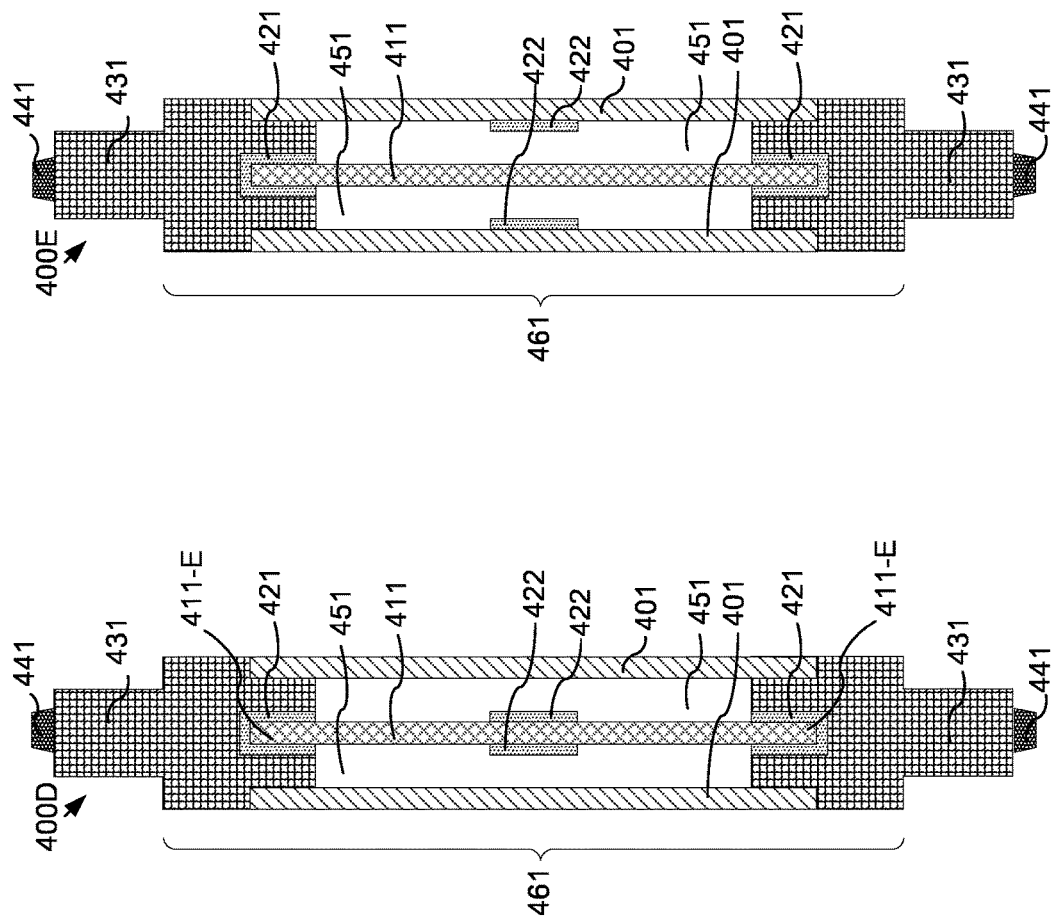

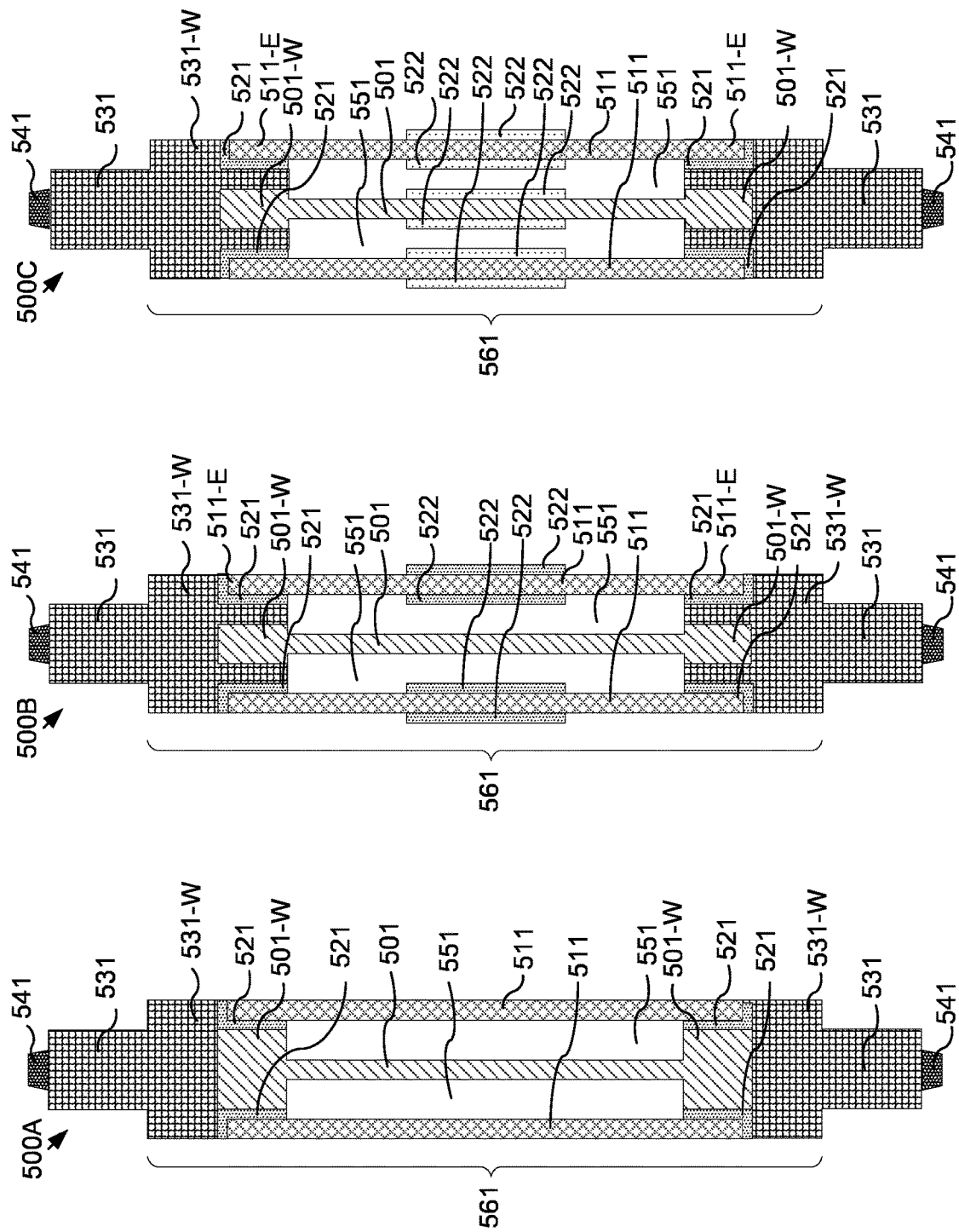

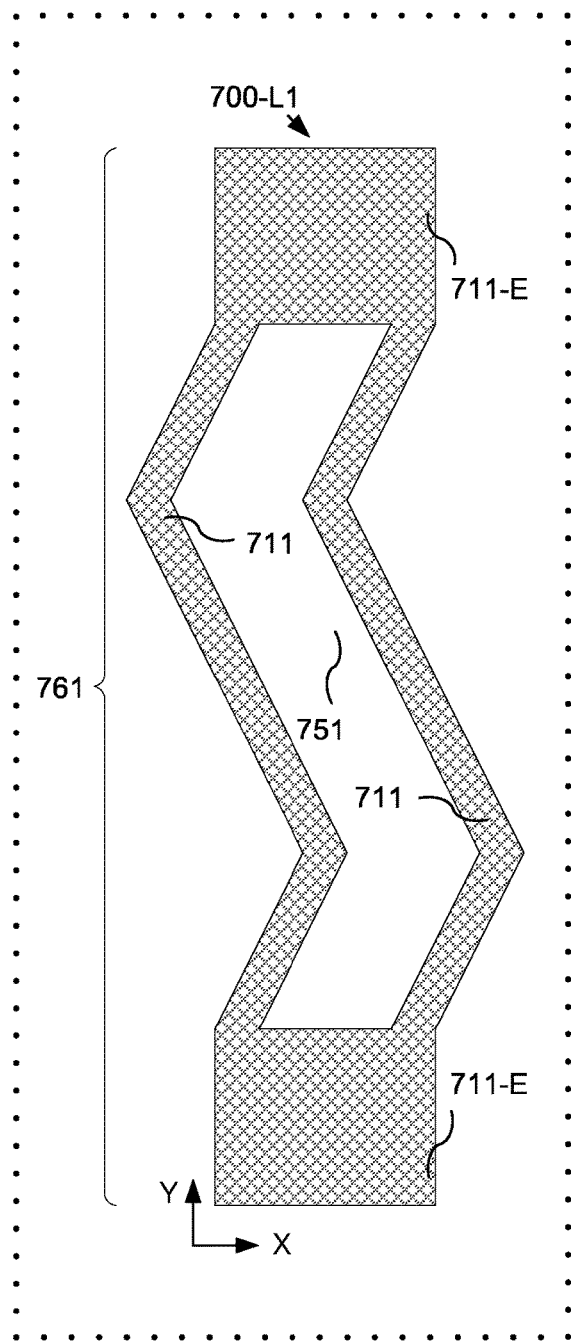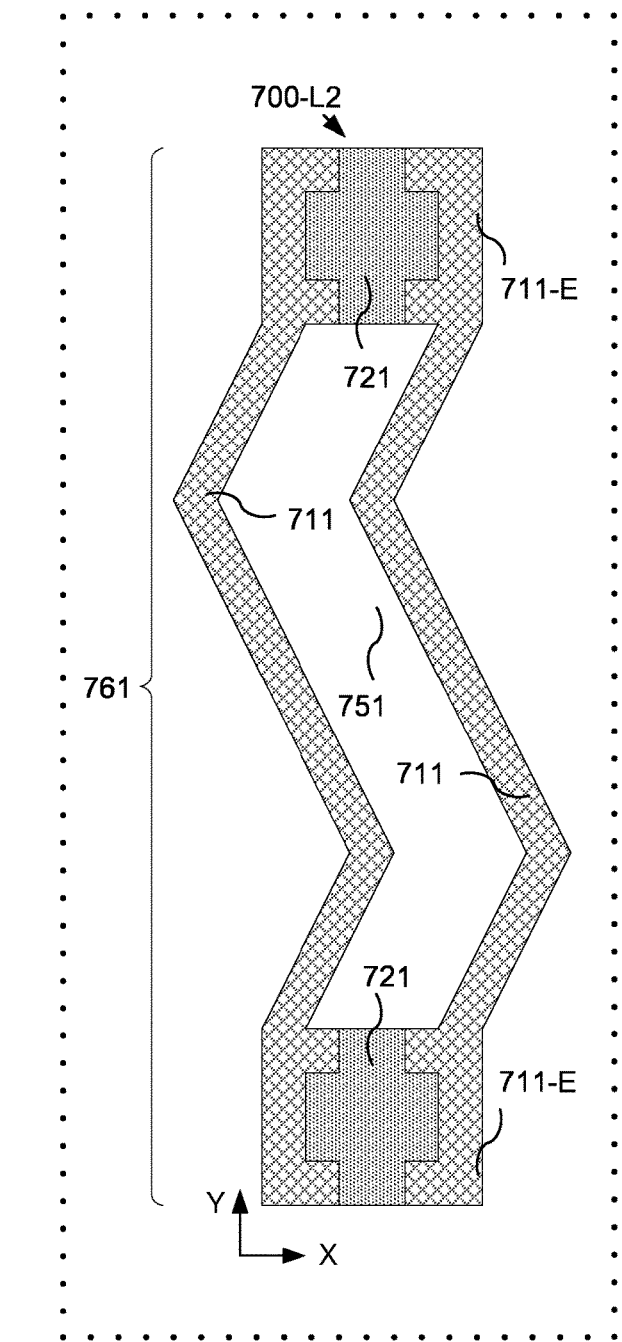
FIG. 7F-1  FIG. 7F-2

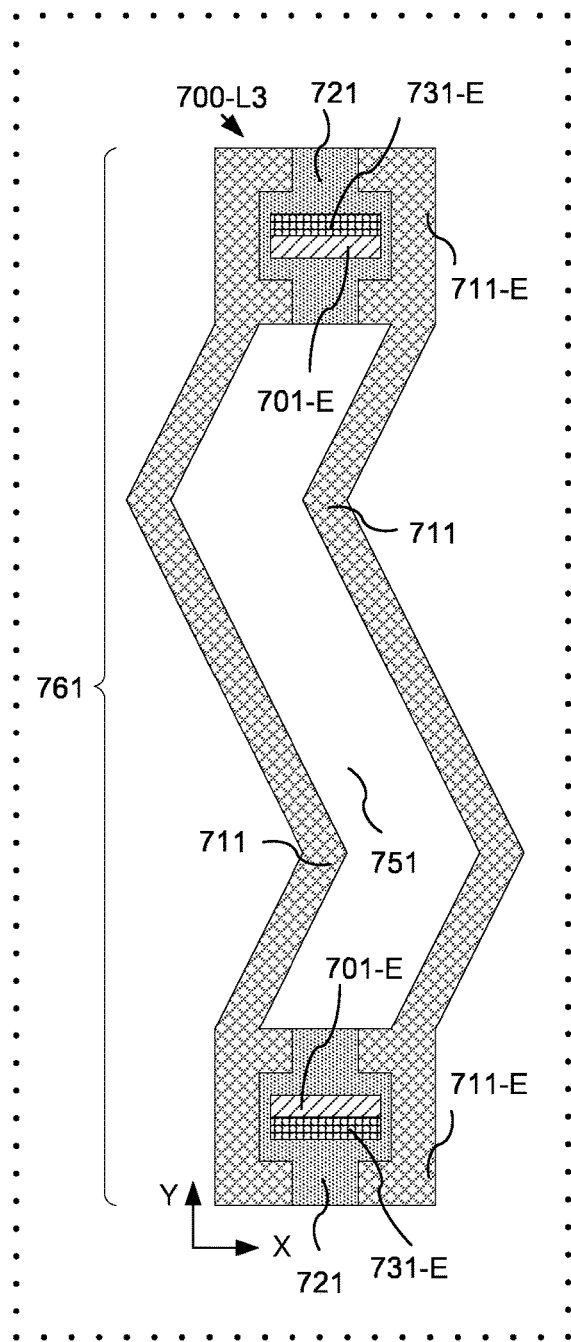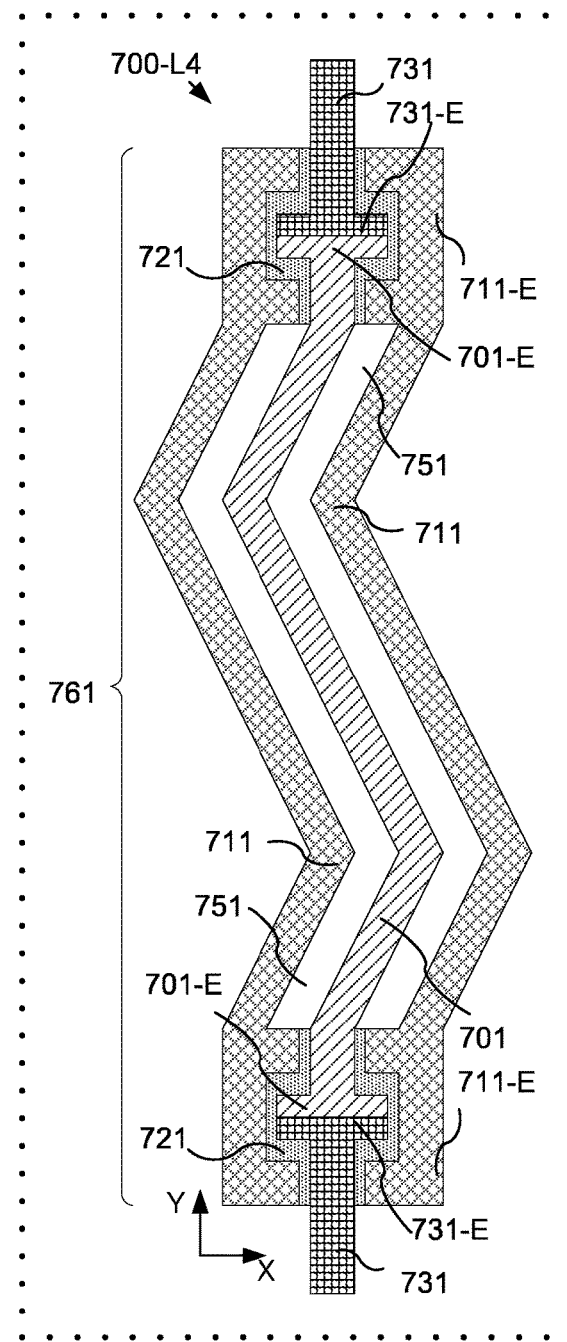
FIG. 7F-3        FIG. 7F-4

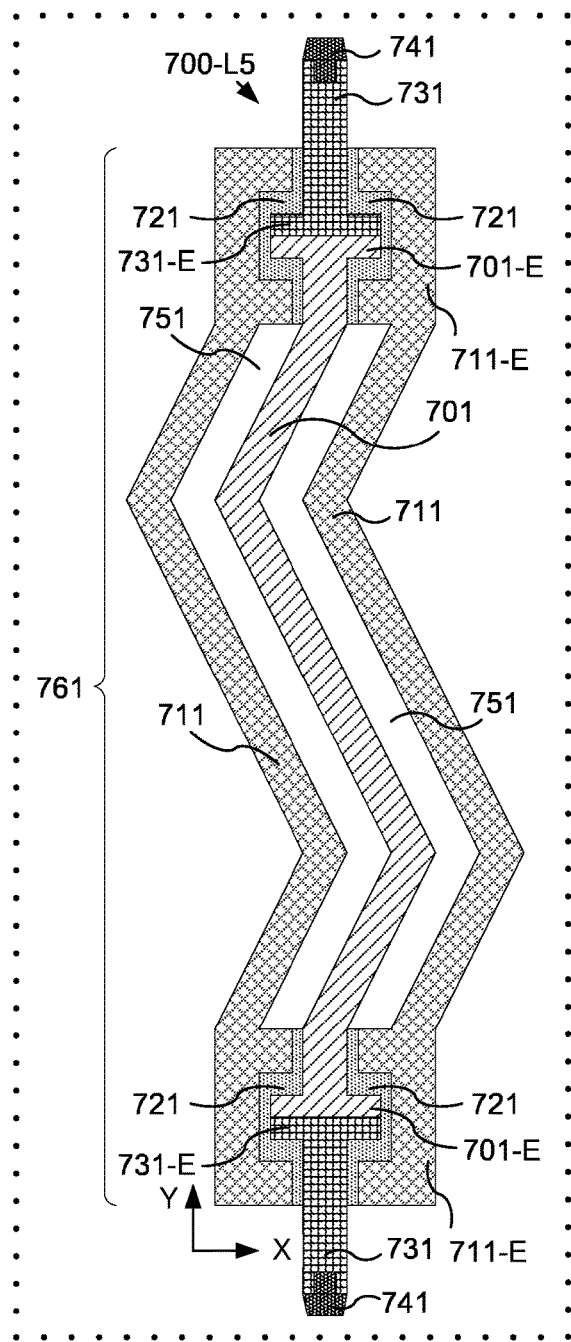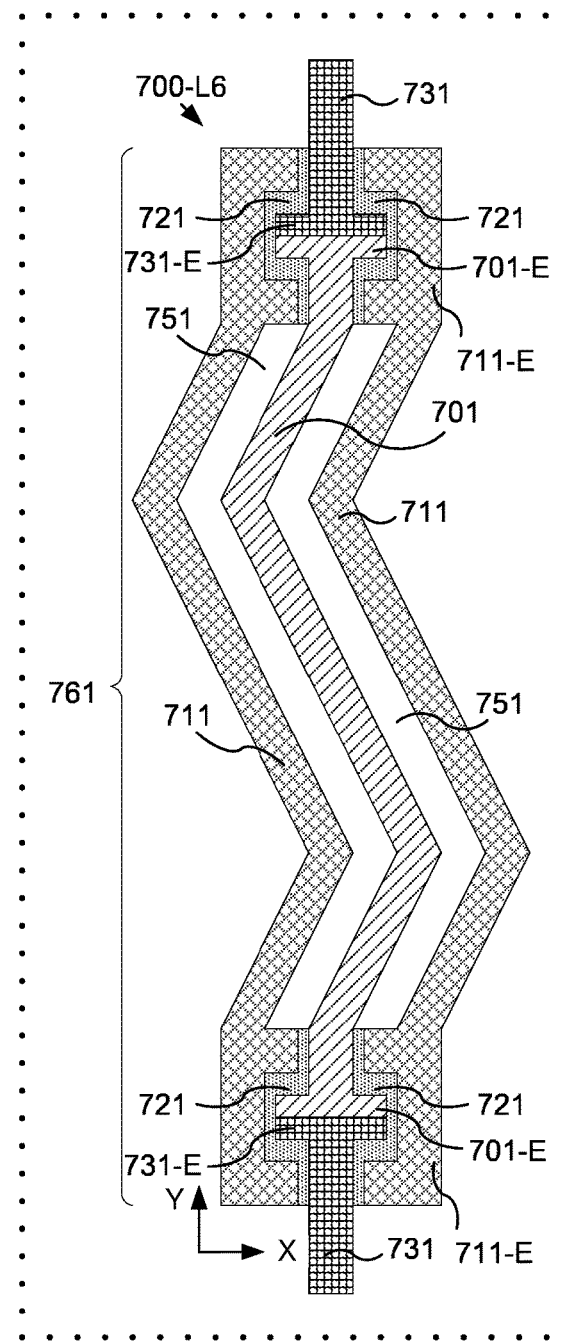
FIG. 7F-5    FIG. 7F-6

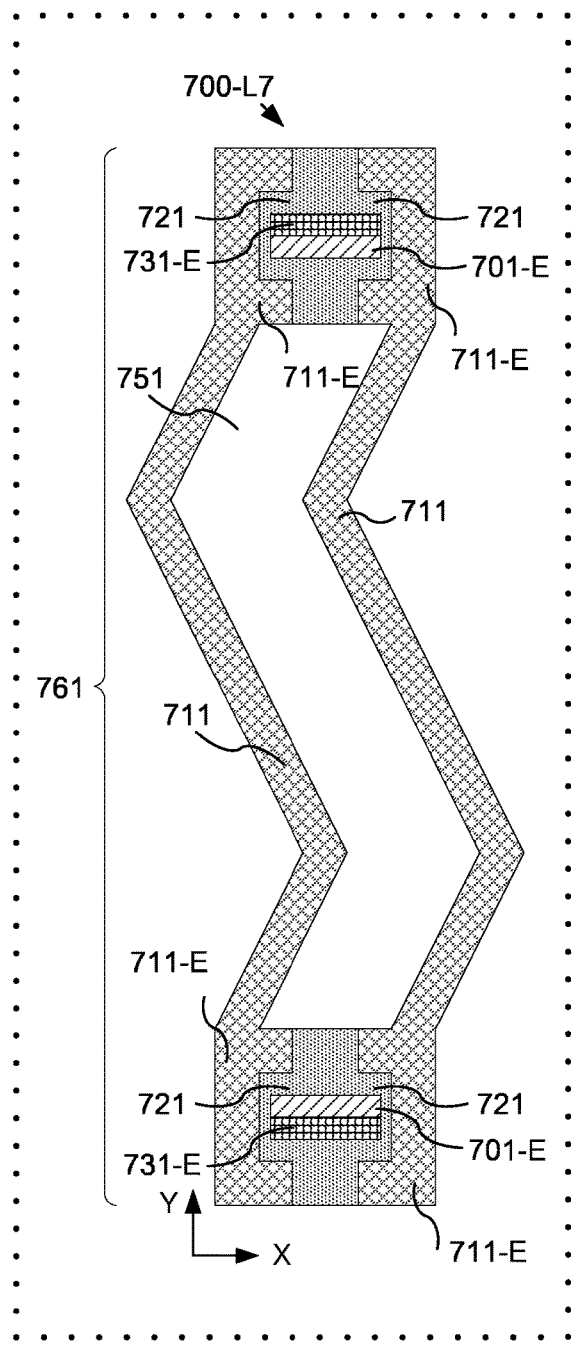 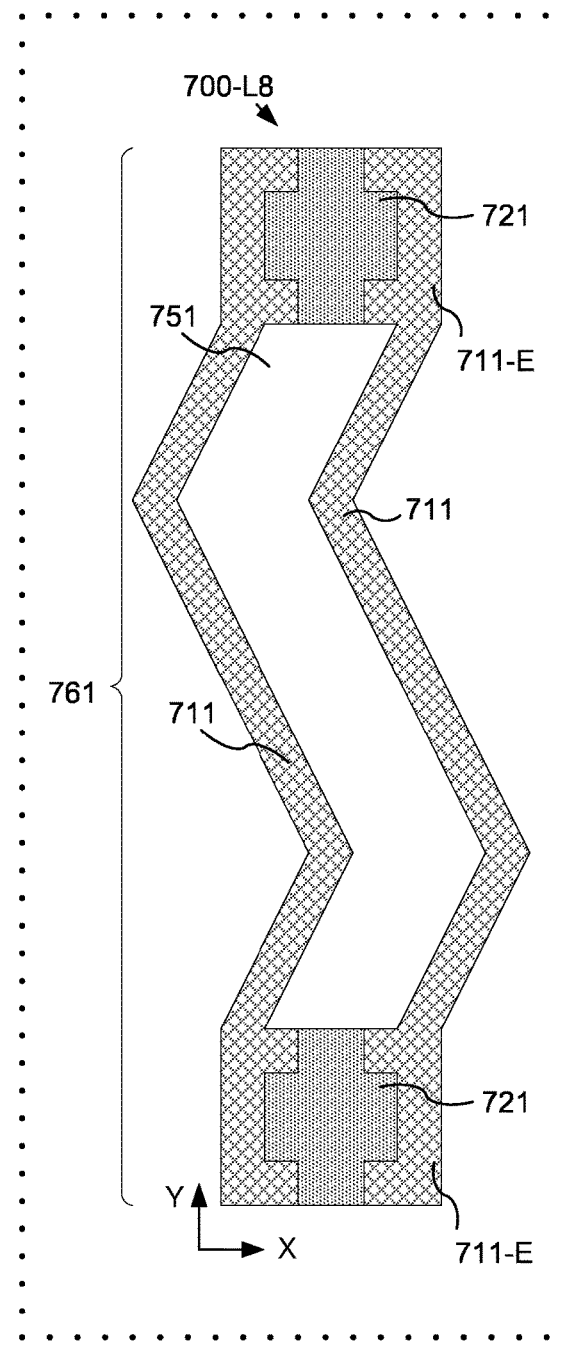
FIG. 7F-7    FIG. 7F-8

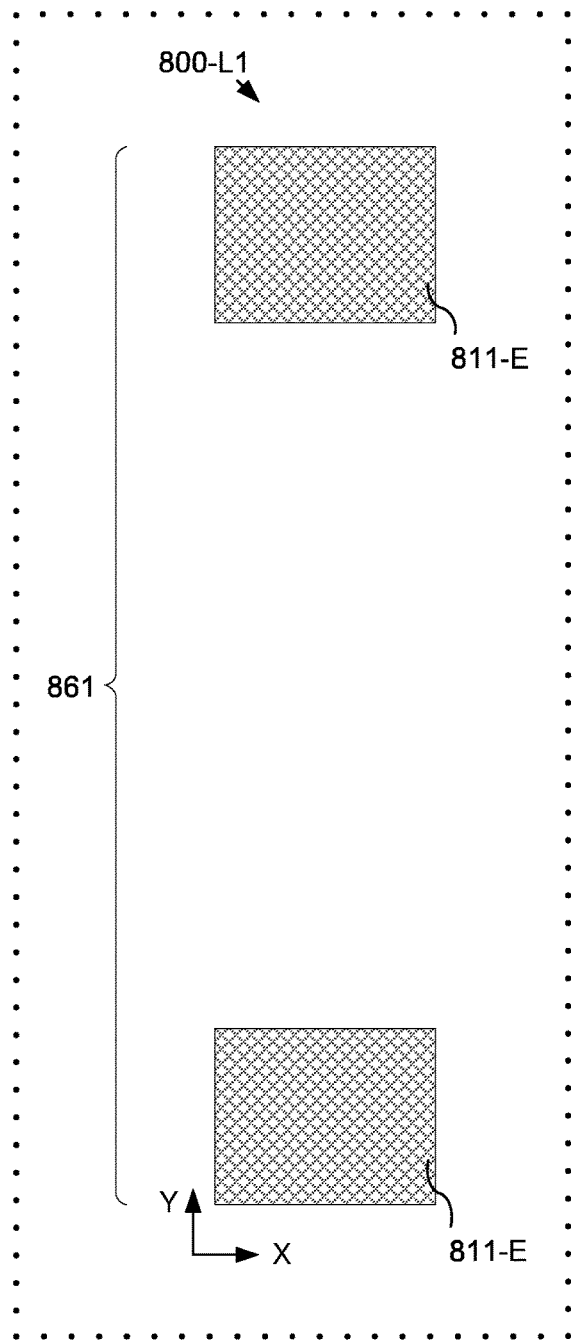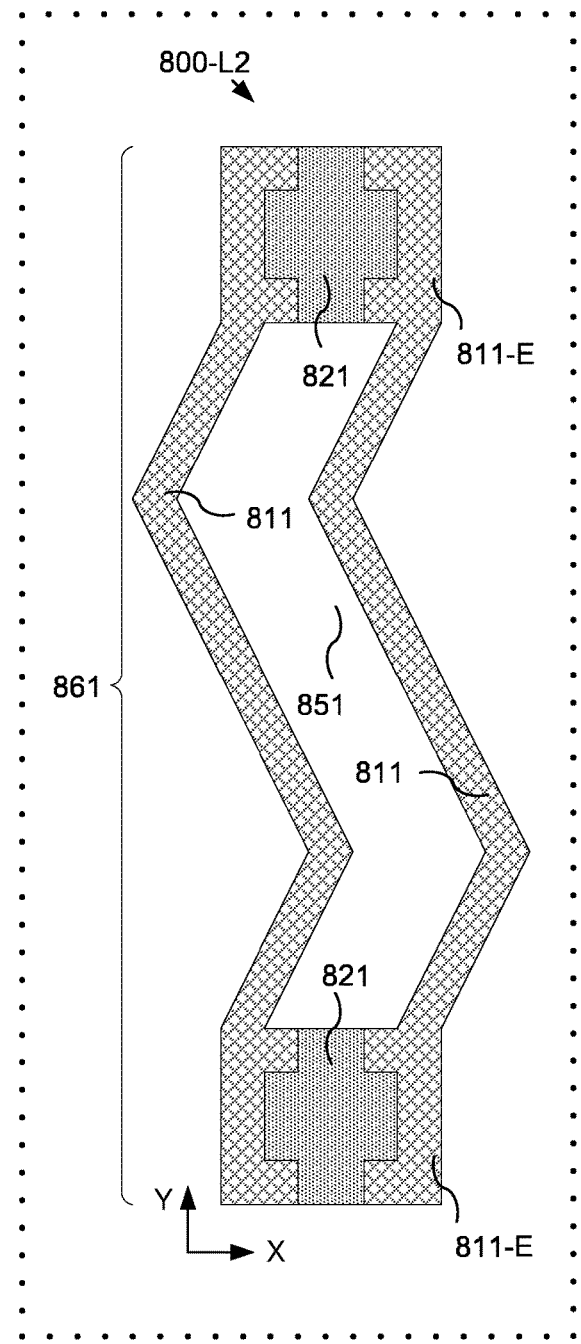
FIG. 8F-1  FIG. 8F-2

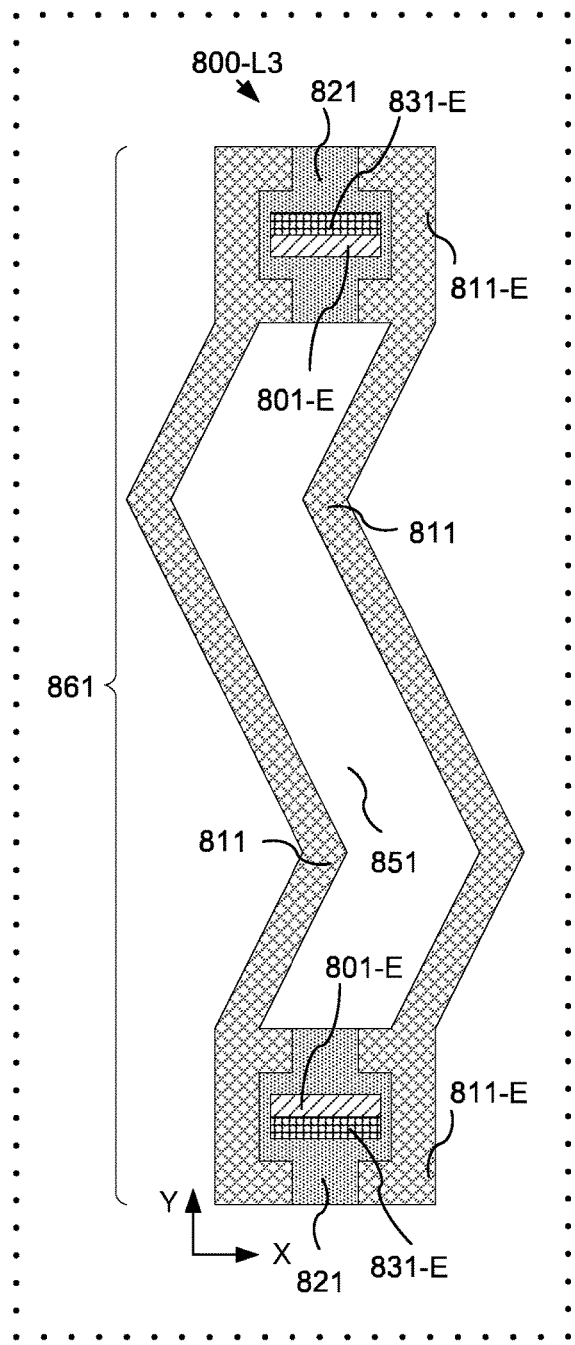
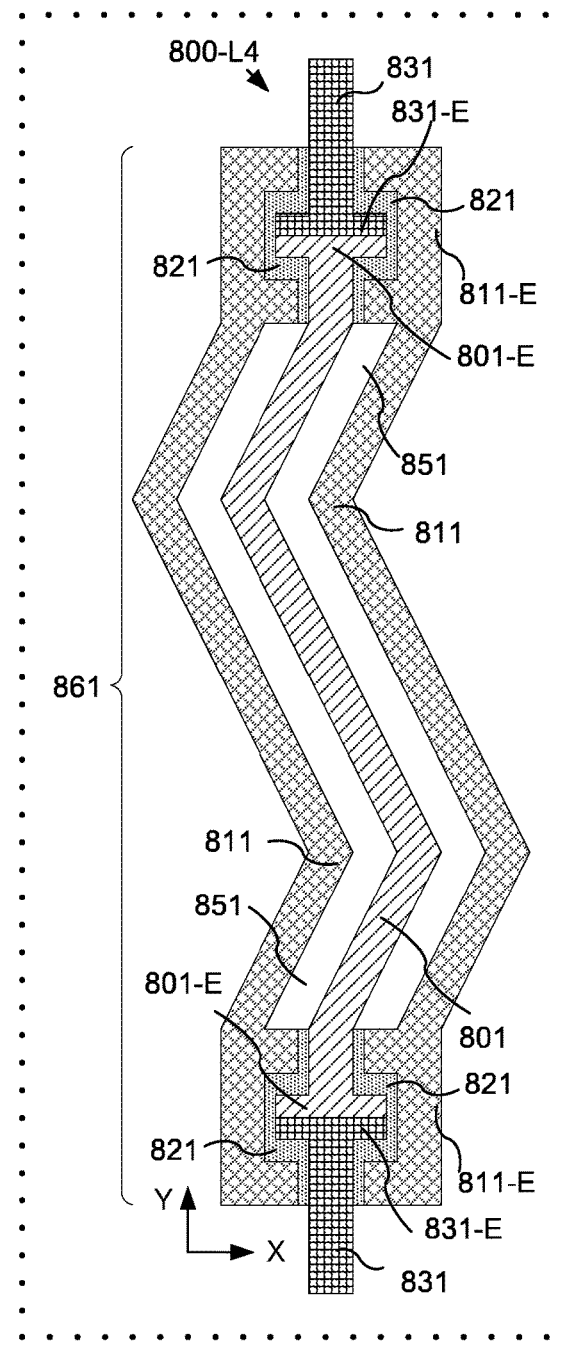
FIG. 8F-3     FIG. 8F-4

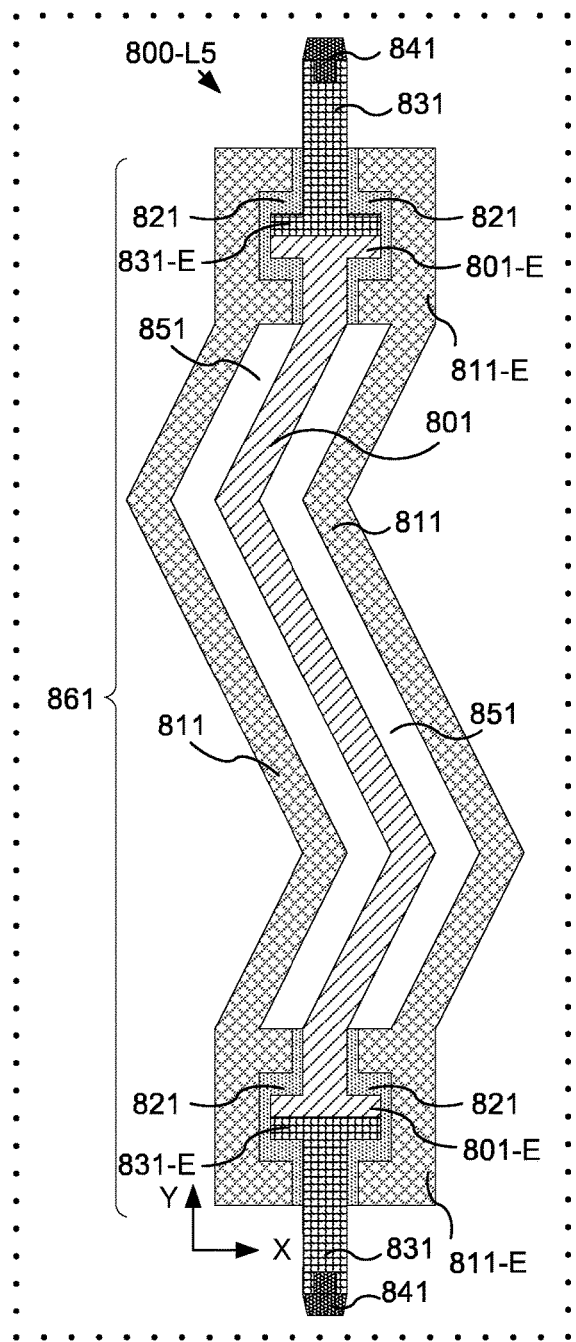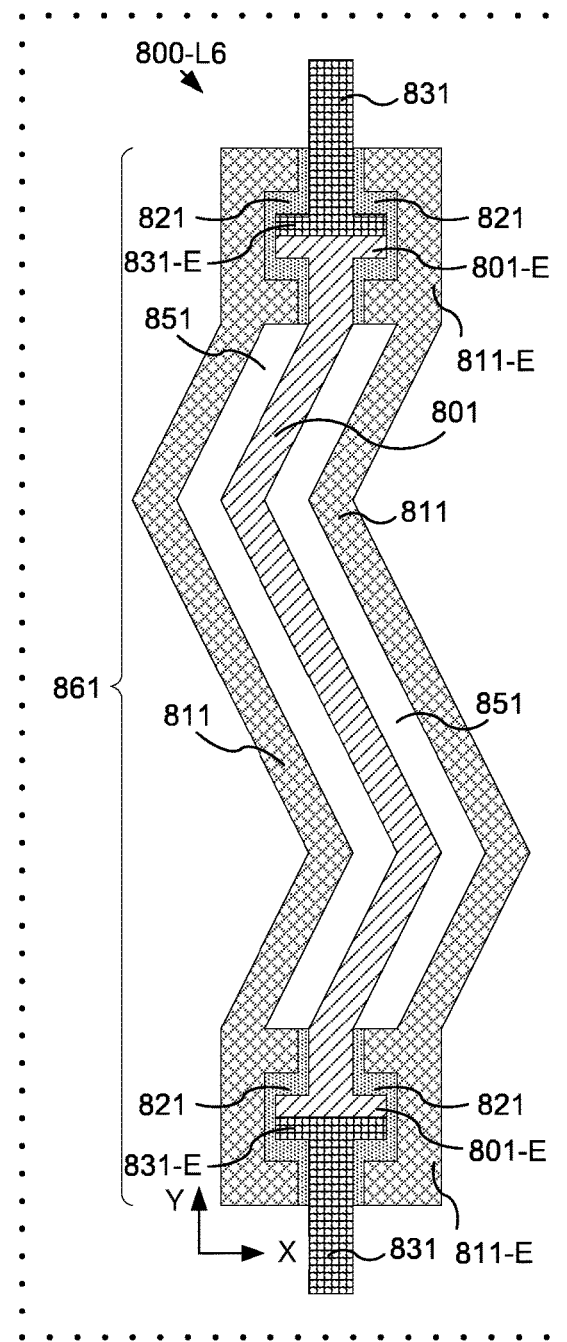
FIG. 8F-5        FIG. 8F-6

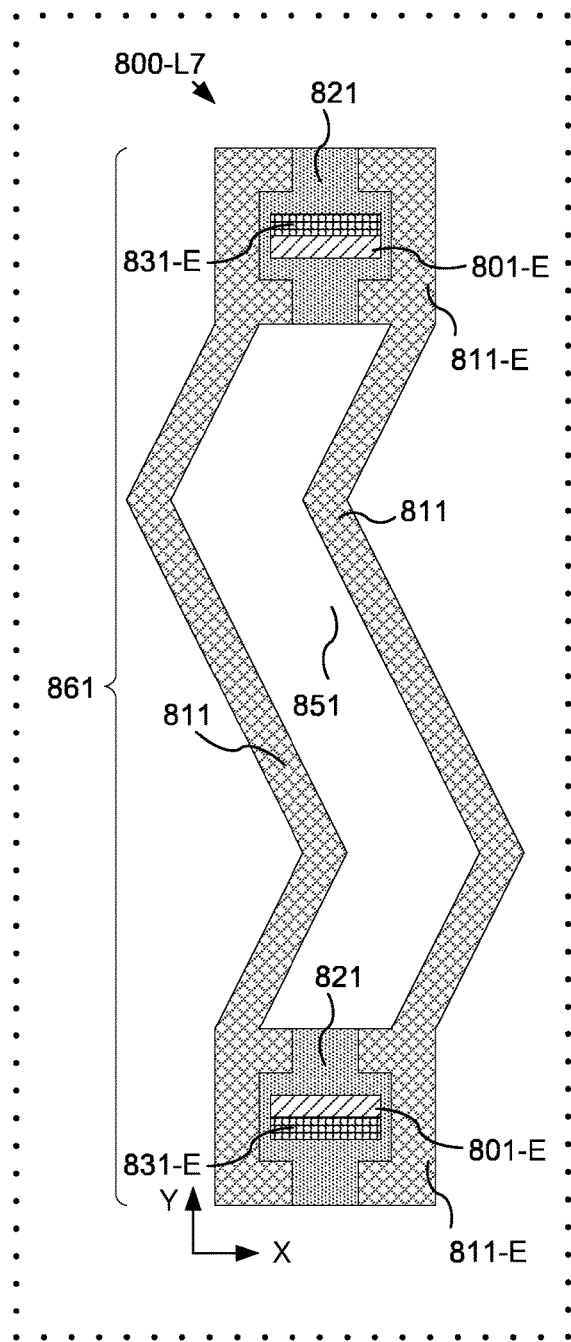
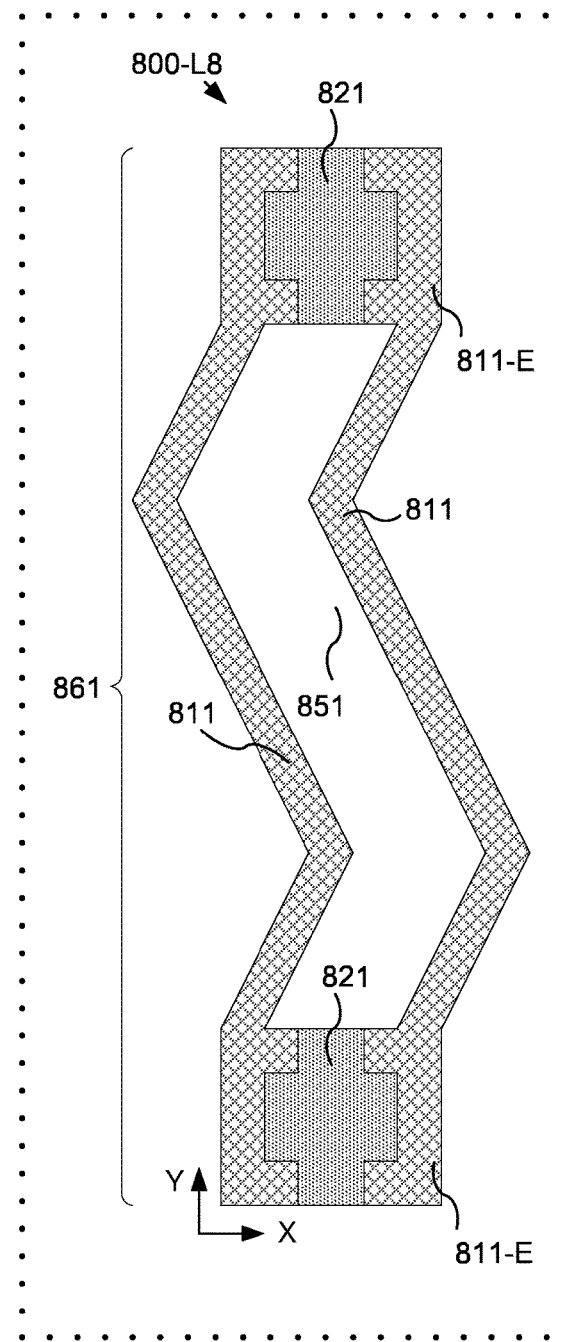
FIG. 8F-7    FIG. 8F-8

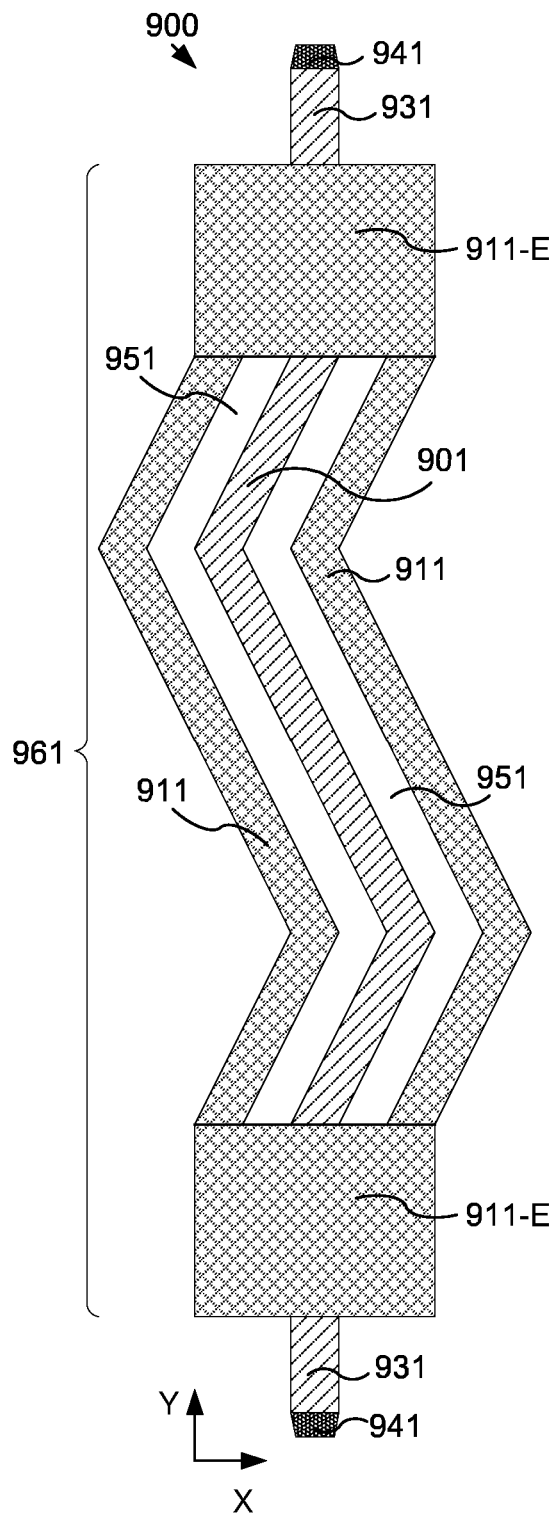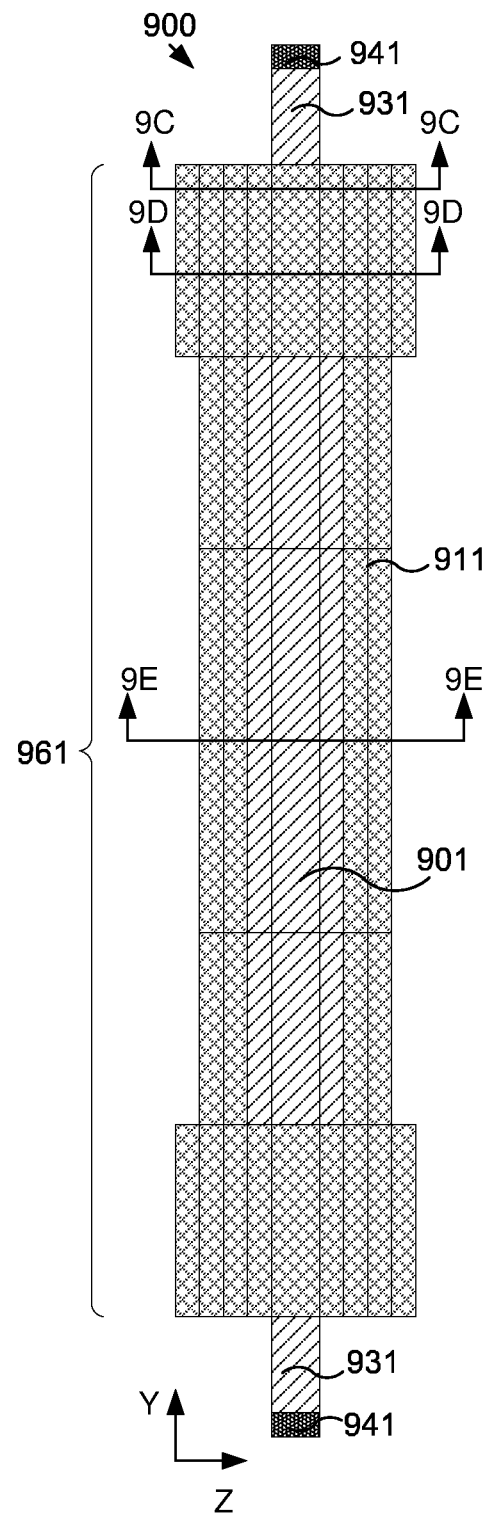
FIG. 9A-1   FIG. 9A-2

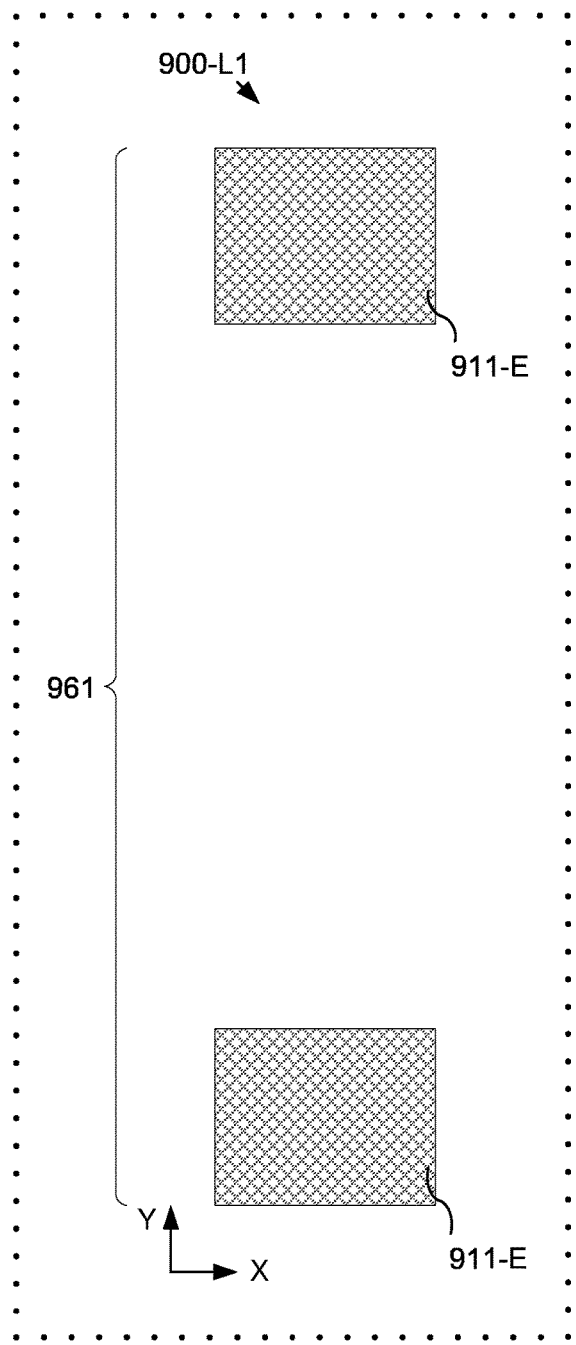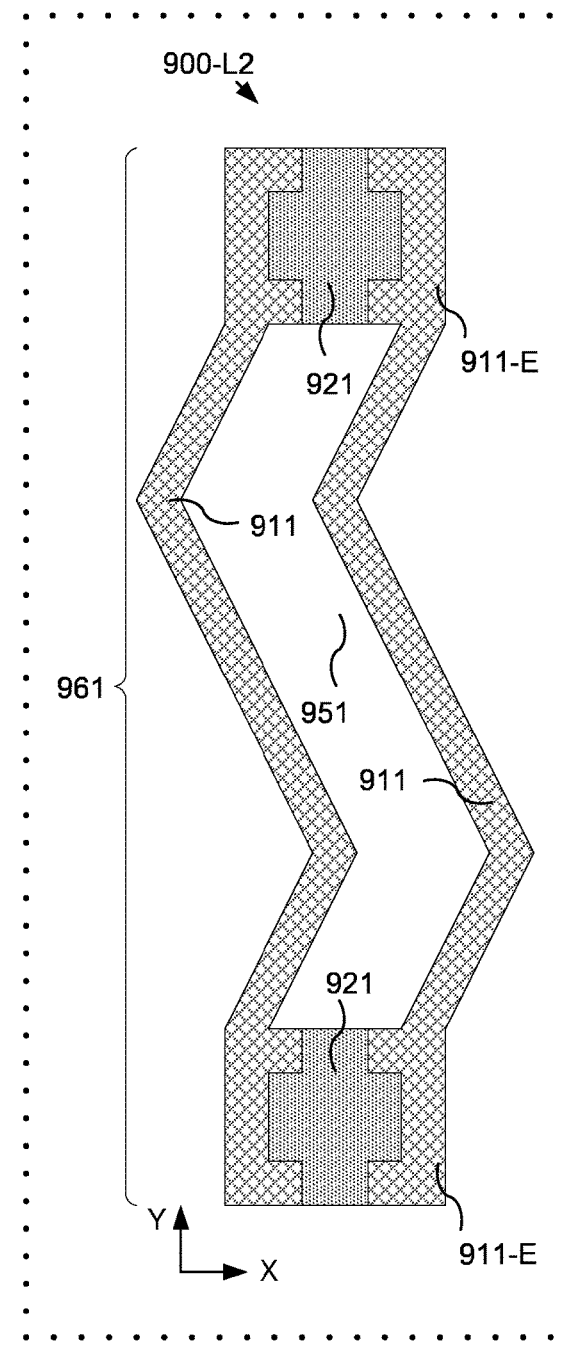
FIG. 9F-1  FIG. 9F-2

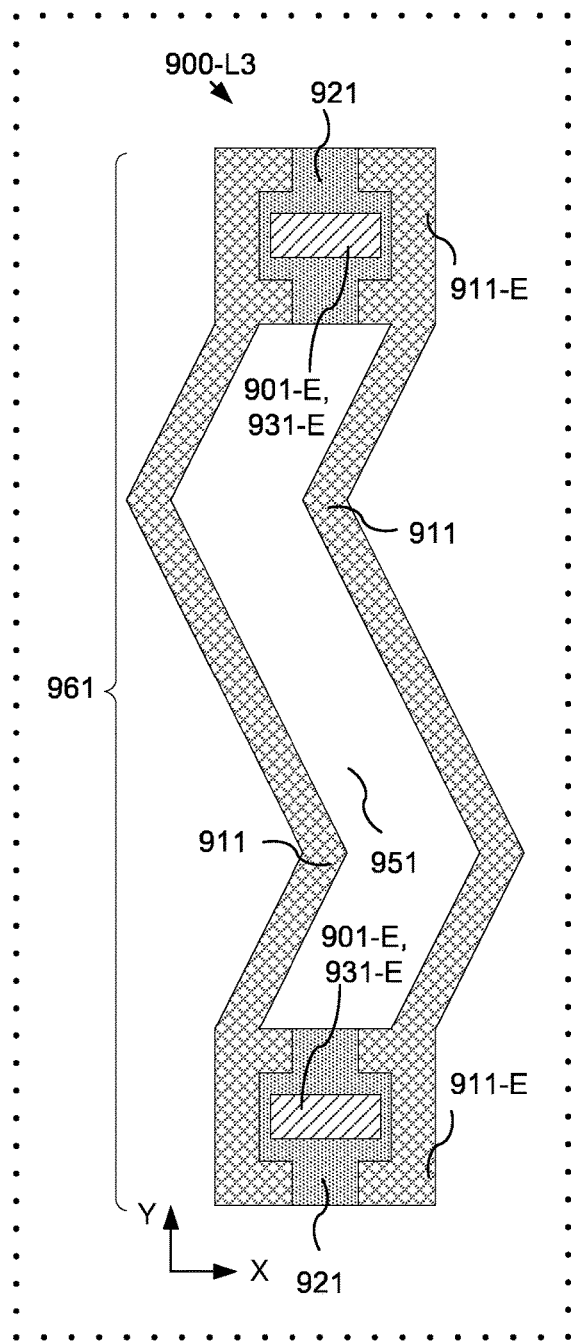
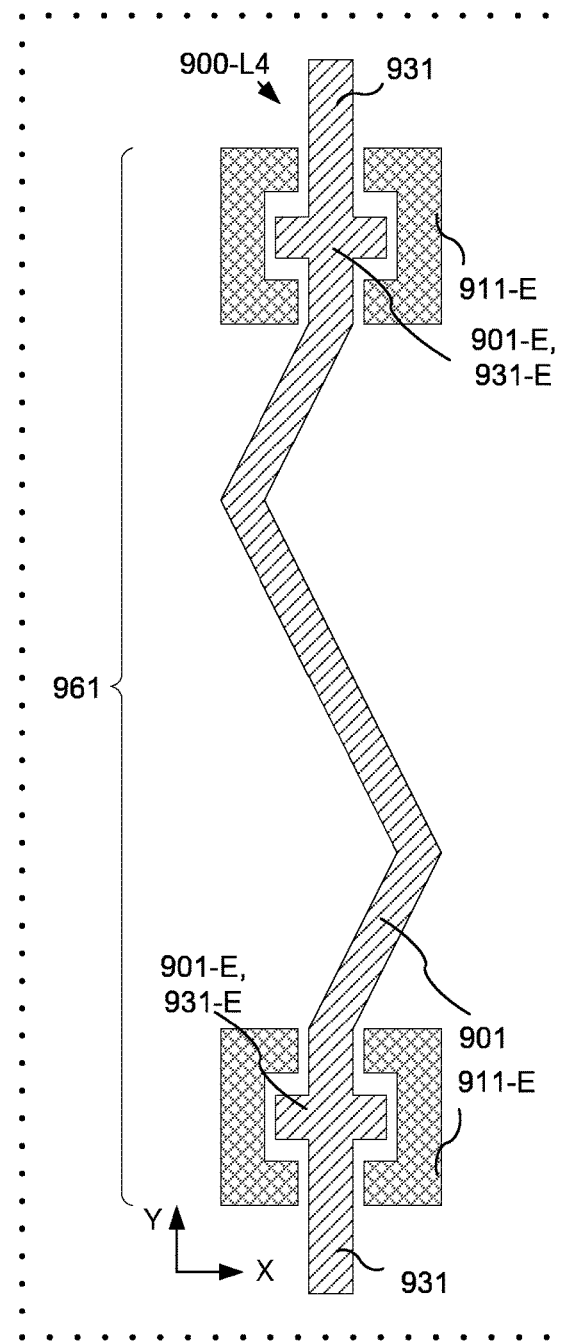
FIG. 9F-3  FIG. 9F-4

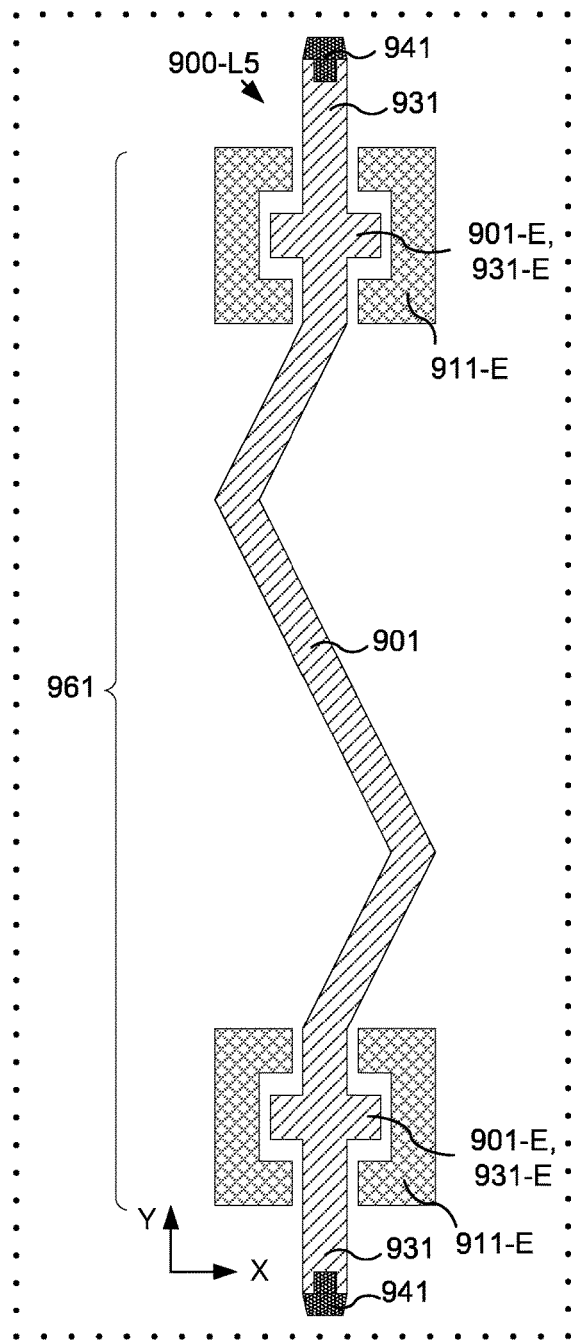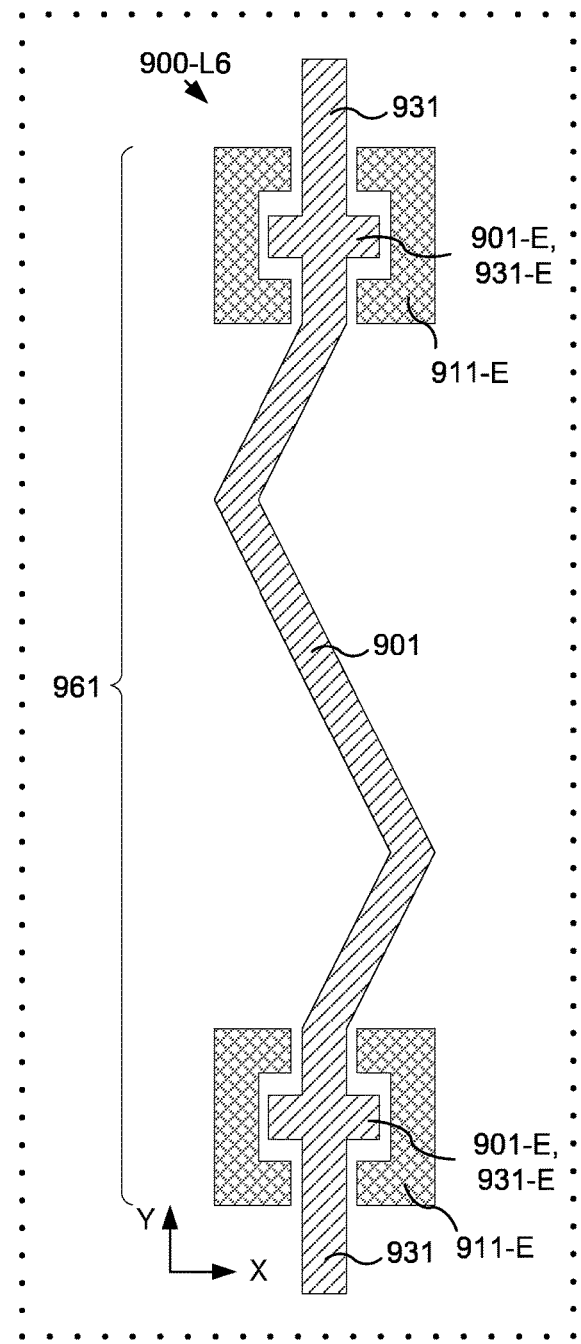
FIG. 9F-5      FIG. 9F-6

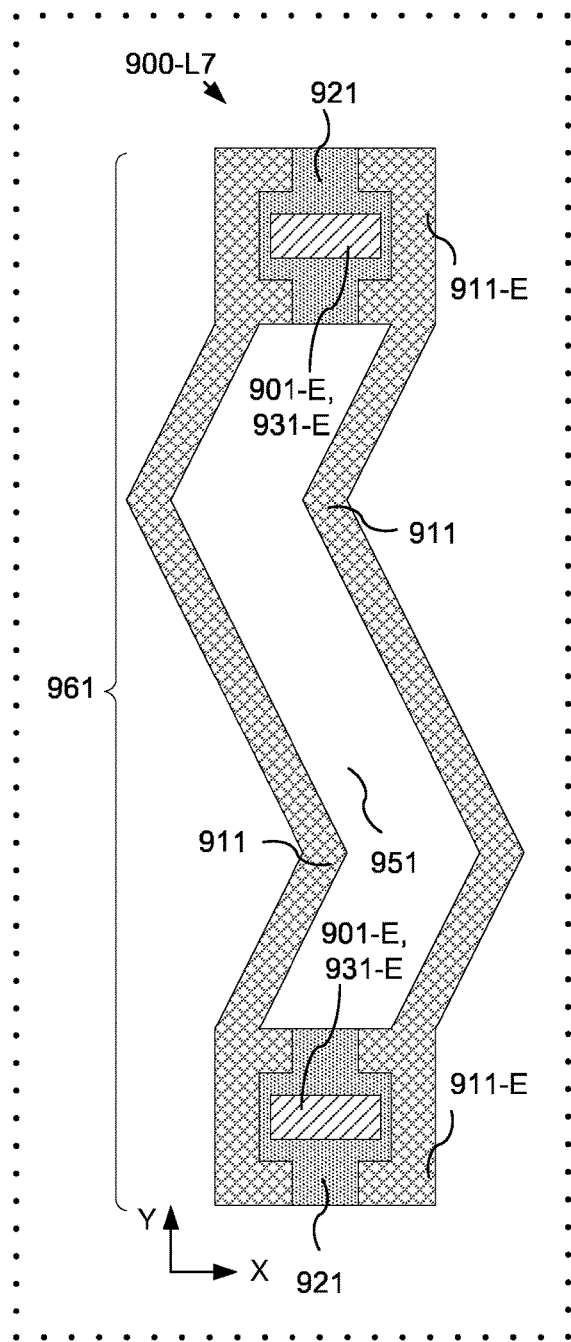
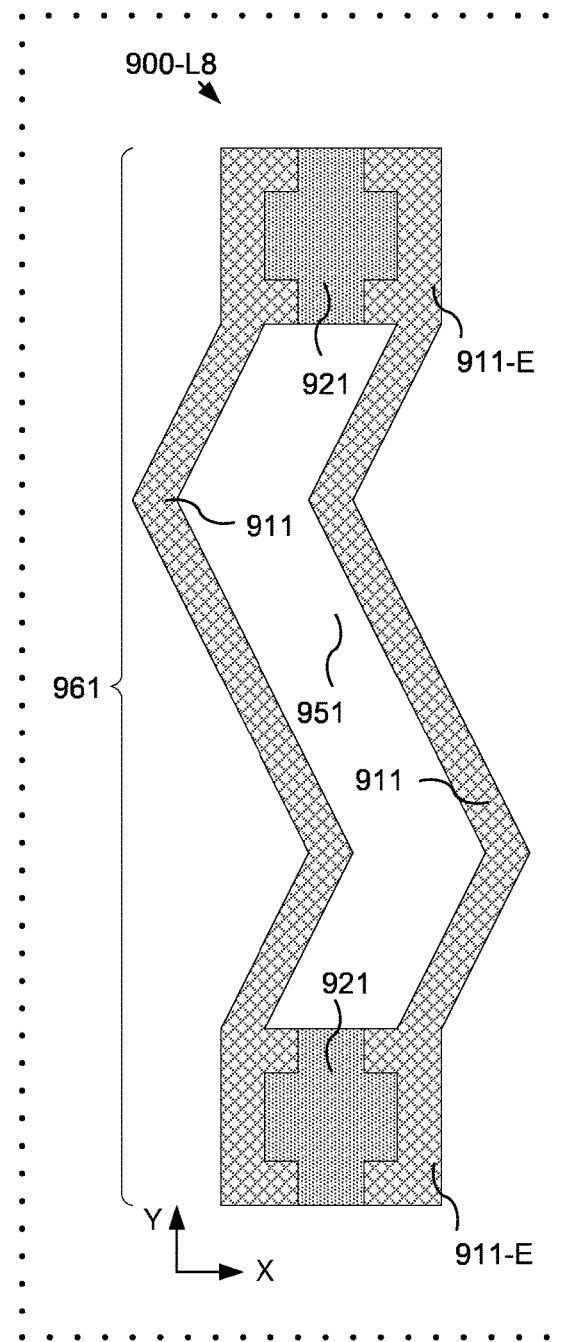
FIG. 9F-7  FIG. 9F-8

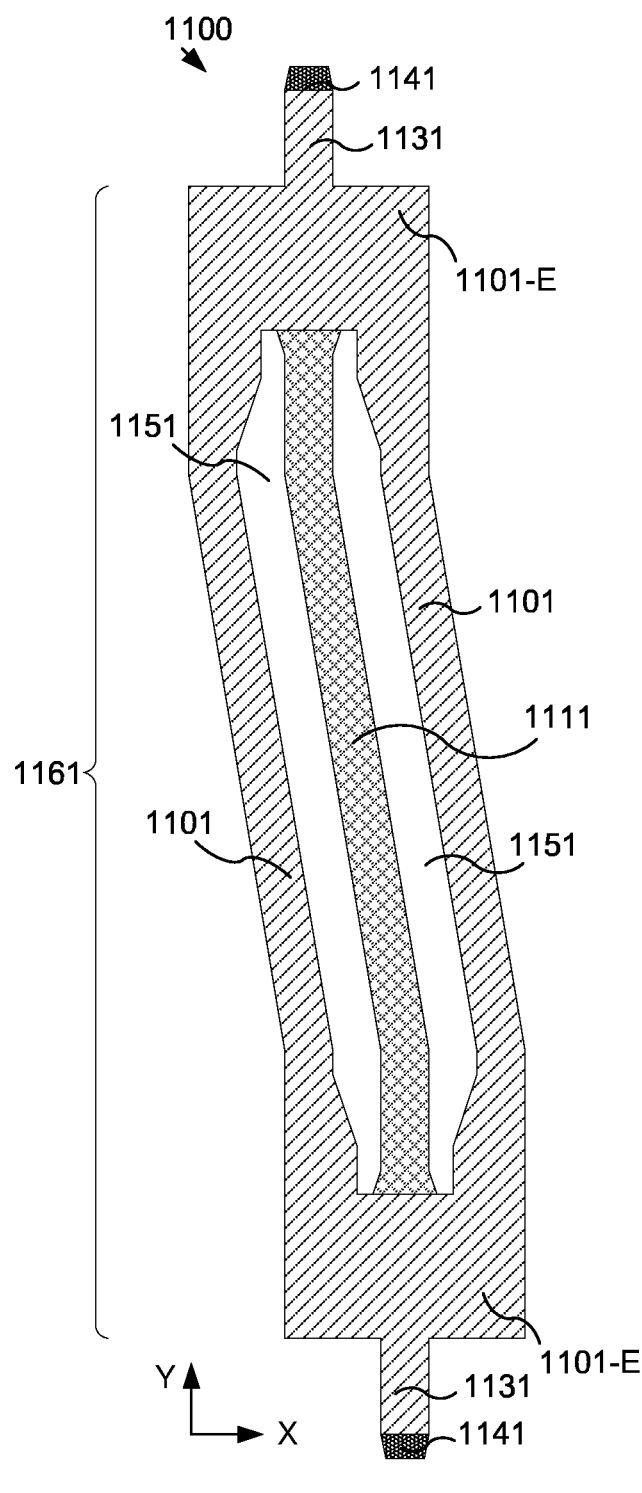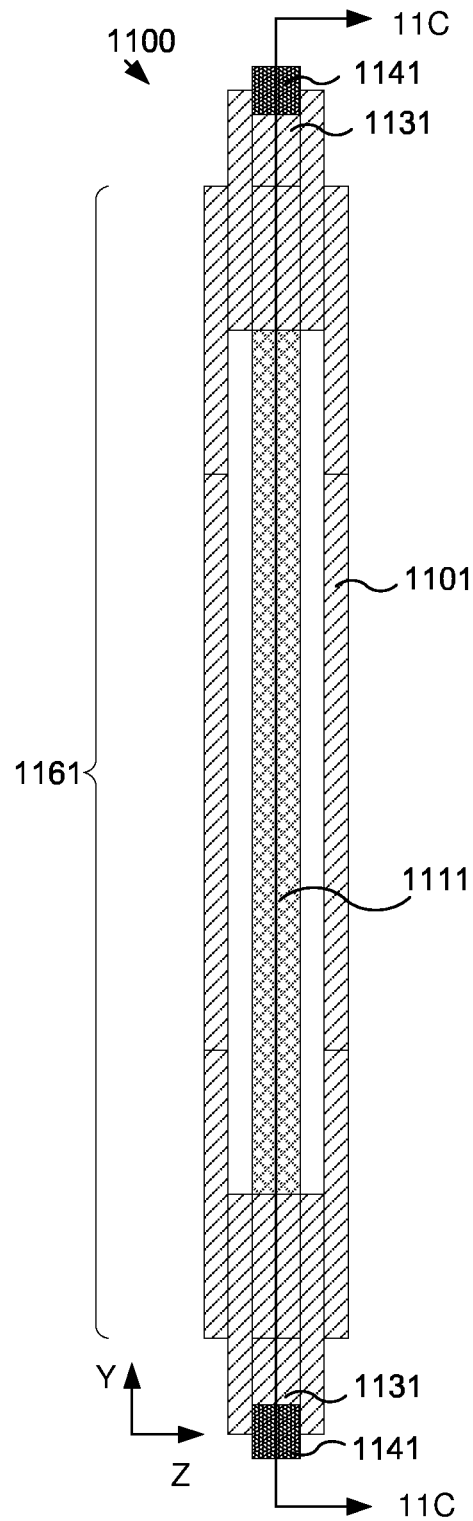
FIG. 11A  FIG. 11B

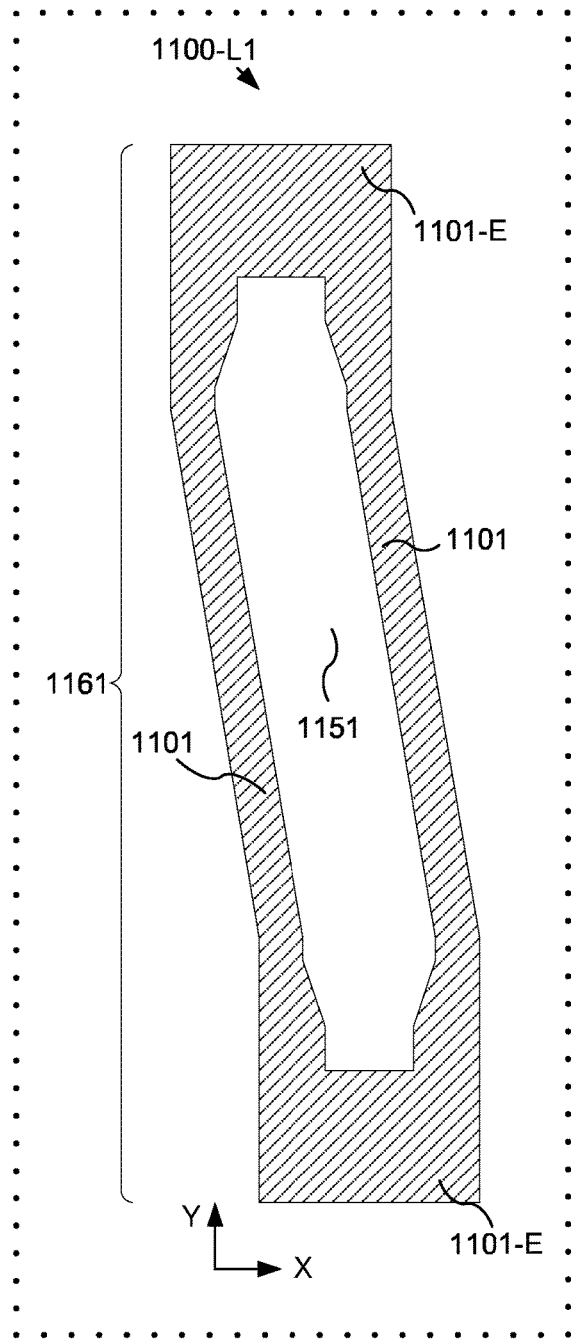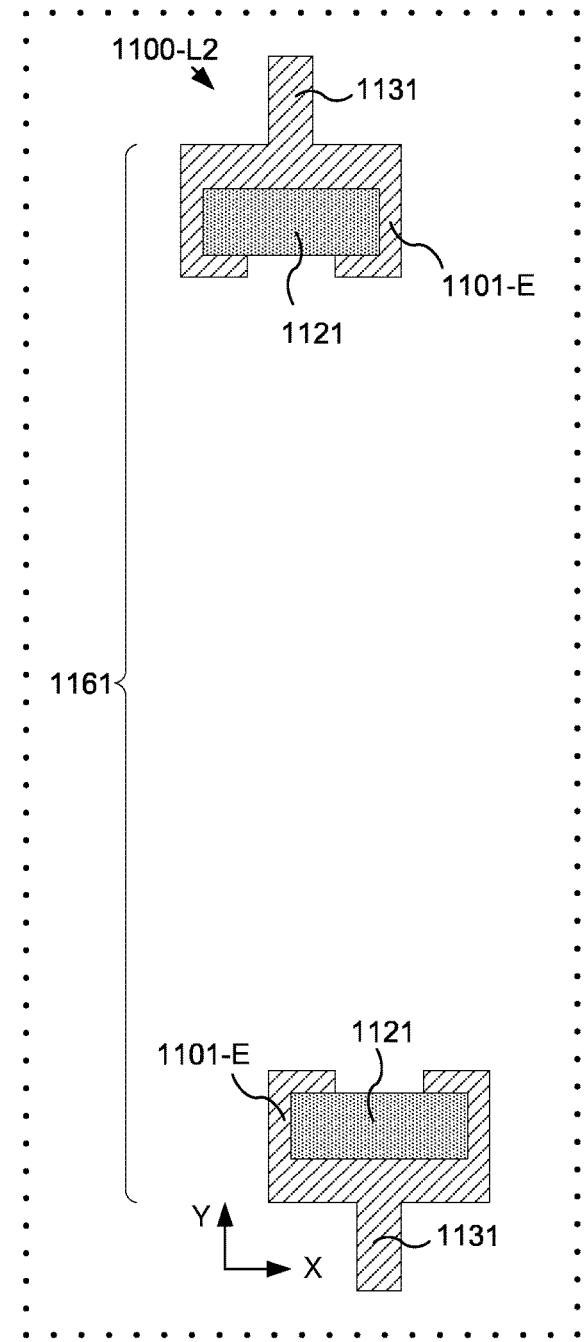
FIG. 11D-1  FIG. 11D-2

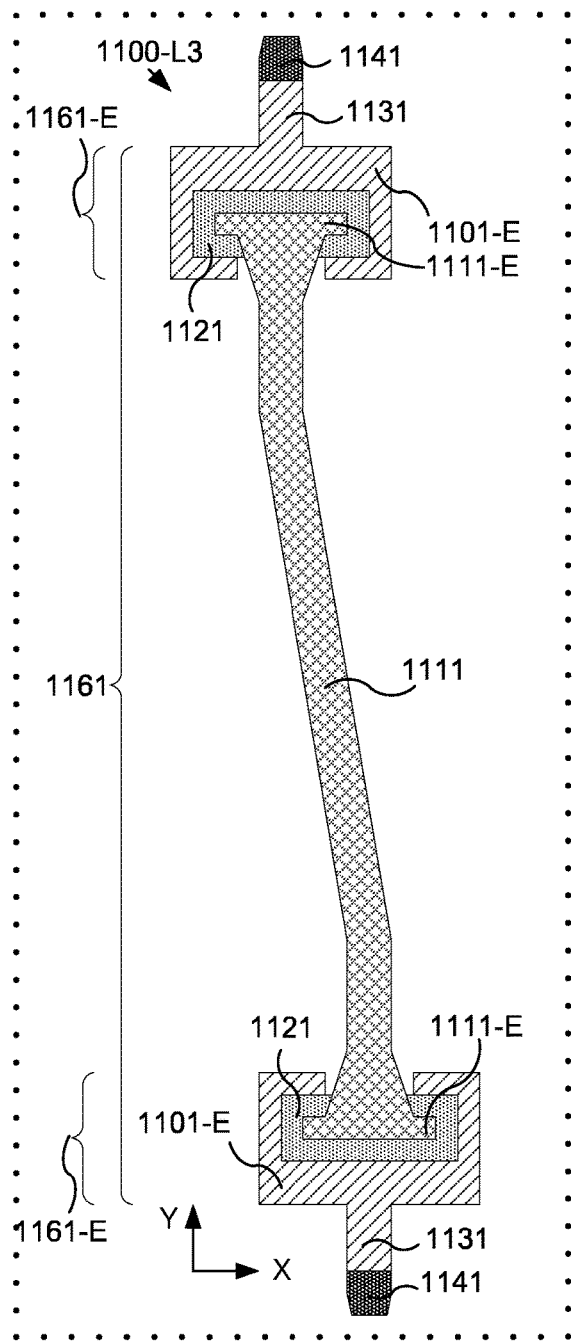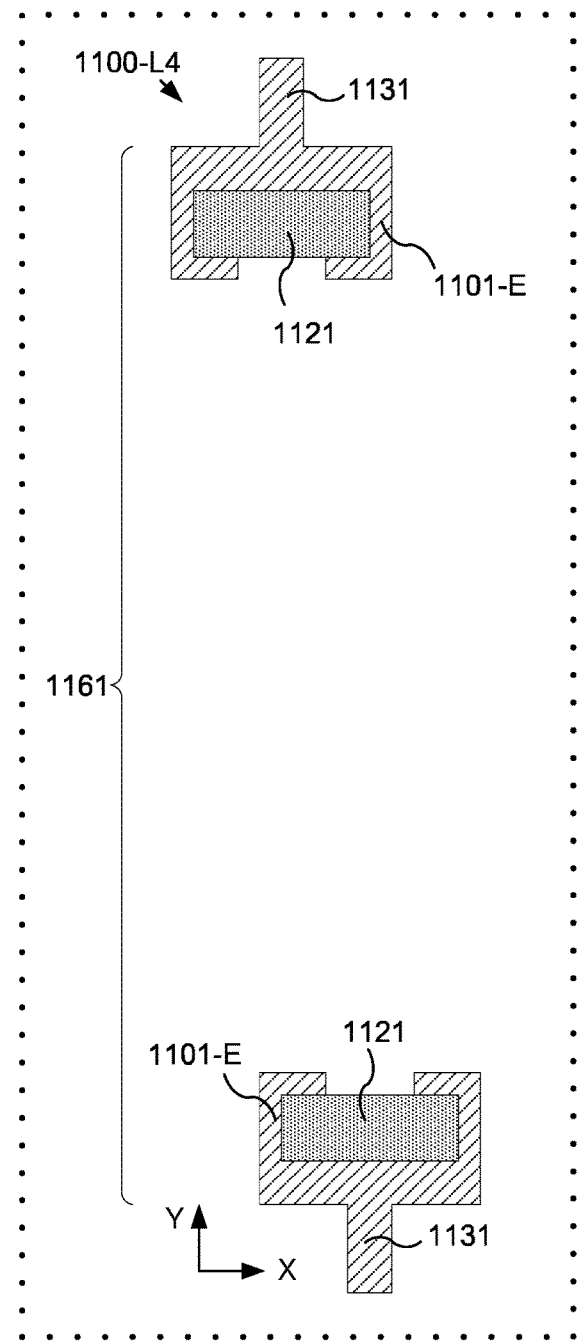
FIG. 11D-3  FIG. 11D-4

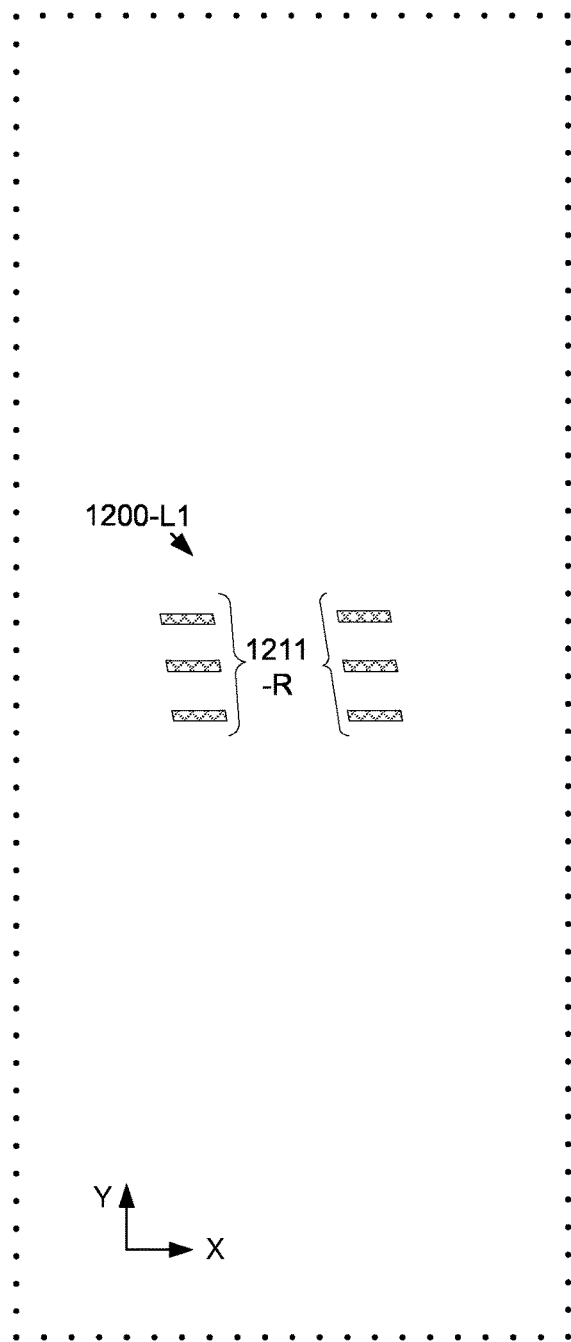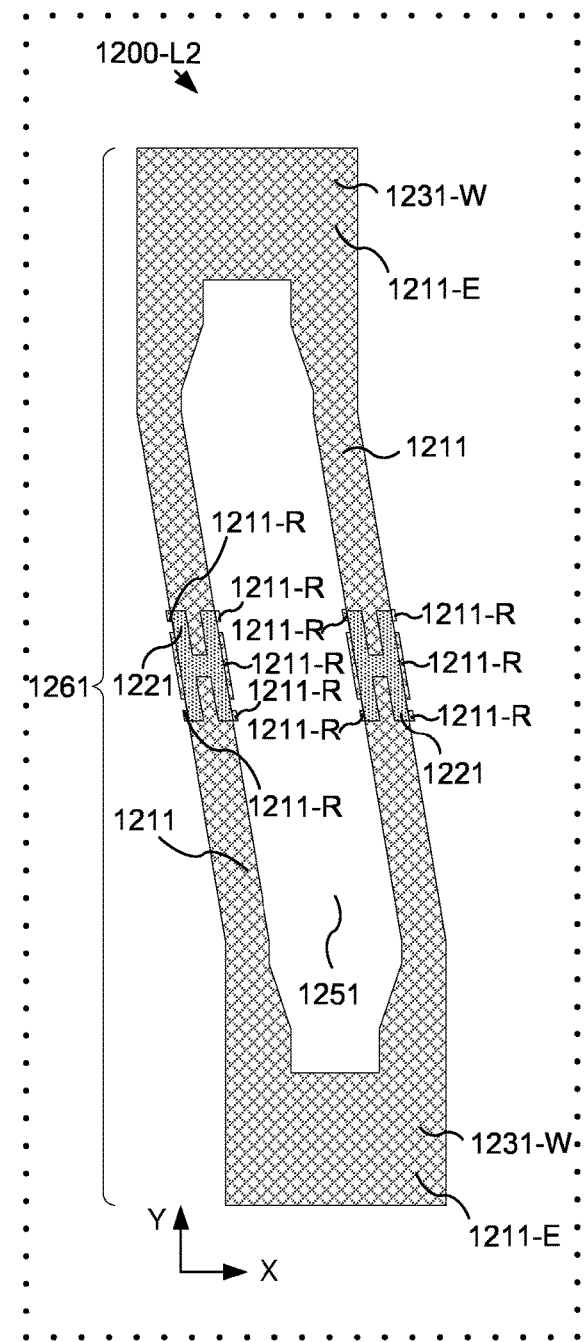
FIG. 12D-1                        FIG. 12D-2

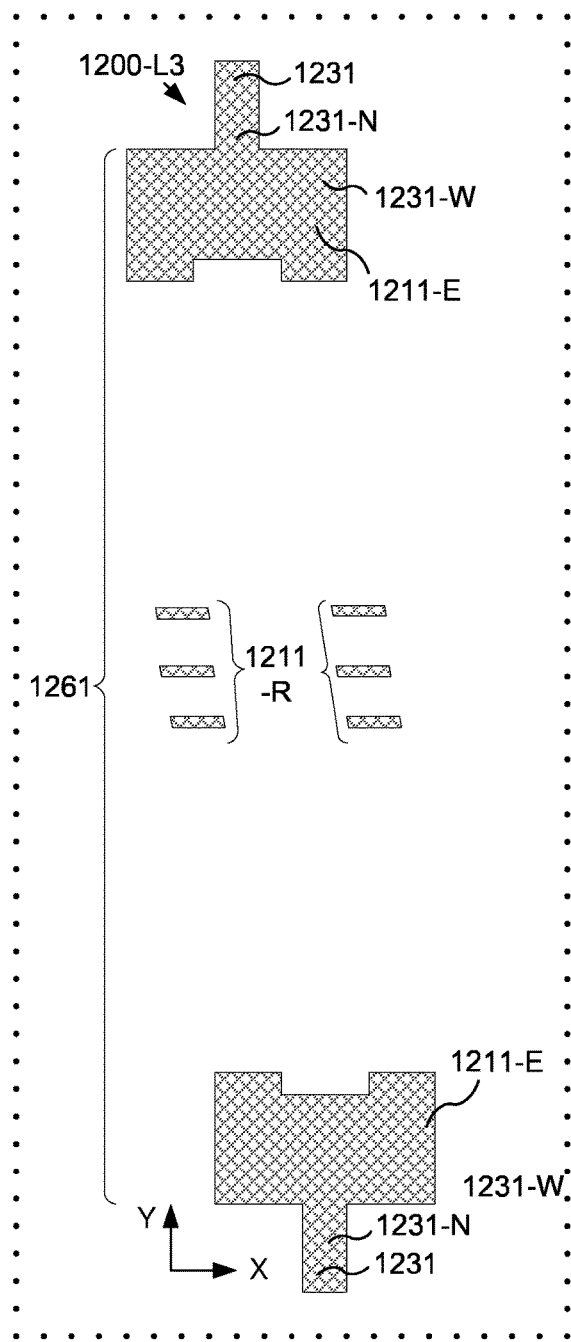 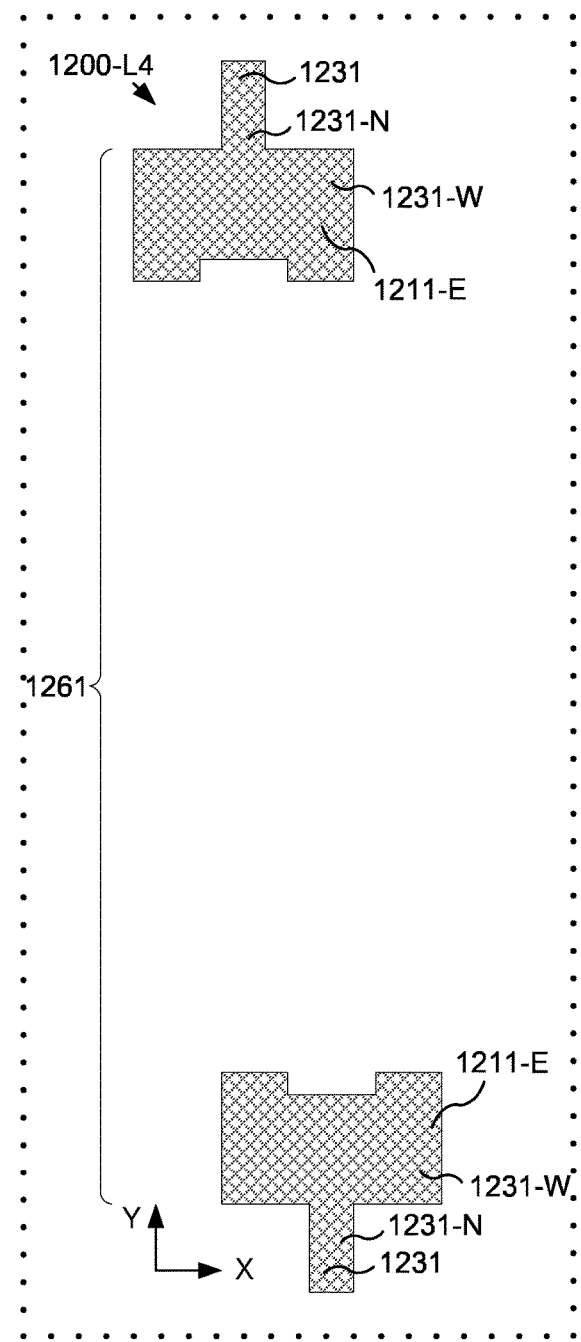
FIG. 12D-3  FIG. 12D-4

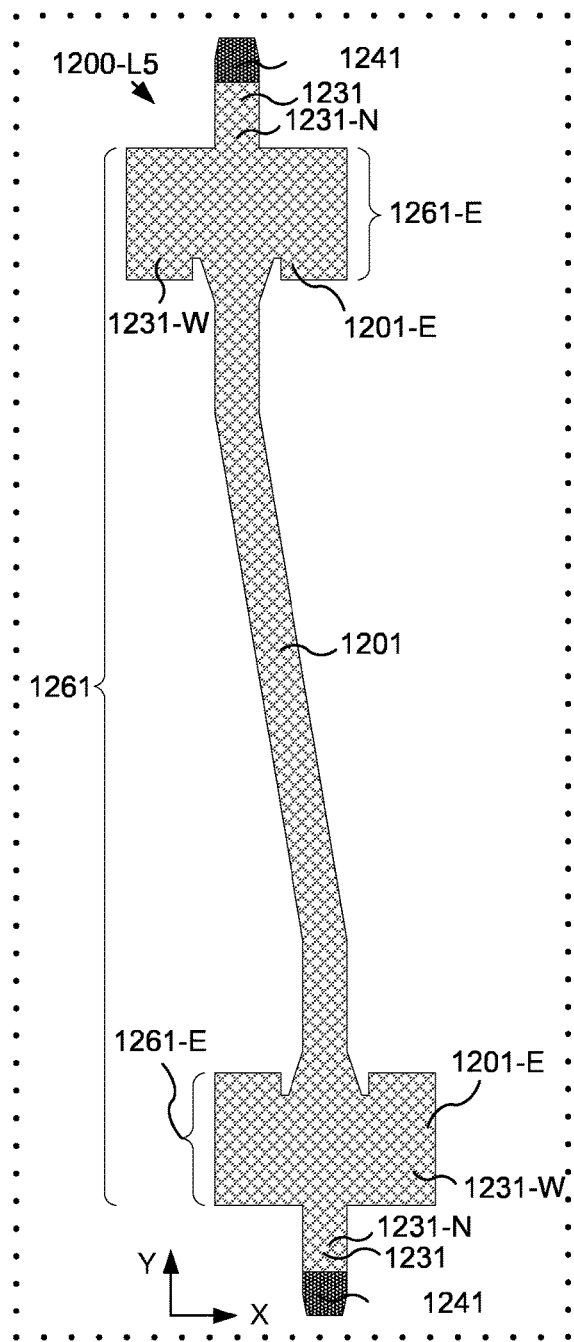
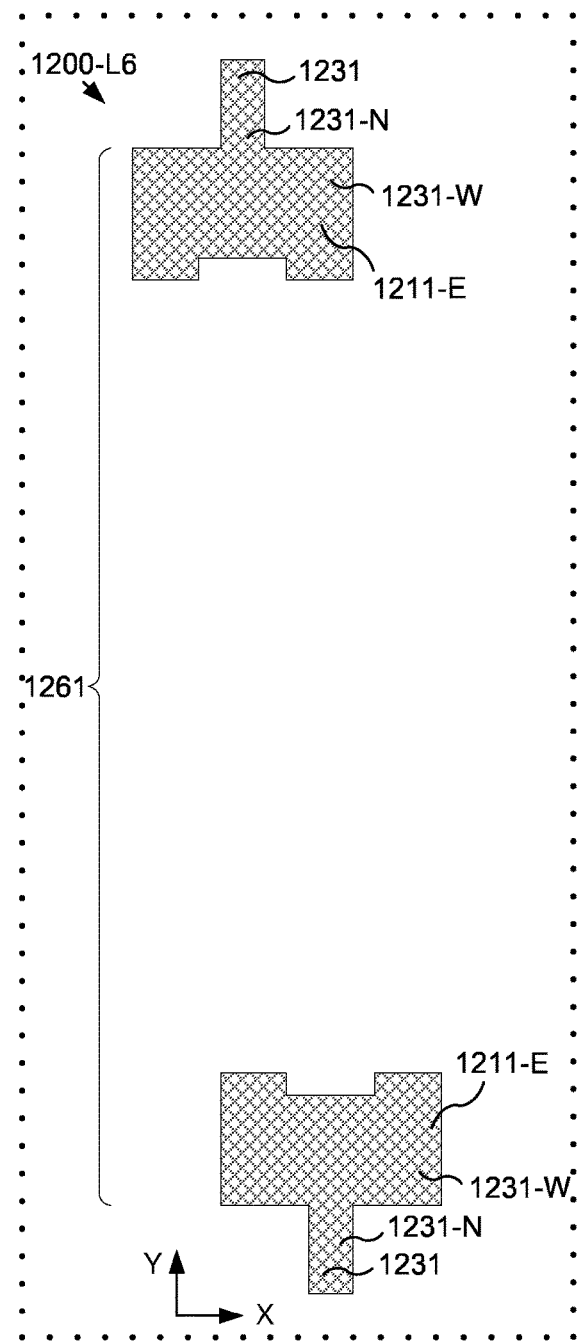
FIG. 12D-5    FIG. 12D-6

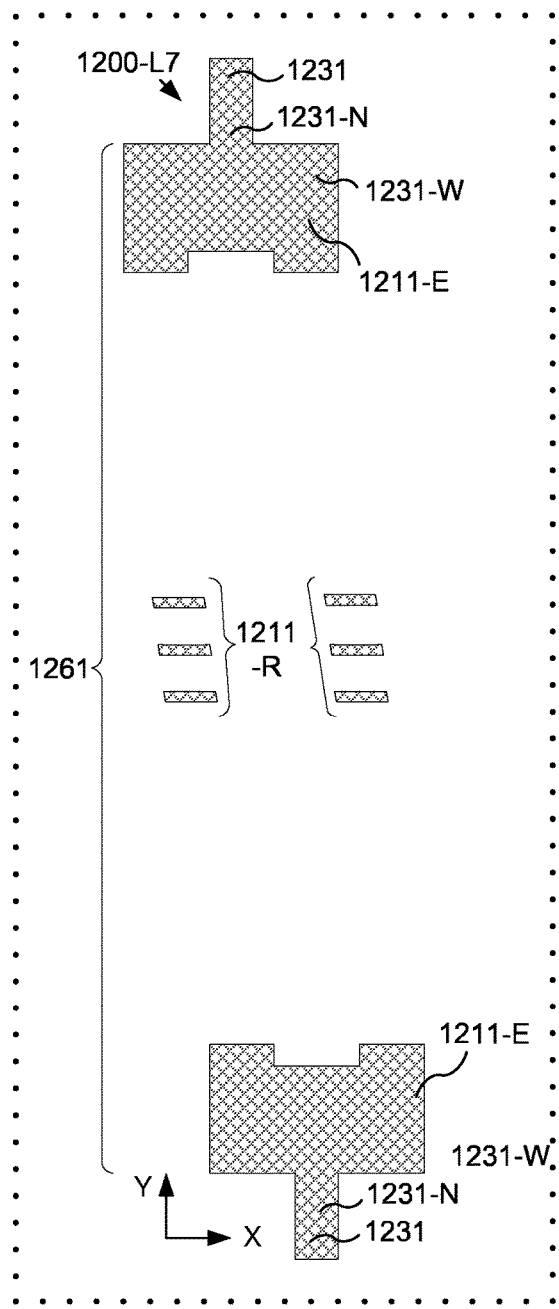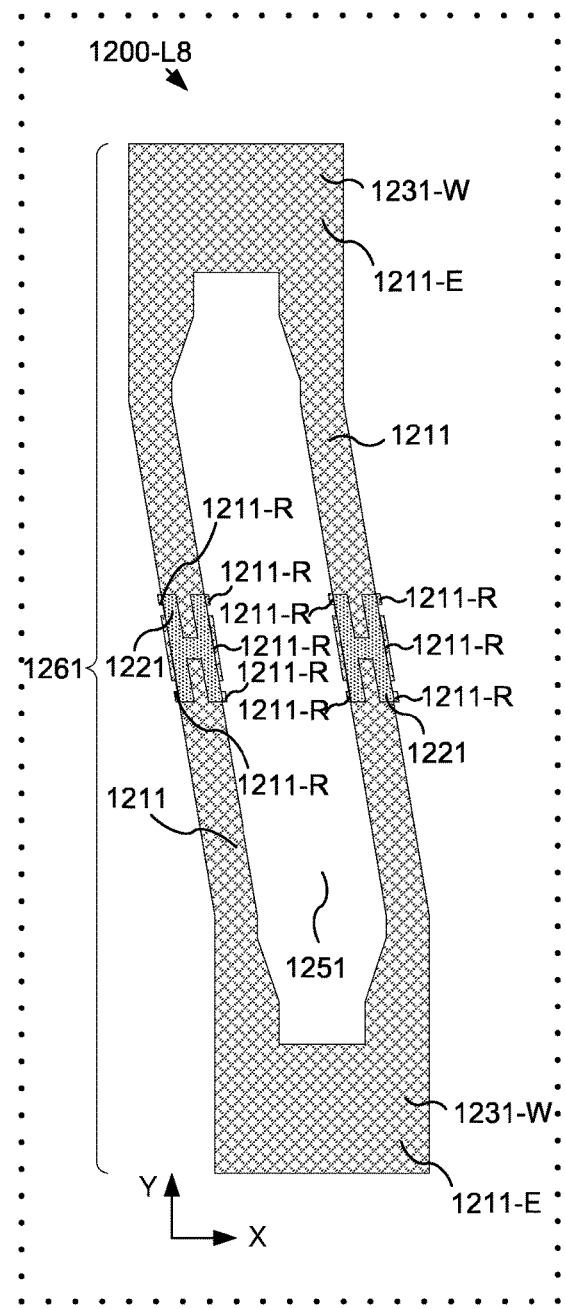
FIG. 12D-7    FIG. 12D-8

MULTI-BEAM PROBES WITH DECOUPLED STRUCTURAL AND CURRENT CARRYING BEAMS AND METHODS OF MAKING

RELATED APPLICATIONS

The below table sets forth priority claims for the present application. In addition to providing application numbers, the following table also includes filing dates, patent numbers, and issue dates as appropriate. Each of the listed applications is incorporated herein by reference as if set forth in full herein.

| App. No. | Continuity Type | App. No. | Which was Filed | Which is now | Which issued on | Dkt No. Fragment |
|---|---|---|---|---|---|---|
| This application | claims benefit of | 63/233,089 | 2021 Aug. 13 | pending | — | 410-A |
| This application | is a CIP | 17/493,802 | 2021 Oct. 4 | pending | — | 427-A |
| 17/493,802 | claims benefit of | 63/087,134 | 2020 Oct. 2 | expired | — | 396-A |

FIELD OF THE INVENTION

Embodiments of the present invention relate to probes for testing electronic circuits and more particularly to probes having multiple beams that extend longitudinally wherein at least a portion of the beams (e.g. at least one beam of a plurality of beams) are intended to carry electrical current while another portion of the beams (e.g. at least one beam of a plurality of beams) provide the primary structural properties of the probe (e.g. elastic spring force) where the current carrying beams and the structural beams are both electrically and physically decoupled from one another at least along a majority of the length of the beams while still other embodiments are directed to methods and apparatus for using such probes or methods for making probes for testing electronic circuits.

BACKGROUND OF THE INVENTION

Probes

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein.

| US Pat App No., Filing Date US App Pub No., Pub Date US Patent No., Pub Date | First Named Inventor, "Title" | Dkt No. Fragment |
|---|---|---|
| 10/772,943 - Feb. 4, 2004 2005-0104609 - May 19, 2005 | Arat, et al., "Electrochemically Fabricated Microprobes" | 097-A |
| 10/949,738 - Sep. 24, 2004 2006-0006888 - Jan. 12, 2006 | Kruglick, et al., "Electrochemically Fabricated Microprobes" | 119-A |
| 11/028,945 - Jan. 3, 2005 2005-0223543 - Oct. 13, 2005 7,640,651 - Jan. 5, 2010 | Cohen, et al., "A Fabrication Process for Co-Fabricating a Multilayer Probe Array and a Space Transformer" | 134-A |
| 11/028,960 - Jan. 3, 2005 2005-0179458 - Aug. 18, 2005 7,265,565 - Sep. 4, 2007 | Chen, et al. "Cantilever Microprobes for Contacting Electronic Components and Methods for Making Such Probes" | 140-A |
| 11/029,180 - Jan. 3, 2005 2005-0184748 - Aug. 25, 2005 | Chen, et al. "Pin-Type Probes for Contacting Electronic Circuits and Methods for Making Such Probes" | 139-A |
| 11/029,217 - Jan. 3, 2005 2005-0221644 - Oct. 6, 2005 7,412,767 - Aug. 19, 2008 | Kim, et al., "Microprobe Tips and Methods for Making" | 122-A |
| 11/173,241 - Jun. 30, 2005 2006-0108678 - May 25, 2006 | Kumar, et al., Probe Arrays and Method for Making | 137-A |
| 11/178,145 - Jul. 7, 2005 2006-0112550 - Jun. 1, 2006 7,273,812 - Sep. 25, 2007 | Kim, et al., "Microprobe Tips and Methods for Making" | 136-B |
| 11/325,404 - Jan. 3, 2006 2006-0238209 - Oct. 26, 2006 | Chen, et al., "Electrochemically Fabricated Microprobes" | 153-A |

-continued

| US Pat App No., Filing Date<br>US App Pub No., Pub Date<br>US Patent No., Pub Date | First Named Inventor, "Title" | Dkt No.<br>Fragment |
|---|---|---|
| 14/986,500 - Dec. 31, 2015<br>2016-0231356 - Aug. 11, 2016<br>10,215,775 - Feb. 26, 2019 | Wu, et al. "Multi-Layer, Multi-Material Micro-Scale and Millimeter-Scale Devices with Enhanced Electrical and/or Mechanical Properties" | 296-D |
| 16/172,354 - Oct. 26, 2018<br>2019-0204354 - Jul. 4, 2019<br>10,877,067 - Dec. 29, 2020 | Chen, et al. "Pin-Type Probes for Contacting Electronic Circuits and Methods for Making Such Probes" | 366-A |
| 16/584,818 - Sep. 26, 2019<br>—<br>11,262,383 - Mar. 1, 2022 | Smalley, "Probes Having Improved Mechanical and/or Electrical Properties for Making Contact between Electronic Circuit Elements and Methods for Making" | 376-A |
| 16/584,863 - Sep. 26, 2019<br>—<br>— | Frodis, "Probes Having Improved Mechanical and/or Electrical Properties for Making Contact between Electronic Circuit Elements and Methods for Making" | 377-A |
| 62/805,589 - Feb. 14, 2019 | Frodis, "Multi-Beam Vertical Probes with Independent Arms Formed of a High Conductivity Metal for Enhancing Current Carrying Capacity and Methods for Making Such Probes" | 370-A |
| 62/956,016 - Dec. 31, 2019 | Veeramani, "Compliant Pin Probes with Multiple Spring Segments and Compression Spring Deflection Stabilization Structures, Methods for Making, and Methods for Using" | 381-A |
| 62/956,124 - Dec. 31, 2019 | Wu, "Probes with Multiple Springs, Methods for Making, and Methods for Using" | 382-A |
| 62/956,122 - Dec. 31, 2019 | Wu, "Compliant Pin Probes with Flat Extension Springs, Methods for Making, and Methods for Using" | 383-A |
| 62/961,672 - Jan. 15, 2020 | Wu, "Compliant Pin Probes with Multiple Spring Segments and Compression Spring Deflection Stabilization Structures, Methods for Making, and Methods for Using" | 381-B |
| 62/961,675 - Jan. 15, 2020 | Wu, "Probes with Multiple Springs, Methods for Making, and Methods for Using" | 382-B |
| 62/961,678 - Jan. 15, 2020 | Wu, "Compliant Pin Probes with Flat Extension Springs, Methods for Making, and Methods for Using" | 383-B |
| 63/087,134 - Oct. 2, 2020 | Li, "Shielded Probes for Semiconductor Testing, and Methods for Making" | 396-A |
| 17/139,933 - Dec. 31, 2020<br>—<br>— | Wu, "Compliant Pin Probes with Multiple Spring Segments and Compression Spring Deflection Stabilization Structures, Methods for Making, and Methods for Using" | 399-A |
| 17/139,936 - Dec. 31, 2020<br>—<br>— | Wu, "Probes with Multiple Springs, Methods for Making, and Methods for Using" | 400-A |
| 17/139,940 - Dec. 31, 2020<br>—<br>— | Wu, "Compliant Pin Probes with Flat Extension Springs, Methods for Making, and Methods for Using" | 401-A |

Electrochemical Fabrication

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this capability, and it is understood that Electrochemical Fabrication techniques can be combined with designs and structures known within various fields to produce new structures. Certain uses for Electrochemical Fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved compliant multi-beam, buckling beam or spring probes with decoupled physical (mechanical yield strength, mechanical stress/strain properties, and the like) and electrical properties (e.g. current carrying capacity) so as to provide improved current carrying capacity with a reduction in loss of mechanical properties, for example, by allowing ability to raise operational temperatures of current carrying beams closer to fusing temperatures while not simultaneously providing degradation of mechanical properties of the structural beams.

It is an object of some embodiments to provide improved methods and/or devices of testing electronic circuit elements (e.g. integrated circuits or other semiconductor devices).

It is an object of some embodiments to provide improved probes having improved electrical and/or mechanical operational properties.

It is an object of some embodiments to provide probes with at least one dielectric barrier that blocks current flow through each structural beam that connects probe ends to one another. In some variations, such dielectric barriers may be located near one or both ends of the structural beams while in others, they may be located at one or more intermediate locations between the ends of the structural beams.

It is an object of some embodiments of the invention to provide joining of dielectric barrier material to conductive material in a manner within a probe that does not primarily or exclusively rely on adhesion between the dielectric and conductive materials to ensure structural integrity of the probe but instead more strongly relies on physical configuration to ensure that during stress inducing probe compressions that that dielectric is placed in a state of compression between joined or connected regions of conductive material wherein the dielectric may or may not also hold one or more second regions of electrically isolated conductive material.

It is an object of some embodiments to provide structural beams that have substantial regions (e.g. more than 25%, more than 50%, more than 75% or even more than 90% formed of dielectric material that completely blocks end to end direct current flow through each such beam while current carrying beams include conductive materials that span from probe end to probe end.

In a first aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant spring structure including at least one electrical beam (or current carrying beam) and at least one structural beam (or non-current carrying beam) which are decoupled from one another such that no electrical current flows through the at least one structural beam (that contributes to current flow through the probe) and is physically decoupled such that no heat is conducted from the at least one electrical beam to the at least one structural beam along the majority of the length of the at least one structural beam (even more preferably along a super majority of the length of the at least one beam (i.e. greater than 67% or even greater than 80%, or even 90%) wherein the at least one electrical beam contributes to a percentage of spring force selected from the group consisting of: (1) less than 30%, (2) less than 20%, (3) less than 10%, (4) less than 5% as compared to a similar probe lacking the at least one electrical beam during an operational state selected from the group consisting of: (1) a steady state operation of the probe, and (2) upon initial compression of the probe prior to operation, and wherein the compliant spring structure includes at least one dielectric material that provides a property selected from the group consisting of: (1) partial electrical isolation between at least one electrical beam and the at least one structural beam, (2) dielectric spacing between at least one portion of at least one electrical beam and the at least one structural beam, (3) enhanced thermal isolation (i.e. reduced heat flux) between at least one portion of at least one electrical beam and at least one structural beam (as compared to isolation or heat flux that would exist if the dielectric were replaced with a material of at least one structural beam or at least one electrical beam); (d) a second extension arm joining a second region of the compliant spring structure such that relative displacement of the first and second extension arms results in elastic movement of the at least one spring segment of the compliant structure; (e) a second tip having a first attachment region and a second region wherein the first attachment region of the second tip directly or indirectly joins the second extension arm, wherein the second region of the second tip is configured for making an electrical connection to a second circuit element, wherein the configuration is selected from the group consisting of: (1) a tip for making a contact connection, and (2) a tip for making an attached connection.

Numerous variations of the first aspect of the invention are possible and include, for example: (1) the at least one structural beam including at least two structural beams, (2) the at least one structural beam including at least three structural beams, (3) the at least one electrical beam including at least two electrical beams, (4) the at least one electrical beam including at least three electrical beams, (5) both the at least one electrical beam and the at least one structural beam including metals, (6) the tip including a metal, (7) the extension arms including a metal, (8) at least a portion of at least one of the at least one structural beam includes a ceramic, (9) variation 8 wherein the ceramic is a dielectric, (10) at least a portion of at least one of the at least one structural beam includes dielectric silicon, (11) variation 10 wherein a super majority of the at least one structural beam that includes dielectric silicon is dielectric silicon, (12) any of variations 1-7 wherein at least two of a structural beam, an electrical beam, a tip extension, and a tip include a common metal (i.e. the same metal), (13) any of variations 1-7 wherein at least three of a structural beam, an electrical beam, a tip extension, and a tip include a common metal, (14) either of variations 11 or 13 wherein the at least one structural beam and the at least one electric beam include the same metal, (15) either of variations 11 or 13 wherein at least one structural beam and at least one electric beam include different metals.

Other variations include, for example the probe of the first aspect or of one of the variations of the first aspect including a connection between the dielectric and one of the beams selected from the group consisting of: (1) a structural beam, and (2) an electrical beam including an attachment selected from the group consisting of: (1) a meshed connection, (2) an interlocked connection, (3) a combined meshed and interlocked connection, (4) a connection that places at least a portion of a dielectric in compression between features selected from the group consisting of: (i) at least one structural beam and at least one current carrying beam, (ii) at least one structural beam and a tip extension, (iii) at least one current carrying beam and a tip extension, (iv) at least one widened portion of a current carrying beam and a structural beam, (v) at least one widened portion of a current carrying beam and a tip extension, (vi) at least one widened portion of a structural beam and a current carrying beam, (vii) at least one widened portion of a structural beam and a tip extension, (viii) at least one widened portion of a tip extension and a current carrying beam, (ix) at least one widened portion of a tip extension and a structural beam, (x) two electrically isolated portions of a structural beam, (xi) two at least partially opposing tip extension regions, (xii) two at least partially opposing portions of at least two current carrying beams, and (xiii) two at least partially opposing portions of at least two structural beams.

In a second aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant spring structure including at least one electrical beam (or current carrying beam) and at least one structural beam (or non-current carrying beam) which are decoupled from one another such that no electrical current flows through the at least one structural beam (that contributes to current flow through the probe) and is physically decoupled other than in proximity to the ends of the at least one structural beam (within the ending 20% of the at least one structural beam and more preferably within the ending 10% of the length of the at least one structural beam, and even more preferably within the ending 5% of the length of the at least one structural beam) wherein the at least one electrical beam contributes to a percentage of spring force selected from the group consisting of: (1) less than 30%, (2) less than 20%, (3) less than 10%, (4) less than 5% as compared to a similar probe lacking the at least one electrical beam during an operational state selected from the group consisting of: (1) a steady state operation of the probe, and (2) upon initial compression of the probe prior to operation, and wherein the compliant spring structure includes at least one dielectric material that provides a property selected from the group consisting of: (1) partial electrical isolation between at least one electrical beam and the at least one structural beam, (2) dielectric spacing between at least one portion of at least one electrical beam and the at least one structural beam, (3) enhanced thermal isolation (i.e., reduced heat flux) between at least one portion of at least one electrical beam and at least one structural beam (as compared to isolation or heat flux that would exist if the dielectric were replaced with a material of at least one structural beam or at least one electrical beam); (d) a second extension arm joining a second region of the compliant spring structure such that relative displacement of the first and second extension arms results in elastic movement of the at least one spring segment of the compliant structure; and (e) a second tip having a first attachment region and a second region wherein the first attachment region of the second tip directly or indirectly joins the second extension arm, wherein the second region of the second tip is configured for making an electrical connection to a second circuit element, wherein the configuration is selected from the group consisting of: (1) a tip for making a contact connection, and (2) a tip for making an attached connection.

Still other aspects of the invention will be understood by those of skill in the art upon review of the teachings herein. Other aspects of the invention may involve combinations of the above noted aspects of the invention. These other aspects of the invention may provide various combinations of the aspects presented above as well as provide other configurations, structures, functional relationships, and processes that have not been specifically set forth above but are taught by other specific teachings set forth herein or by the teachings set forth herein as a whole.

BRIEF DESCRIPTION OF THE DRAWINGS

FIGS. 2A-2G provide cross-sectional views of various example probes according to a first group of embodiments where each probe includes two beams where one beam provides the primary mechanical properties of the probe (i.e. the structural beam) while the other beam provides the primary current carrying path (i.e. the electrical beam) from one probe end to the other and where at least one end of one beam is separated from the corresponding end of the other beam by a decoupling dielectric barrier and where a gap is provided between the beams along the majority, or even a super majority, of the lengths of the beams to provide mechanical or physical decoupling.

FIGS. 3A-3D provide cross-sectional views of various example probes according to a second group of embodiments where each probe includes three beams where one beam provides the primary mechanical properties of the probe (i.e. the structural beam) while two other beams provide the primary current carrying paths (i.e. the electrical beams) from one probe end to the other and where only one end of the structural beam is electrically isolated from the conductive beams and wherein the electrically isolated end is not fixedly joined to its corresponding tip extension or arm region but can provide desired structural properties via engagement of the structural beam with features of the tip arm upon deflection of the probe tips relative to one another while FIG. 3E provides a cut view similar to those of FIGS. 3A-3D but with the structural beam being physically joined to both tip extension regions where one such joining occurs via an electrical decoupling dielectric material.

FIGS. 4A-4E provide cross-sectional views of various example probes according to a third group of embodiments where each probe includes three beams where one beam (the central beam or inner beam) provides the primary mechanical properties of the probe (i.e. the structural beam) while two other beams (the outer beams) provide the primary current carrying paths from one probe end to the other (i.e. the electrical beams) and where both ends of the structural beam are electrically isolated from the conductive beams.

FIGS. 5A-5E provide cross-sectional views of various example probes according to a fourth group of embodiments where each probe includes three beams where one beam (the central beam) provides the primary current carrying path of the probe from one probe end to the other (i.e. the electrical beam) while two other beams (the outer beams) provide the primary structural properties of the probe (i.e. the structural beams) and where at least one end of each structural beam is electrically isolated from the conductive beam by a barrier of dielectric material that was deposited during a layer formation process.

FIGS. 9A1-9E respectively provide a top view, a side view, and three cross-sectional views of a probe according to another embodiment of the invention while FIGS. 9F-1-9F-9, respectively provide views of the structural materials of the first to ninth layers that form the various elements or features of the probe wherein the probe is formed with probe tips as part of the fifth layer, supporting elements, or tip arms, for the probe tips formed as part of the fourth-sixth layers, probe end bodies, including dielectric elements, formed as part of the first-ninth layers, a pair of outer structural beams formed as part of the second and third layers and another pair of outer structural beams formed as part of the seventh-eighth layers, and an inner or central beam for carrying current formed as part of the intermediate fourth-sixth layers.

DETAILED DESCRIPTION OF PREFERRED EMBODIMENTS

Electrochemical Fabrication in General

Figure 1A:
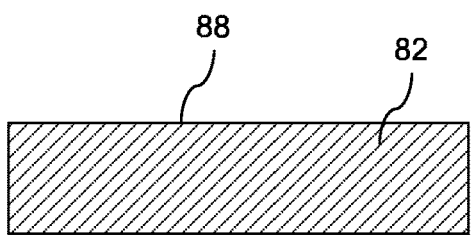
FIGS. 1A-1F schematically depict the formation of a first layer of a structure using adhered mask plating where the blanket deposition of a second material overlays both the openings between deposition locations of a first material and the first material itself.
Figure 1B:
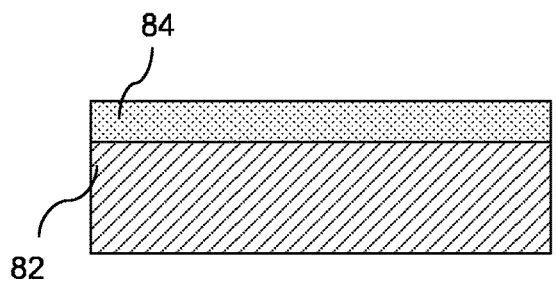
Figure 1C:
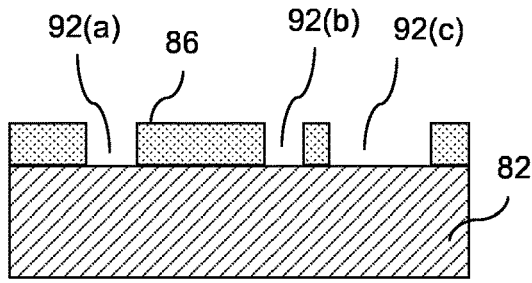
Figure 1D:
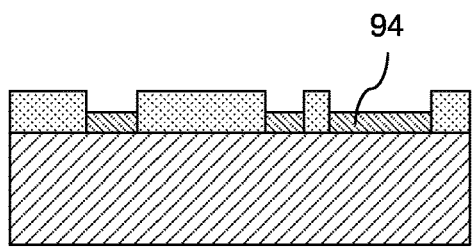
Figure 1E:
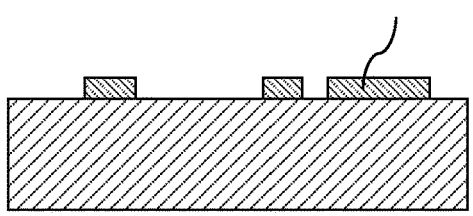
Figure 1F:
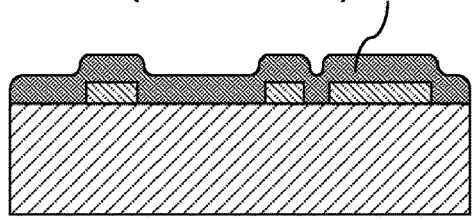
Figure 1G:
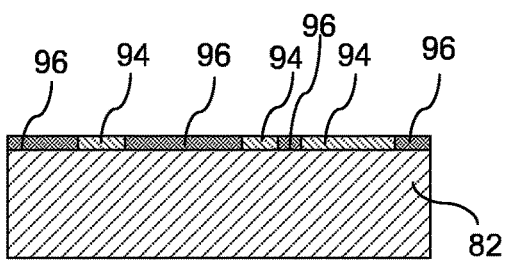
FIG. 1G depicts the completion of formation of the first layer resulting from planarizing the deposited materials to a desired level.
Figure 1H:
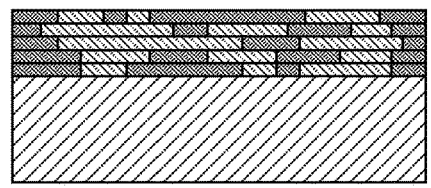
FIGS. 1H and 1I respectively depict the state of the process after formation of the multiple layers of the structure and after release of the structure from the sacrificial material.
Figure 1I:
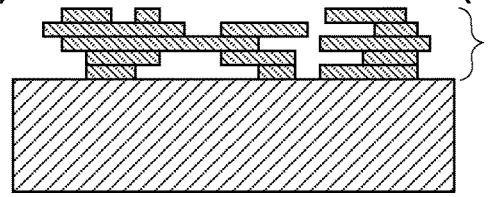

FIGS. 1A-1I illustrate side views of various states in an alternative multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 82 having a surface 88 is shown, onto which patternable photoresist 84 is deposited, spread, or cast as shown in FIG. 1B. In FIG. 1O, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g. nickel) is shown as having been electroplated into the openings 92(a)-92(c). In FIG. 1E, the photoresist has been removed (i.e. chemically or otherwise stripped) from the substrate to expose regions of the substrate 82 which are not covered with the first metal 94. In FIG. 1F, a second metal 96 (e.g. silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 98 (e.g. component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial material for the layer or may be used only as a masking material which is replaced by another material (e.g., dielectric or conductive material) prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration) . Such use of selective etching and/or interlaced material deposition in association with multiple layers is described in U.S. patent application Ser. No. 10/434,519 (P-US068-A-MG), by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

Probe Embodiments

Reference numbers are included in many of FIGS. 2A-12D-9 wherein like numbers are used to represent similar structures or features in different embodiments. In particular, when the FIGS. of the various embodiments use reference numbers, the reference numbers are provided in a 3 or 4 digit format which may be followed by letters, dashes, and/or additional numbers, wherein the first digit or first two digits (from the left) represent the FIG. number while the final digits to the right along with any trailing letters, dashes, or numbers represent a particular general structure or feature. When two or more figures include a reference having the same right most digits (and following letters, dashes, and additional numbers), it is intended indicate a similarity of the features indicated. The following table sets forth these right most digits and a general description of the structure or feature being represented.

Table of Reference Numbers for Structures/Features

| No. | Description |
| --- | --- |
| 00, 00A-00G | Probe |
| 00-L1 to 00-L9 | Probe layer (structural material only, sacrificial material not shown) where the ending number corresponds to the probe layer |
| 01 | Electric or current carrying beam of a probe |
| 01-E | End region of an electric or current carrying beam of a probe (e.g. it may be embedded in or adjacent to a bridging element or dielectric near an end of a body of a probe) |
| 01-W | Widened region, portion, or feature in end region of an electric or current carrying beam of a probe |
| 11 | Mechanical or structural beam of a probe |
| 11-E | End region of a mechanical or structural beam of a probe (e.g. it may be embedded in or adjacent to a bridging element or dielectric near an end of a body of a probe) |
| 11-N | Narrow region, portion, or feature in end region of a mechanical or structural beam of a probe |
| 11-W | Widened region, portion, or feature in end region of a mechanical or structural beam of a probe |
| 11-R | A region of structural material (may be a structural beam, a current carrying beam, a tip extension region, or tip) separated from other regions of structural material by a dielectric where the separated region of structural material in combination with the other regions of structural material form joined regions of structural material around the dielectric material |
| 21 | Dielectric that connects two conductive elements of a probe (e.g. a current carrying beam and a structural beam) |
| 22 | Dielectric that is joined to a probe element and acts a stop or barrier that can inhibit shorting or individual beam elements to one another or one probe to another probe |
| 31 | Tip arm and/or a bridging element that is located at or near the ends of probe beams |
| 31-E | End region of a tip arm and/or a bridging element |
| 31-N | Narrow region in end region of a tip arm and/or bridging element |
| 31-W | Widened region in end region of a tip arm and/or bridging element |
| 41 | Probe tip that may be configured to act as a contact tip or as a bonding or adhered tip |
| 51 | A gap between elements of a probe |
| 61 | Body of a probe (typically excludes extended portions of tip arms and tips themselves) |
| 61-E | End or joining region of a body of a probe |

FIGS. 2A-2G provide cut views of various example probes according to a first group of embodiments where each probe includes two beams where one beam provides the primary mechanical properties of the probe (i.e. the structural beam) while the other beam provides the primary current carrying path (i.e. the electrical beam) from one probe end to the other and where at least one end of one beam is separated from the corresponding end of the other beam by a decoupling dielectric barrier and where a gap is provided between the beams along the majority or even a super majority of the length of the beams to provide mechanical or physical decoupling.

The figures also provide examples of interlacing or even interlocking of different materials together to improve structural integrity of the connected materials. In variations of these embodiments, other relationships between structural beam, electrical beam, tip extensions, tips, and dielectrics may exist that provide for some of these regions to be formed from the same materials, different connections including interlocked materials, as well as different physical lengths, widths, and thicknesses. For example in some variations, structural beams, electrical beams, and tip arms may be formed of the same material. In some variations, the probes may be formed on their sides (e.g. the present views might be views along a build or stacking axis of the plane or a layer with only the structural materials being shown (i.e. materials that form part of the probe structure regardless of what part of the structure). In some variations, probes may be formed from single or multiple identical layers. In some variations, different layers may provide different geometrical configurations of deposited materials, for example, to provide enhanced material-to-material interfaces or even interlocking of materials while still providing the dielectric isolation and physical decoupling of the beams. In some embodiments, the tip material may include, for example, one or more of Ni, NiCo, Pd, PdCo, Rh or the like. In some embodiments, the tip extension material and/or the structural beam may include, for example, one or more of Ni, NiCo, Pd, PdCo, or the like. In some embodiments, the electrical beam may include, for example, one or more of Ni, NiCo, Au, Ag, Pd, PdCo, Cu, or the like. In some embodiments, the dielectric material may include, for example, a polymer (e.g. parylene, SU-8), a ceramic material, or a dielectric metalloid like silicon. In some embodiments, the dielectric material may be applied as part of the layer-by-layer build-up process while in other embodiments, the dielectric material may be deposited in a post-layer, post sacrificial material removal, deposition process. In some embodiments, the dielectric material may have thermal insulative properties while in other embodiments, portions of the dielectric material may be replaceable, in full or in part, with a thermal insulative material that may not be electrically insulative.

FIG. 2A provides a cross-sectional view of a probe of a first embodiment wherein the probe 200A has a structural beam 211 decoupled from a current carrying beam 201 wherein the current carrying beam is in line and connected directly to two tip extension arms 231 which in turn connect to two respective tips 241 and wherein the structural beam is offset by a gap 251 from the current carrying beam and connected thereto by two spacers of dielectric material 221 that cap each end of the structural beam and attach near the top and bottom of a side or edge of the electrical or current carrying beam 201. Another way of understanding the probe is to consider the central portion of the probe 200A as the body 261 of the probe which includes the beams, the spacing/connecting dielectric and part of the tip arm extensions. The tip arm extensions extend beyond the body portion to tip regions that may be used for contacting DUTS or other circuit elements. The different elements of the probe are shown using different hatching patterns and may be made from different materials; however, in some embodiments, the beams, the tip arms and possibly even the tips may be made of the same metal. For example, in some embodiments structural beams may be formed of Ni, NiCo, Pd, PdCo, other resilient metals or alloys or possibly even metalloids like silicon or ceramics. The current carrying beams may be made of similar material that are conductive (possibly with different configurations or from materials that have higher conductivity such as Au, Ag, or Cu. As shown in FIG. 2A, the dielectric to beam interfaces need not be planar but may include features that enhance surface area contact such as the single protrusions or extensions and indentions or recesses as shown or multiple such protrusions and recesses. In the example shown, the dielectric includes the protrusions or extensions while the beams include the indentions or recesses with one of the beams accepting the dielectric from its side while the other beam accepts the dielectric at its ends. In alternative embodiments, the locations of such features and the types of features may be reversed or provided in combination.

FIG. 2B provides a cross-sectional view of a probe 200B similar to that of FIG. 2A wherein the structural beam 211 is offset from the current carrying beam 201 and connected thereto by two dielectric spacers 221 that connect to the sides of the beams (as opposed to the ends of the beams) near their tops and bottoms. The other reference numbers in FIG. 2B illustrate features similar to those noted for FIG. 2A.

FIG. 2C provides a cross-sectional view of a probe 200C similar to that of FIG. 2B wherein the dielectric spacers 221 do not directly connect the structural and electrical beams but instead directly connect the structural beam 211 laterally to portions of the tip extensions 231 that in turn provide an indirect longitudinal connection to the current carrying beam 201. The other reference numbers in FIG. 2C illustrate features similar to those noted for FIGS. 2A and 2B.

FIG. 2D provides a cross-sectional view of a probe 200D similar to that of FIG. 2C with the exception that the ends of the electrical beam 201 extend longitudinally (i.e. along the length of the probe) into the tip extension or arm regions 231 while the dielectric material 221 is interlocked with the tip arm regions 231 and the structural beam 211, and the electrical beam 201 includes a lateral extension or protrusion near its ends 201-E on the side opposite the structural beam 211 that also provides interlocking with tip arm regions 231. The other reference numbers in FIG. 2D illustrate features similar to those noted for FIGS. 2A-2C.

In some embodiment variations, the majority of the beams (central regions) may be formed from a single layer with one or more additional layers formed above and below from tip arm material and/or beam material at the beam end regions 201-E and 211-E to capture and retain the positions of the beams and dielectric material. Similar variations may apply to the previous embodiments as well as to additional embodiments presented herein. In some variations, the tip arm regions may include lateral extensions (in and out of the page) to immediately preceding and successive layers that cap and inhibit lateral movement (in or out of the page) of the interlocked dielectric and electrical beam material. In other variations, the electrical beam may include lateral extensions on overlaying and underlying layers (in and out of the page) that also provide some lateral spreading in their respective planes to provide enhanced interlocking. In some embodiments, the structural beam 211 and/or dielectric material 221 may also provide such interlayer and intralayer extensions. In embodiments where the tip arms and the conductive beam are made of the same material, such interlocking with each other in a single layer may be moot as no material interface within the layer would exist, though interlocking of material between layers may still be desirable.

Figure 2G:
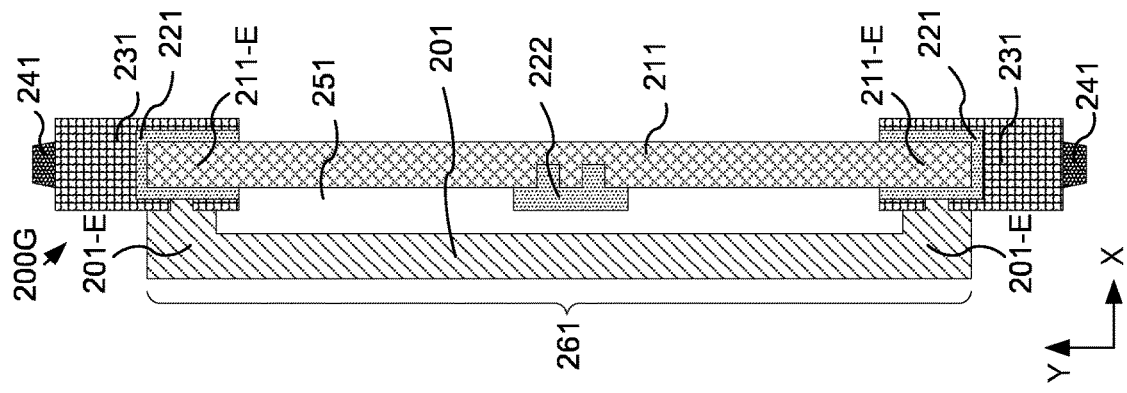
Figure 2F:
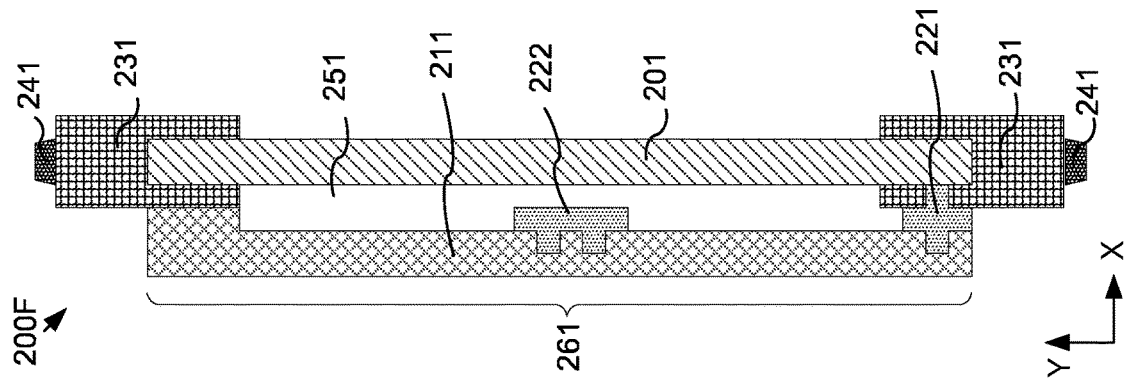
Figure 2E:
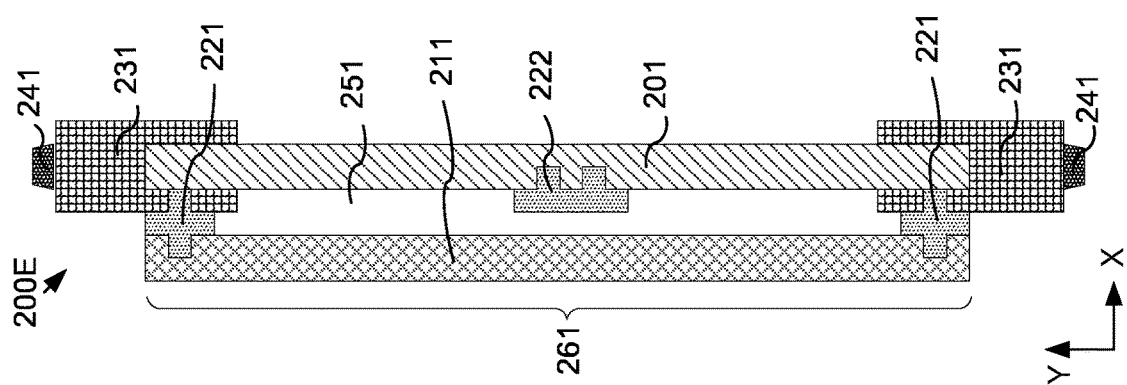

FIG. 2E provides a cross-sectional view of a probe 200E similar to that of FIG. 2C with the exception that an additional region of dielectric or thermal insulator 222 is attached to the current carrying beam to inhibit direct electrical or high thermal conductive contact of the central portions of structural and current carrying beams during deflection of the beams (i.e. compression of the probe tips toward one another), for example, to maintain some level of physical decoupling and/or electrical separation. As can also be seen, the upper and lower regions of the current carrying beam 201 also mesh with slots or indents in the tip extension regions 231 wherein the meshing provides partial lateral, or side-to-side, adhesion as well as longitudinal or end adhesion. In variations of this embodiment, the lateral adhesion may be extended by formation of one or more additional layers to provide front and/or back capping of beam ends by additional tip extension material. The other reference numbers in FIG. 2E illustrate features similar to those noted for FIGS. 2A-2D.

FIG. 2F provides a cross-sectional view of a probe 200F similar to that of FIG. 2E with the exception that the region of dielectric or thermal insulator 222 is adhered to the structural beam (i.e. shifted from the electrical beam to the structural beam), and wherein only one end (i.e. the lower end in this example) of the electrical beam and the structural beam are electrically isolated from one another by dielectric 221 which is still adequate to effectively block current flow. As can also be seen, the upper and lower regions of the current carrying beam 201 also mesh with slots or indents in the tip extension regions 231 wherein the meshing provides partial lateral, or side-to-side, adhesion as well as longitudinal or end adhesion. In variations of this embodiment, the lateral adhesion may be extended by formation of one or more additional layers to provide front and/or back capping of beam ends by additional tip extension material. The other reference numbers in FIG. 2F illustrate features similar to those noted for FIGS. 2A-2E.

FIG. 2G provides a cross-sectional view of a probe 200G similar to that of FIG. 2E with the exception that the positions of the electrical and structural beams have been reversed along with changes to position and configuration of dielectric material 221 that caps both the upper and lower ends 211-E of the structural beam 211 while the ends 201-E of the current carrying beam 201 attach to the sides of tip arms 231 via lateral extensions of the current carrying beam 201 and a recess in the tip arms 231. The capturing or meshing of the ends 211-E of the structural beam by a combination of the dielectric 221 and the tip extensions 231 also provides additional stabilization or structural integrity of the of the probe by strengthening the connection of the flexing structural beam with the tip extensions. In the present example, the meshing provides partial lateral, or side-to-side, adhesion as well as longitudinal or end adhesion. In variations of this embodiment, the lateral adhesion may be extended by formation of one or more additional layers to provide front and/or back capping of beam ends by additional dielectric and possibly tip extension material. The other reference numbers in FIG. 2G illustrate features similar to those noted for FIGS. 2A-2F.

Figures 3A, 3B, 3C:
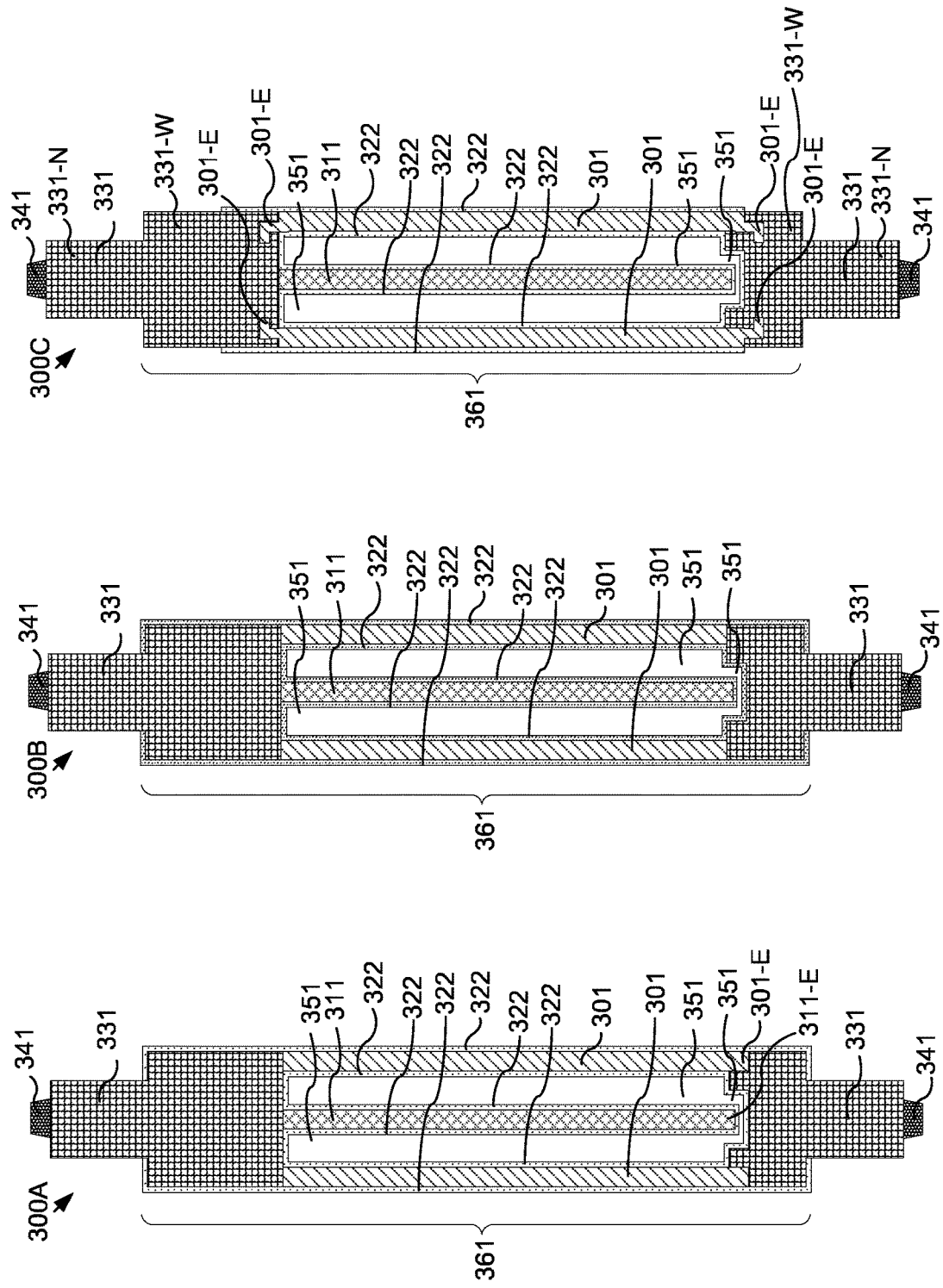

FIGS. 3A-3D provide cross-sectional views of various example probes according to a second group of embodiments where each probe includes three beams where one beam provides the primary mechanical properties of the probe (i.e. the structural beam) while two other beams provide the primary current carrying paths (i.e. the electrical beams) from one probe end to the other and where only one end of the structural beam is electrically isolated from the conductive beams and wherein the electrically isolated end is not fixedly joined to its corresponding tip extension or arm region but can provide desired structural properties via engagement of the structural beam with features of the tip arm upon deflection of the probe tips relative to one another while FIG. 3E provides a cut view similar to those of FIGS. 3A-3D but with the structural beam being physically joined to both tip extension regions where one such joining occurs via an electrical decoupling dielectric material.

FIG. 3A provides a cross-sectional view of a probe 300A having a conductive structural beam 311 and two electrical or current carrying beams 301 and tip extensions 331 that are surrounded by coatings of dielectric material 322 that may be deposited after layer formation and release of at least some sacrificial material (not shown). In this embodiment, the lower end of the structural beam enters a passage in the lower tip extension region where a dielectric material 322 is located over the structural beam 311 and an interface region of the lower tip extension 331, but they do not fixedly join one another but instead, upon deflection, the lower structural beam end 311-E contacts inner walls of a slot, hole, or gap 351 in the lower tip arm 331 where such engagement provides a desired mechanical response (e.g. elastic deformation and associated return force). The lower ends of current carrying beams 301-E also engage notches in lower tip arm 331. As in the other embodiments, an additional layer or layers may be formed above or below the depicted cross-section which may provide features that provide for out of plane maintenance of the depicted features and particularly for the depicted interfaces and/or may provide for other structural, electrical, or dielectric features of the probe. The other reference numbers in FIG. 3A illustrate features similar to those noted in FIGS. 2A-2F.

FIG. 3B provides a probe 300B similar to that of FIG. 3A but where the dielectric material 322 is deposited as part of the layer formation process. In other embodiments, the dielectric material may be different dielectric materials and be deposited in different ways such as via a combination of the layer formation processes and/or post-layer formation processes. Various alternatives to depositing and patterning dielectric and/or thermally insulative material exist and include, for example: (1) dispensing a liquid, spreading, solidifying or firming up, patterning, and then optionally solidifying further (e.g. a negative photoresist may be solidified by heating, exposure to visible or UV light exposure, exposure to pressure, or by removal of oxygen, etc.); (2) dispensing a liquid, spreading, solidifying, patterning, and then optionally solidifying further or breaking bonds; (3) dispensing a material selectively via inkjet; and (4) vacuum depositing a material via (a) PVD, (b) CVD, (c) sputtering, (d) heating to vaporize (e.g. to about 100-200° C. to put a desired material into a gaseous state (e.g. parylene), heating further (e.g. to 500-700° C.). to change the chemical composition of the gaseous material, transferring the modified gaseous material to a cool vacuum deposition chamber, and letting the material deposit onto a protected or unprotected surface, and if need be, removing the protection. The other reference numbers in FIG. 3B illustrate features similar to those noted in previous figures.

FIG. 3C provides a probe 300C similar to those of FIGS. 3A and 3B but where the dielectric material 322 does not extend longitudinally completely along the tip extension regions 331 but ends before reaching an distal end of a junction or widened region 331-W of the tip extension region 331 as compared to a more distal narrow region 331-N and where the ends of electrical beams 301-E include hooked or angled interlocking features that engage complementary features of the tip extension regions (i.e. features that engage one another such that they cannot separate without damage to one material or the other that extends beyond a mere separation at an interface) to provide not only adhesive attachment but also mechanical interlocking. As can be seen, interlocking of the features within the lower tip extension region extends longitudinally deeper or more distally into the tip extension region than it does for the upper tip extension region. As can also be seen, as with FIG. 3A, the lower regions of the current carrying beams 301 also mesh with indents, or notches in the tip extension regions wherein the meshing provides partial lateral, or side, adhesion as well as longitudinal or end adhesion. In variations of this embodiment, the lateral adhesion may be extended by formation of one or more additional layers to provide front and/or back capping of beam ends by additional tip extension material which could also help further secure the interlocking features. The other reference numbers in FIG. 3C illustrate features similar to those noted in previous figures.

FIG. 3D provides a probe 300D similar to that of FIG. 3A but where the current carrying beams are shifted laterally inward so that they not only engage notches in the tip extension regions as shown for the lower ends of the beams in FIG. 3A but so that the beams 301 are laterally surrounded by tip extension material 331 on both the lower and upper ends to provide side-to-side meshing and enhanced structural integrity of connection of the beams 301 to tip extension regions 331. Also the upper portion 311-E of the structural beam 311 is similarly meshed with the tip extension material 331 while the lower end 311-E of the structural beam 311 is laterally surrounded by a gap 351 that is bounded by dielectric 322. As with some of the previous embodiments, a portion of the gap is closed when the probe tips are subject to compression such that the structural beam is bent and provide an elastic return force to the deflected probe ends. In variations of this embodiment, the lateral adhesion may be extended by formation of one or more additional layers to provide front and/or back capping of beam ends by additional tip extension material and/or dielectric material which could also help further secure the meshed beam ends. The other reference numbers in FIG. 3C illustrate features similar to those noted in previous figures.

FIG. 3E provides a probe 300E similar to that of FIG. 3D but with dielectric material also coating the edges of the two electrical beams and with the gap 351 surrounding dielectric 322 around the lower end 331-E of structural beam 311 being filled and replaced with dielectric material 321. FIG. 3E also illustrates that the upper and lower tips 341 have different configurations. The upper tip may be configured as a tip for contacting a planar structure while the lower tip could be configured as a tip for contacting a bump or other non-planar structure. In other embodiments, one of the tips may be configured for permanent bonded contact to an interface structure or component. As with the other embodiments, numerous variations are possible including, for example: (1) variations in beam lengths, (2) variations in beam widths, (3) variations in beam configurations, (4) variations in tip extension configurations, (5) variations in the tip extension-beam, tip extension-dielectric, and/or beam-dielectric meshing or other interface configurations, (6) use of different materials on upper and lower ends of probes, (7) use of different configurations on lower and upper ends of probes, (8) use of the same materials on some probe features as opposed to the different material illustrated, and/or use of different tip arm and tip configurations. In some variations of this embodiment, the lateral adhesion may be extended by formation of one or more additional layers to provide front and/or back capping of beam ends or dielectric material by additional tip extension material and/or dielectric material which could also help further secure the meshed beam ends. The other reference numbers in FIG. 3E illustrate features similar to those noted in previous figures.

FIGS. 4A-4E provide cross-sectional views of various example probes according to a third group of embodiments where each probe includes three beams where one beam (the central beam or inner beam) provides the primary mechanical properties of the probe (i.e. the structural beam) while two other beams (the outer beams) provide the primary current carrying paths from one probe end to the other (i.e. the electrical beams) and where both ends of the structural beam are electrically isolated from the conductive beams by dielectric material located at least around the ends of the structural beam.

Figure 4C:
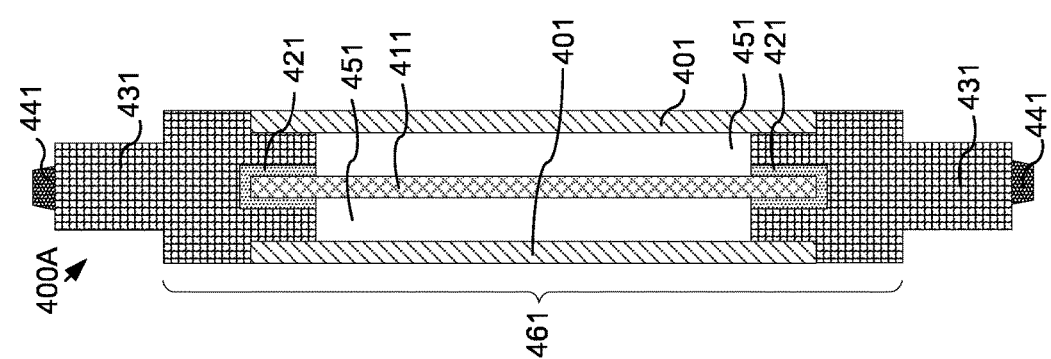
Figure 4B:
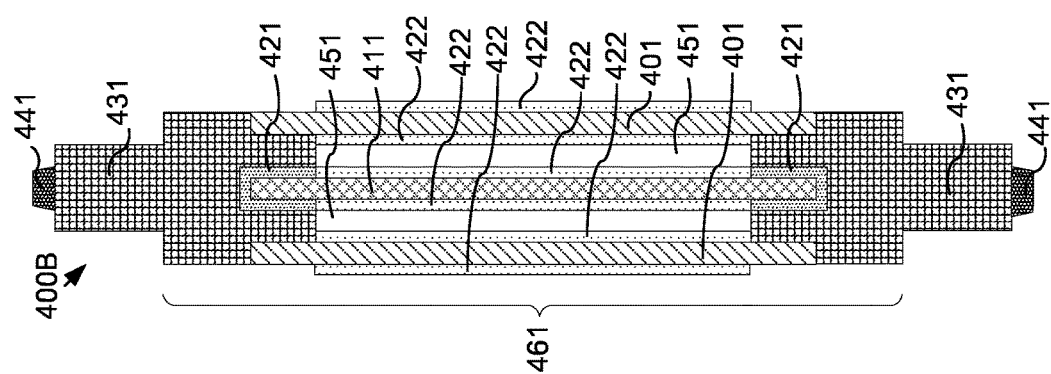
Figure 4A:
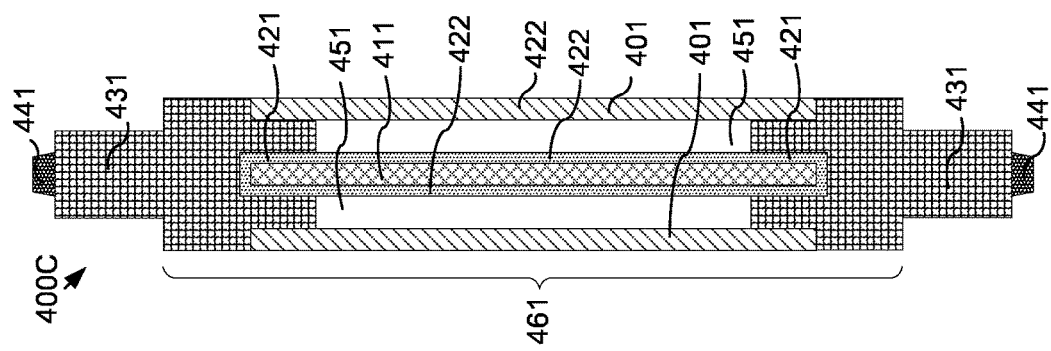

FIG. 4A provides a cross-sectional view of a probe 400D where the ends of the structural material beam 411 enter passages in the tip extension regions 431 and are joined to them by a barrier of dielectric material 421 (which may also be a thermal insulating material), which provides at least side-to-side meshing. The dielectric material is preferably, though not necessarily, created during a layer formation process. The ends of electrical beams extend into notches in the extension regions so that simple meshing occurs. As with the other embodiments, numerous variations are possible including those noted in association with FIG. 3E. In some variations of this embodiment, the lateral adhesion may be extended by formation of one or more additional layers to provide front and/or back capping of beam ends or dielectric material by additional tip extension material and/or dielectric material which could also help further secure the meshed beam ends. In other variations, the tip extension material may be made to capture the outer portions, i.e. the most lateral portions, of the current carrying beams to provide still further interface stability. The other reference numbers in FIG. 4A illustrate features similar to those noted in previous figures.

FIG. 4B provides a cross-sectional view of a probe 400B similar to that of FIG. 4A but with the exceptions that the probe additionally includes electrical beams being surrounded by coatings of dielectric material 422 that may have been deposited during layer formation or may be deposited conformally after layer formation and after release of at least some sacrificial material and wherein the structural beam includes a barrier of dielectric material 422 in addition to the dielectric material 421 that provide connectivity between the structural beam end 411-E and the tip extension region 431. The other reference numbers in FIG. 4B illustrate features similar to those noted in previous figures and as with the other embodiments numerous variations to the configuration illustrated are possible including variations noted for FIG. 4A.

FIG. 4C provides a cross-sectional view of a probe 400C similar to that of FIG. 4A but with the exception that the probe additionally includes a dielectric coating extending the length of the structural beam wherein the dielectric material is deposited during a layer formation process and where the coating is indicated as 421 if it provides connectivity and 422 if it simply provides a barrier. The other reference numbers in FIG. 4C illustrate features similar to those noted in previous figures and as with the other embodiments, numerous variations to the configuration illustrated are possible including variations noted for FIG. 4A.

FIG. 4D provides a cross-sectional view of a probe 400D similar to that of FIG. 4A but with the exception that the probe additionally includes a dielectric barrier material 422 over the central portion of the structural beam in addition to the dielectric material 421 located in the end regions 411-E of beam 411. Gaps in dielectric material that exist along beam 411 also exist between dielectric 422 and dielectric regions 421. The other reference numbers in FIG. 4D illustrate features similar to those noted in previous figures and as with the other embodiments numerous variations to the configuration illustrated are possible including variations noted for FIG. 4A.

FIG. 4E provides a cross-sectional view of a probe 400E similar to that of FIG. 4D but with the exception that the probe additionally includes a dielectric coating 422 over the inner, central portions of the two electrical beams 401 with gaps along the electrical beams between the central region and the tip extension regions. The other reference numbers in FIG. 4E illustrate features similar to those noted in previous figures and as with the other embodiments, numerous variations to the configuration illustrated are possible including variations noted for FIG. 4A.

FIGS. 5A-5E provide cross-sectional views of various example probes according to a fourth group of embodiments where each probe includes three beams where one beam (the central beam) provides the primary current carrying path of the probe from one probe end to the other (i.e. the electrical beam) while two other beams (the outer beams) provide the primary structural properties of the probe (i.e. the structural beams) and where at least one end of each structural beam is electrically isolated from the conductive beam by a barrier of dielectric material that was deposited during a layer formation process.

FIG. 5A provides a cross-sectional view of a probe 500A where the ends of the structural material beams engage barriers of dielectric material 521 that are located beside widened regions at the ends 501-W of the electrical beam. The dielectric material 521 providing the barrier provides a longitudinal barrier relative to the widened portion 501-W of current carrying beam 501 and a longitudinal barrier relative to a widen region of the tip extension or bridging region 531-W. The barrier provides a meshed joining of the structural beams to the rest of the probe for enhanced structural stability. In some variations of this embodiment, lateral adhesion may be extended by formation of one or more additional layers to provide front and/or back capping of beam ends by dielectric material or by additional tip extension material and/or dielectric material which could also help further secure the meshed beam ends.

FIG. 5B provides a cross-sectional view of a probe 500B similar to that of FIG. 5A with the two primary exceptions. The first exception is that expanded portions 501-W of the current carrying beam 501 are narrowed to allow regions of tip extension material to extend beside the current carrying beam 501 as well as to allow a lateral connection between the tip extension 531 and the ends 511-E of the structural beams 511 to exist. The notches in the sides of the tip extension regions provide for meshing with the structural beams while the slot, hole, or passage in the tip extension regions 531 provide for side-to-side meshed integration with the electrical beam 501. The second exception is that the central portions of either side, or edge, of each structural beam is coated with a dielectric material which may be applied during layer formation or after a layer formation process. Between the dielectric 522 coating the central regions of the structural beams 511 and the dielectric 521 bounding the ends of the structural beams, the structural beams are not shielded by dielectric material. In some variations of this embodiment, lateral adhesion may be extended by formation of one or more additional layers to provide front and/or back capping of beam ends by dielectric material or by additional tip extension material and/or dielectric material which could also help further secure the meshed beam ends.

FIG. 5C provides a cross-sectional view of a probe 500C similar to that of FIG. 5B with the exception that all three beams 501 and 511 have their central portions coated with a dielectric material 522 that may be applied during a layer build up process or in a post-layer-formation, post release formation process. In some variations of this embodiment, lateral adhesion may be extended by formation of one or more additional layers to provide front and/or back capping of beam ends by dielectric material or by additional tip extension material and/or dielectric material which could also help further secure the meshed beam ends.

Figure 5E:
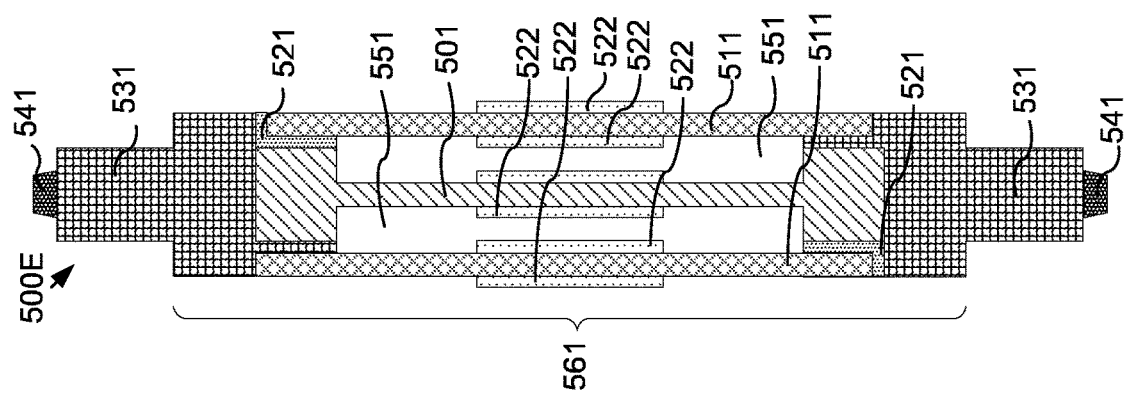
Figure 5D:
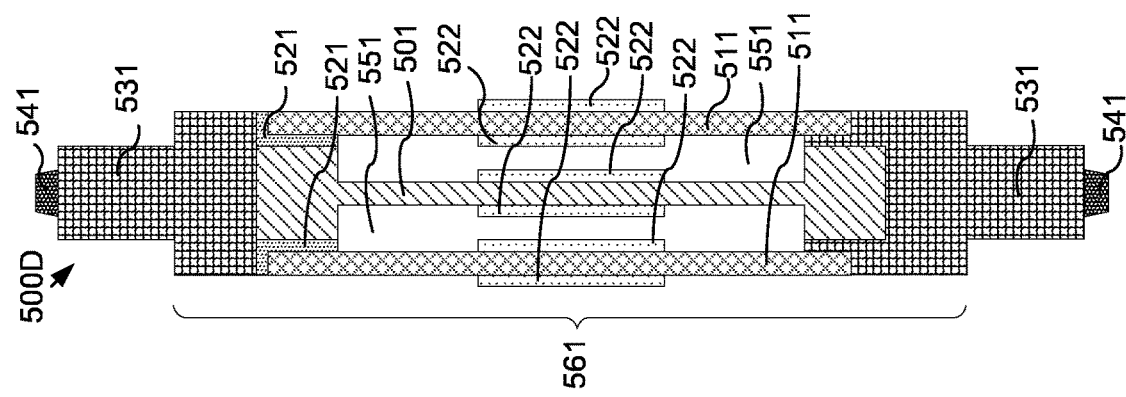

FIG. 5D provides a cross-sectional view of a probe 500D similar to that of FIG. 5C but only with the upper ends of the structural beams 511 being electrically isolated from the tip extension material 531 by a dielectric material 521 while the lower ends of the structural beam are allowed to make a conductive connection to the lower tip extension material. In some variations of this embodiment, lateral adhesion may be extended by formation of one or more additional layers to provide front and/or back capping of beam ends by dielectric material or by additional tip extension material and/or dielectric material which could also help further secure the meshed beam ends.

FIG. 5E provides a cross-sectional view of a probe 500E similar to that of FIG. 5C but with only the upper end of the right most structural beam 511 being electrically isolated from the upper tip extension material 531 by a dielectric 521 while the lower end of the left most structural beam 511 is electrically isolated from the lower tip extension material 531 by a dielectric 521. In some variations of this embodiment, lateral adhesion may be extended by formation of one or more additional layers to provide front and/or back capping of beam ends by dielectric material or by additional tip extension material and/or dielectric material which could also help further secure the meshed beam ends.

In alternative embodiments to those set forth in FIGS. 5A-5E, numerous additional variations are possible and including for example: (1) variations in beam lengths, (2) variations in beam widths, (3) variations in beam configurations, (4) variations in tip extension configurations, (5) variations in the tip extension-beam, tip extension-dielectric, and/or beam-dielectric meshing or other interface configurations, (6) use of different materials on upper and lower ends of probes, (7) use of different configurations on lower and upper ends of probes, (8) use of the same materials on some probe features as opposed to the different materials illustrated, and/or use of different tip arm and tip configurations. In still other variations, the location of dielectric space material may be moved from the ends of the beams to intermediate beam locations such that at least somewhere along the length of the beam, a dielectric barrier exists that inhibit current flow. In still other embodiments, the number of structural beam and number of current carrying beams may be different from the numbers illustrated. In still other variations, features or variations set forth with regard to other embodiments may be incorporated so long as such incorporation does not remove all the benefit, function or uniqueness of the features set forth in the base embodiment.

Figure 6A:
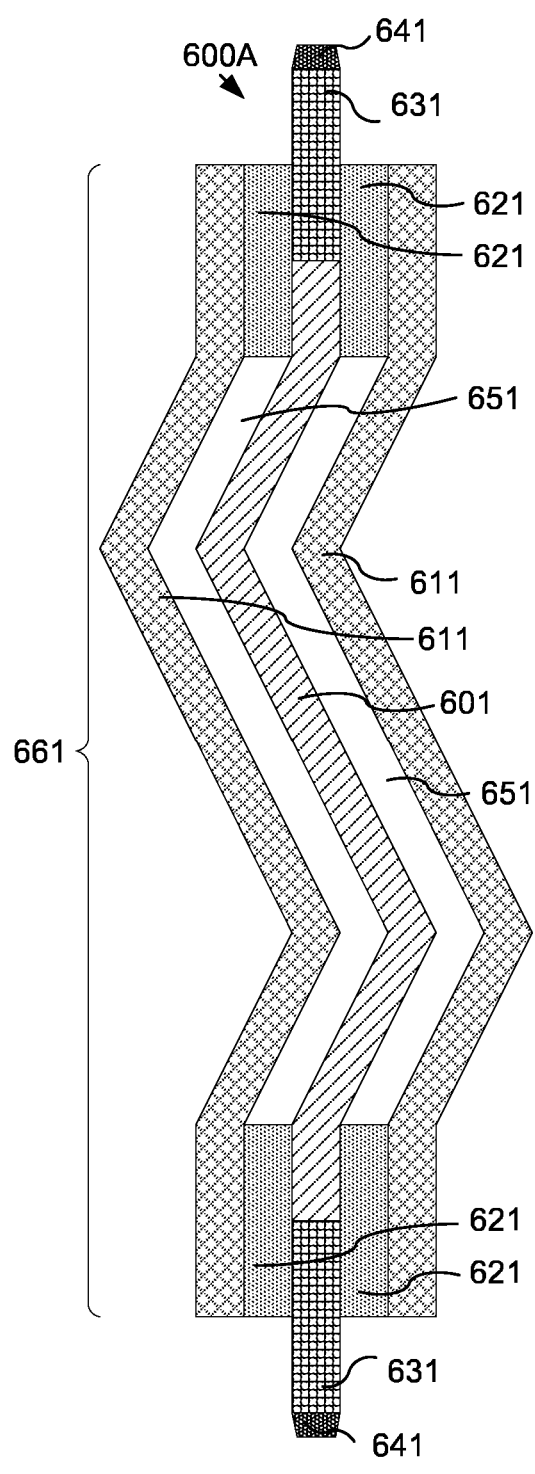
FIGS. 6A-6C provide cross-sectional views of various example probes according to a fifth group of embodiments where the probes are illustrated as having beams that are not straight, linear beams (while in an undeflected state) but instead define two-dimensional paths (and possibly three-dimensional paths) in space, wherein the probes are each illustrated as having three beams with a center beam being the electrical beam while the outer beams are the structural beams which are electrically isolated from the electrical beams by dielectric spacers located near the ends of the beams.
Figure 6B:
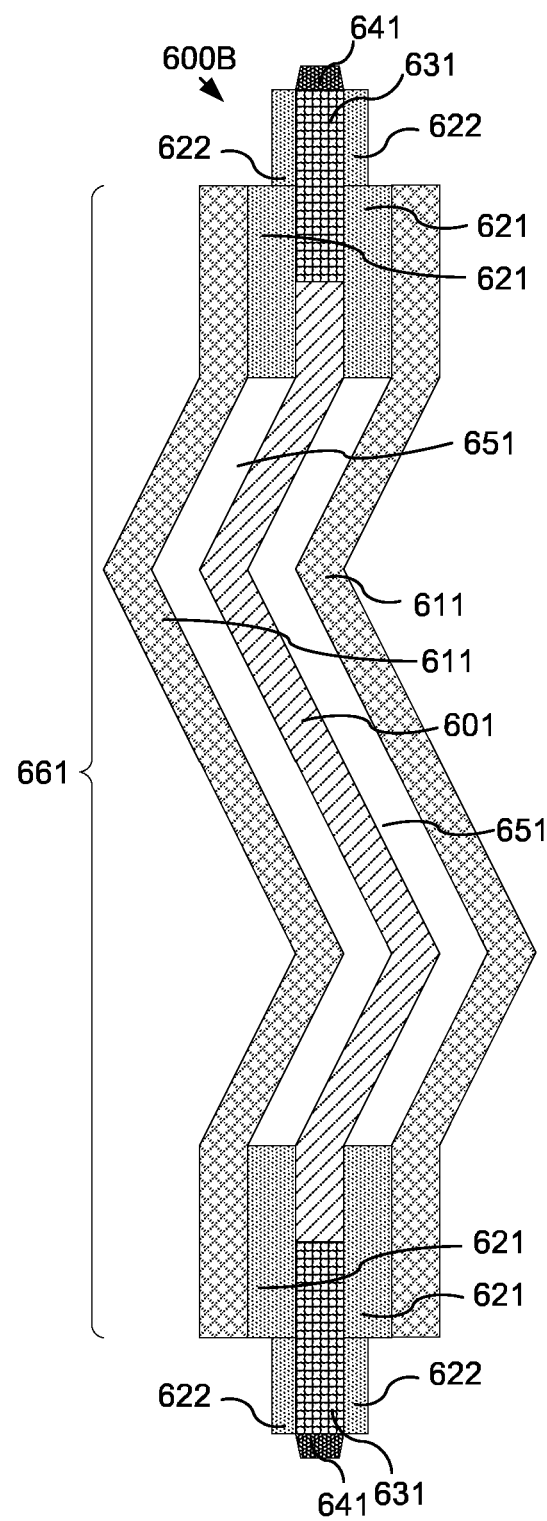
Figure 6C:
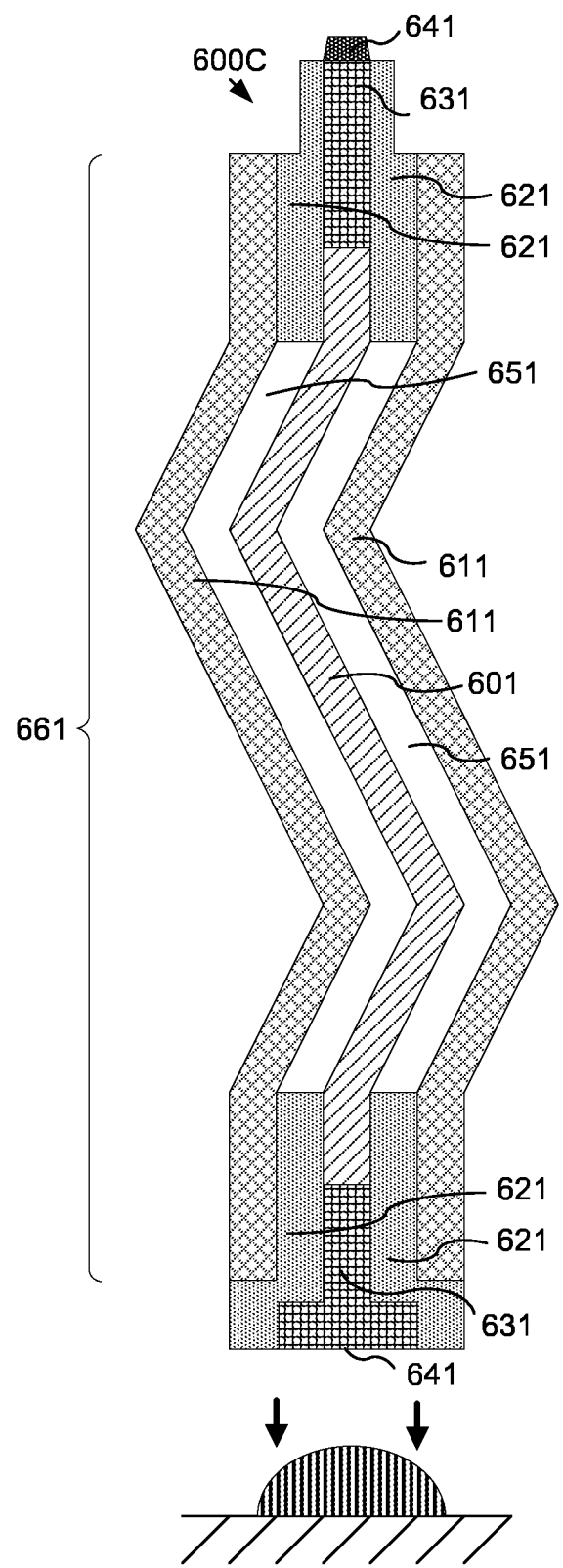

FIGS. 6A-6C provide cross-sectional views of various example probes according to a fifth group of embodiments where the probes are illustrated as having beams that are not straight, linear beams (while in an undeflected state) but instead define two-dimensional paths (and possibly three-dimensional paths) in space, wherein the probes are each illustrated as having three beams with a center beam being the electrical beam while the outer beams are the structural beams which are electrically isolated from the electrical beams by dielectric spacers located near the ends of the beams.

FIG. 6A provides a cross-sectional view of a probe 600A with planar S-shaped structural arms 611 and an S-shaped current carrying arm 601 (or three-dimensional S-Shaped arms) where the ends 611-E of the structural material arms 611 connect to dielectric material regions 621 that are joined to the ends 601-E of the current carrying beam. In some variations of this embodiment, lateral adhesion may be extended by formation of one or more additional layers to provide front and/or back capping of beam ends by dielectric material or by conductive material (e.g. structural beam material, current carrying beam material, or tip extension material) which could also help further secure the beam ends and tip arms at the ends of the body portion 661 of the probe while maintaining appropriate conductive isolation.

FIG. 6B provides a cross-sectional view of a probe 600B similar to that of the FIG. 6A with the exception that dielectric material 621 between structural beams 611 and the current carrying beam 601 and the tip extension 631 also continues as dielectric material 622 distally past the structural beams (i.e. closer to the probe tips) along the tip extension region 631. The extended dielectric provides additional protection around the extreme extends (necks) of the tip extension regions which may aid in mounting of the probes in conductive guide plates or the like while avoiding inadvertent shorting between the tip neck and the guide plates. In some variations of this embodiment, lateral adhesion or dielectric isolation may be extended by formation of one or more additional layers to provide front and/or back capping of beam ends or tip extension regions by dielectric material or by conductive material (e.g. structural beam material, current carrying beam material, or tip extension material). Such additional layers of material could help further secure the beam ends and tip arms at the ends of the body portion 661 of the probe while maintaining appropriate conductive isolation.

FIG. 6C provides a cross-sectional view of a probe 600C similar to that of FIG. 6B with the exception that the probe does not have a bottom contact tip but instead is provided with a configuration to allow connection to (e.g. attachment via soldering) and possibly even centering on, a solder bump of a surface to be engaged. As with the other embodiments, numerous variations are possible and include those presented above and hereafter in association with the other embodiments as well other variations such as those that provide a multi-point tip or a hollow tip that aids in centering.

FIGS. 7A-7E respectively provide a top view, a side view, and three cross-sectional views of a probe according to a sixth embodiment of the invention while FIGS. 7F-1-7F-9, respectively provide views of the structural materials (including, for example, beam material(s), tip extension material(s), tip material(s), and dielectric material(s)) of each of the nine layers from which a probe of this example may be formed. The nine layers form the various elements or features of the probe wherein probe tips are formed as part of the fifth layer, supporting elements, or tip arms, for the probe tips are formed as part of the fourth-sixth layers, probe end bodies, including dielectric elements are formed as part of the first-ninth layers, an outer pair of structural beams are formed as part of first-ninth layers, and an inner or central beam for carrying current is formed as part of the intermediate fourth-sixth layers.

Figure 7A:
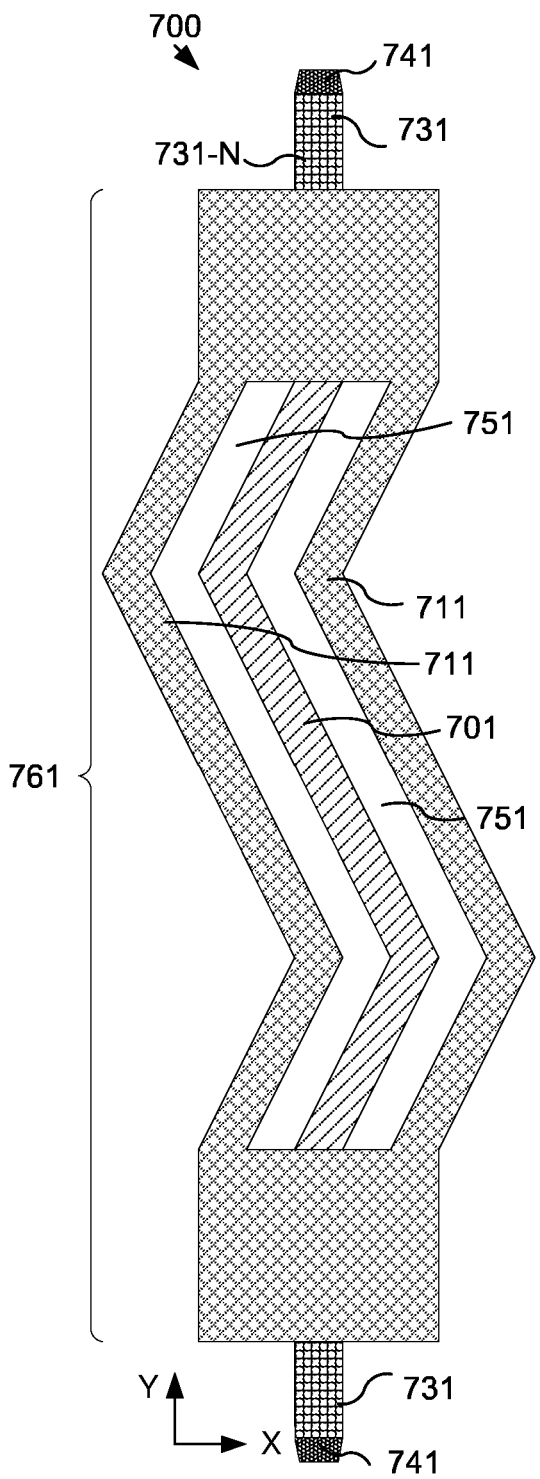
FIGS. 7A-7E respectively provide a top view, a side view, and three cross-sectional views of a probe according to another embodiment of the invention while FIGS. 7F-1-7F-9, respectively provide views of the structural materials of the first to ninth layers that form the various elements or features of the probe wherein probe tips are formed as part of the fifth layer, supporting elements, or tip arms, for the probe tips are formed as part of the fourth-sixth layers, probe end bodies, including dielectric elements, are formed as part of the first-ninth layers, an outer pair of structural beams are formed as part of first-ninth layers, and an inner or central beam for carrying current is formed as part of the intermediate fourth-sixth layers.

FIG. 7A provides a top view of a probe 700 according to another embodiment of the invention. The probe 700 has some similarities to the probes of FIGS. 6A-6C particularly in its general configuration and the S-shape of its two-structural beams and its current carrying beam. The view of FIG. 7A shows the features of the probe as can be seen looking down the Z-axis from above a top layer of multiple layers from which the probe may be formed. The visible X and Y features of the probe can be seen with the different features shown with different hatching patterns which may or may not be indicative of different materials that are used to form such features. In particular, in the view provided by FIG. 7A, exposed portions of the upper and lower tips 741 can be seen which are connected to a narrow portion 731-N of the tip extension or arm region 731, which in turn merge into a joining region of the probe of which only widened top and bottom regions of the connected or joined structural beams can be seen. In the joining region, but hidden behind the joined structural beam material, other features exist including portions of the tip extension regions, regions of dielectric material, and end regions of the current carrying beam 701. Also between the narrow, intermediate, and compliant/elastic portions of the structural beams 711, the exposed portion of the current carrying beam 701 can be seen as being separated from the structural beam by gaps 751. FIG. 7A also illustrates what is sometimes referred to as the body of the probe which extends from the distal ends of the joining regions through the central portion of the probe and excludes the narrow tip extensions or tip arms as well as the tips themselves.

Figure 7B:
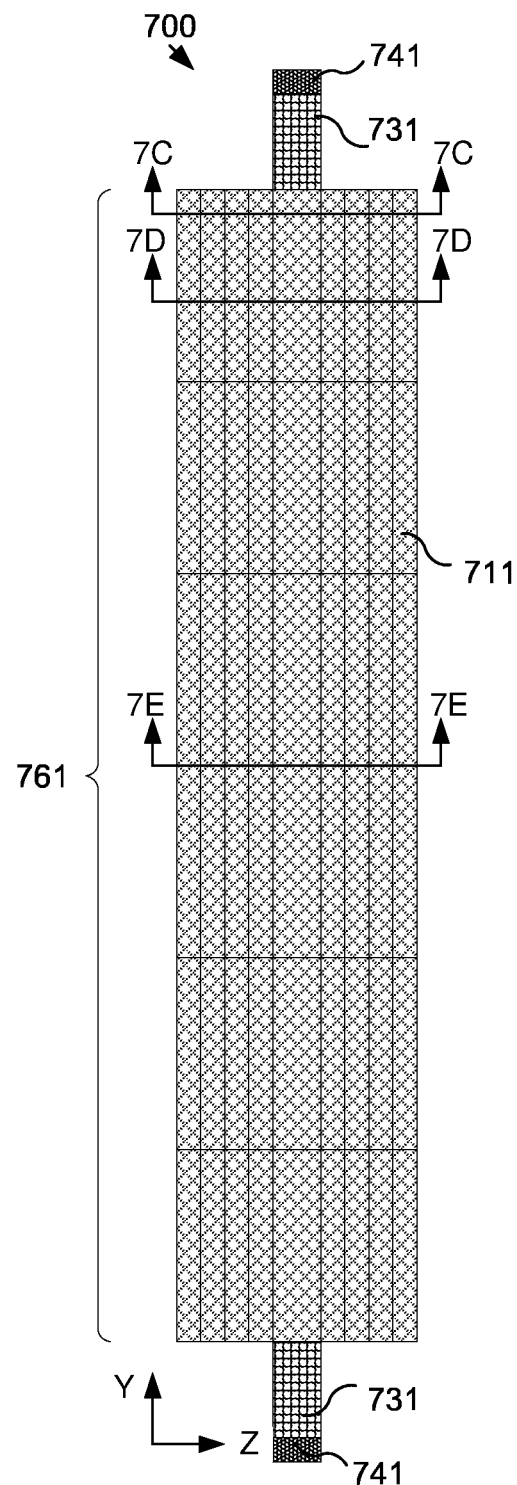

FIG. 7B shows a side view of the probe looking along the X-axis such that side views of structural material forming part of each of the nine layers that make up the probe can be seen. In this view, it is clear that the visible structural beam extends unbroken through all nine layers. FIG. 7B also shows cut lines 7C-7C, 7D-7D, and 7E-7E which define the location and perspective shown in the views of FIGS. 7C-7E respectively. The views of FIGS. 7C-7E each show thin cross-sectional cuts of the probe looking along the Y-axis so that different X and Z regions of the probe can be seen.

Figure 7C:
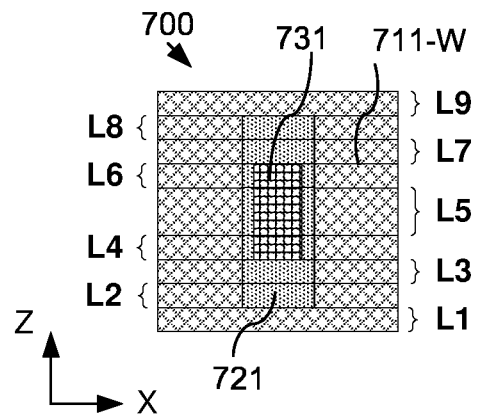

FIG. 7C shows a cut view through a longitudinally distal portion of the upper joining region of probe 700 showing intersected portions of the first-ninth layers L1 to L9. Since the probe is symmetric about a central X-Z plane and about a central Y-Z axis, a similar cut view through the lower joining region would provide a set of features that are similar to those of FIG. 7C while the left and right sides of the image also provide similar features. It can be seen that the no tip material exists in the cut plane but tip extension, or tip arm, material 731 exists in the central portion of the middle three-layers and is completely surrounded by dielectric material 721 that exists on the middle seven layers. The dielectric material is in turn surrounded by widened structural beam material 711-W on the left and right and a connection or joining region of structural beam material on the first and ninth layers.

Figure 7D:
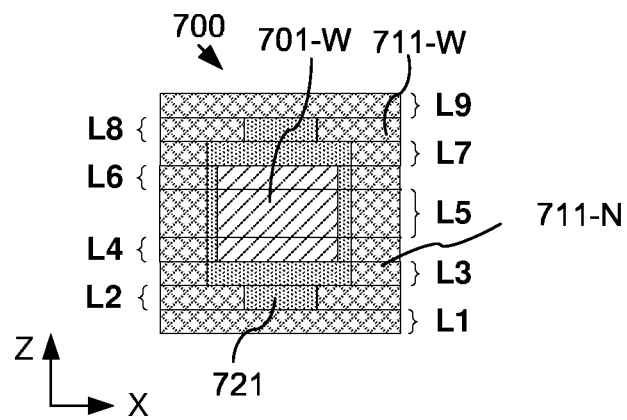

FIG. 7D shows a cut view through a more central portion of the upper joining region. As with FIG. 7C, since the probe is symmetric about a central X-Z plane, a similar cut view through the lower joining region would provide a set of features that are similar to those of shown in FIG. 7D. It can be seen that no tip material and no tip extension material exist in the cut plane but widened current carrying beam material 701-W exists in the central portion of the middle three-layers and is completely surrounded by dielectric material 721 that exists on the middle seven layers. The dielectric material is in turn surrounded by regions of widened structural beam material 711-W and narrow structural beam material 711-N on the left and right and a connection element or region of structural beam material on the first and ninth layers. In some variations, the dielectric material barriers and connective elements may have different configurations so as to optimize electrical or mechanical properties of the probes. In some variations, the dielectric material may be limited to one end region of the probe or to an intermediate portion of the probe as opposed to both end regions and/or may take on configurations or be applied so as to minimize the number of layers on which dielectric material needs to be formed without unduly impacting probe performance or life.

Figure 7E:
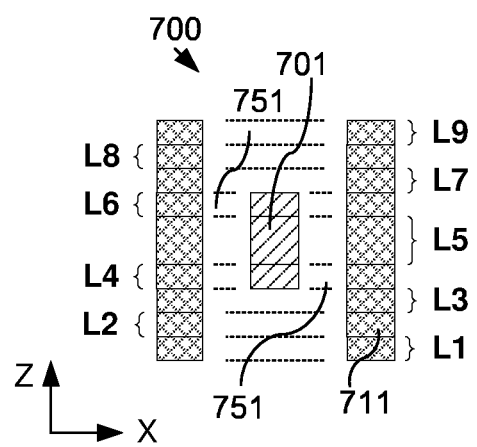

FIG. 7E shows a cut view through a central region of probe 700 wherein the left and right structural beams 711 can be seen including portions thereof being formed on each of the first-ninth layers along with the central current carrying beam has portions formed on each of the middle three layers L4-L6 wherein a gap 751 exists between the carrying beam and the structural beams. In variations where the current carrying beam is formed of thickness and shape as those of the structural beam but only has approximately 18% of the width of the combined structural beam, its contribution to structural strength or elasticity of the probe will be only around 20% of that of the structural beams and even less if the current passing through the current carrying beam raises its temperature such that yield strength is lessened. In other alternatives, the width of the current carrying beam may be larger relative to the structural beam or even smaller, thereby changing its effective contribution, or impact, on structural strength and/or elasticity. In variations where the current carrying beam is formed of a different material or made to have different configurations or thicknesses, the contribution to structural strength and/or elasticity of the probe may be varied further and may have an impact on an extent to which a probe returns to an initial configuration before and after compressions. The tailoring of materials and configurations to optimize use parameters may be determined empirically or via CAD based finite element analysis or other simulations by those of skill in the art.

FIGS. 7F-1 to 7F-9 each illustrate the structural material portions of a probe layer for each of first to ninth layers L1-L9 that make up the probe. Because of the small size of the probes and economies of scale, in actual fabrication, it is preferred that many hundreds to thousands of probes be formed simultaneously in batch from a plurality of successively formed and adhered layers. Of course alternative formation methods may be used. In fabrication of the probe of this example, each of layers L1-L4 and L6-L9 have the same thickness while the central layer L5 has thickness that is twice that of the other layers. In variations of this embodiment, layer thicknesses may be different than those shown even to the extent that all layers have the same thickness or all layers have different thicknesses. In some variations, a number of layers may be used to form the probe. For example, in one variation, the central layer may be formed as two or more layers. In addition to the structural material features (e.g. structural beam features, current carrying beam features, dielectric features, tip extension features, and tip features), FIGS. 7F-1 to 7F-9 also provide a rectangular dotted outline that functions as a visual alignment guide such that when the guides are stacked in registration with one another, the structural features of each layer lie in registration.

Figures 7, 7F, 8, 9:
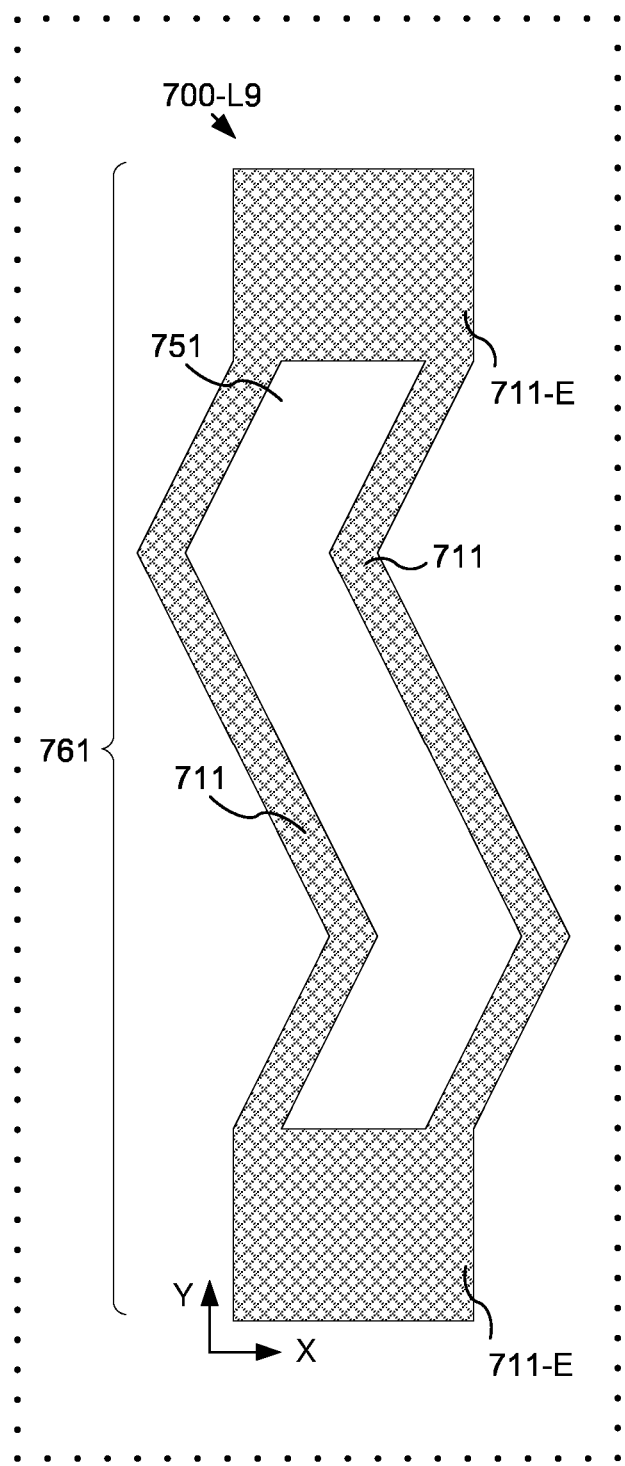
Figures 8A, 8B:
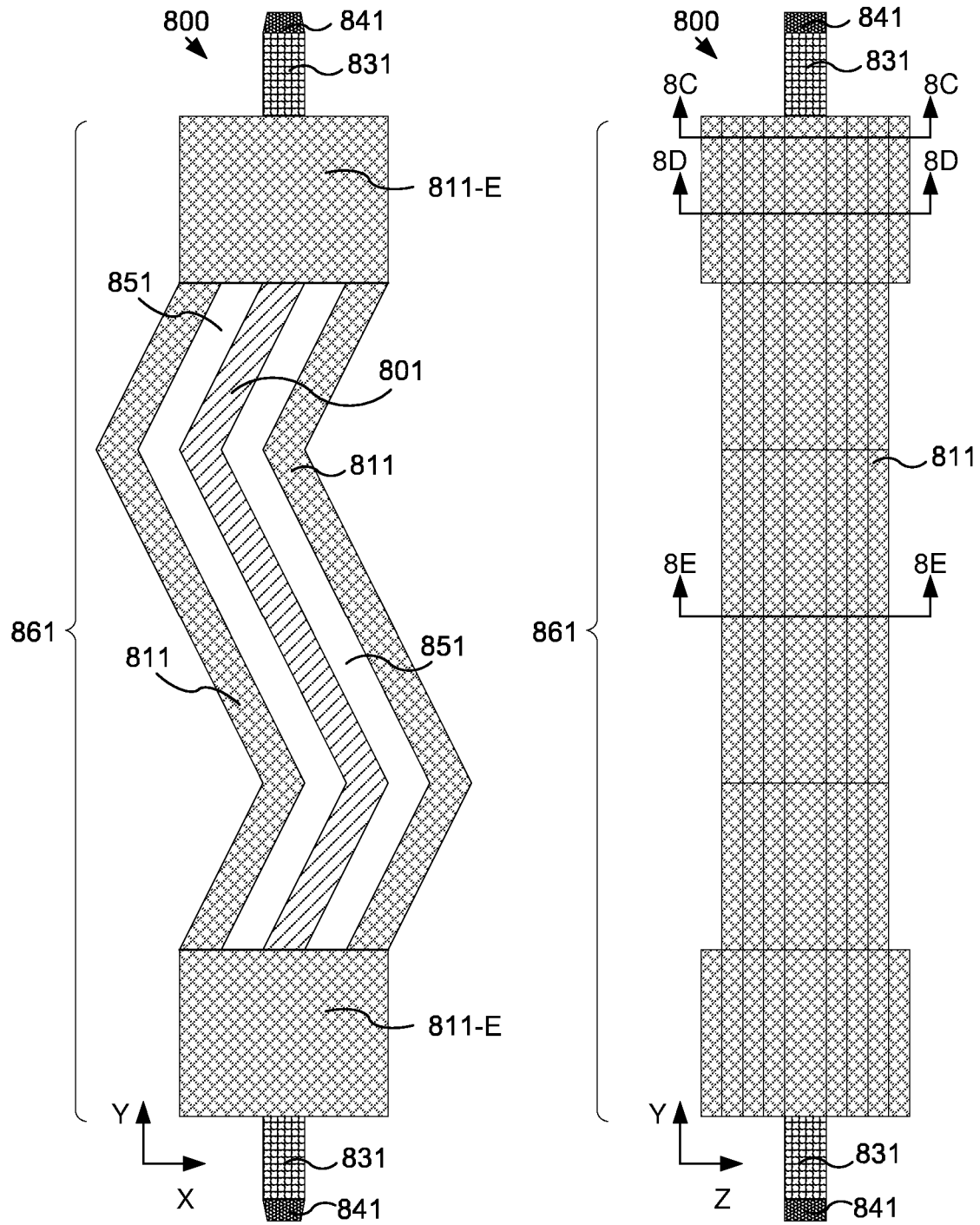
FIGS. 8A-8E respectively provide a top view, a side view, and three cross-sectional views of a probe according to another embodiment of the invention while FIGS. 8F-1-8F-9, respectively provide views of the structural materials of the first to ninth layers that form the various elements or features of the probe wherein probe tips are formed as part of the fifth layer, supporting elements, or tip arms, for the probe tips are formed as part of the fourth-sixth layers, with probe end bodies, including dielectric elements, formed as part of the first-ninth layers, an outer pair of structural beams formed on the second-eighth layers, and an inner or central beam for carrying current formed as part of the intermediate fourth-sixth layers.
Figure 8C:
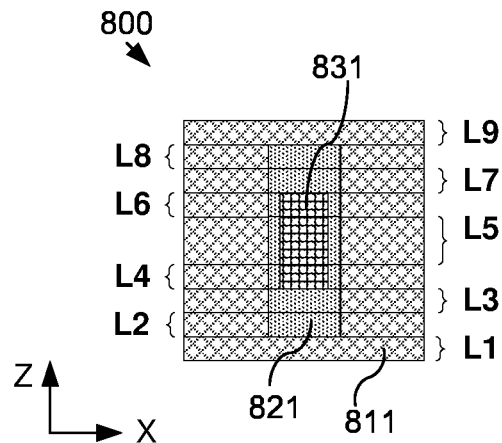
Figure 8D:
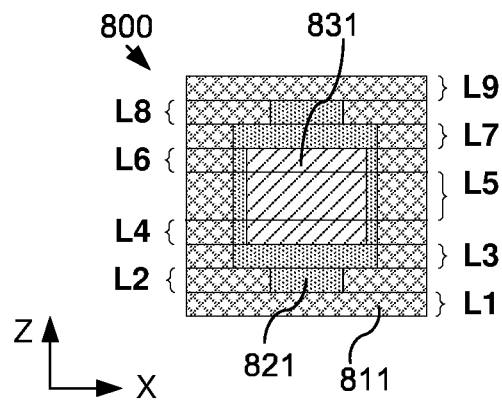
Figure 8E:
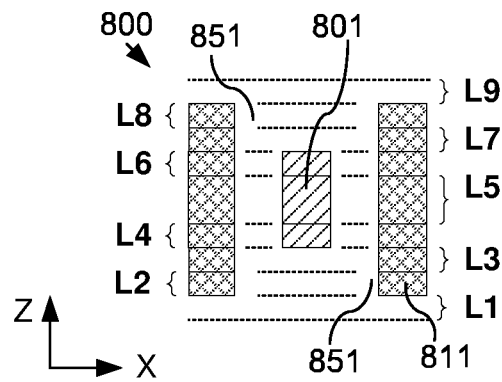
Figures 8, 8F, 9:
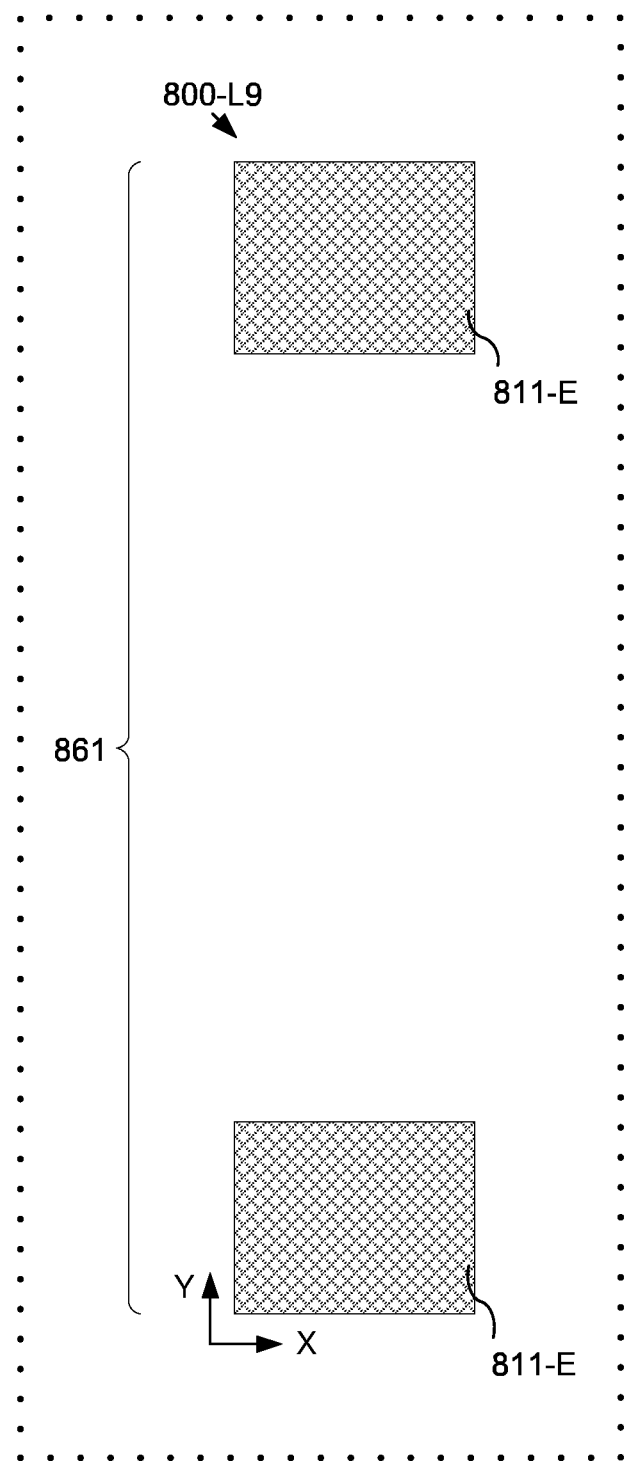
Figure 11C:
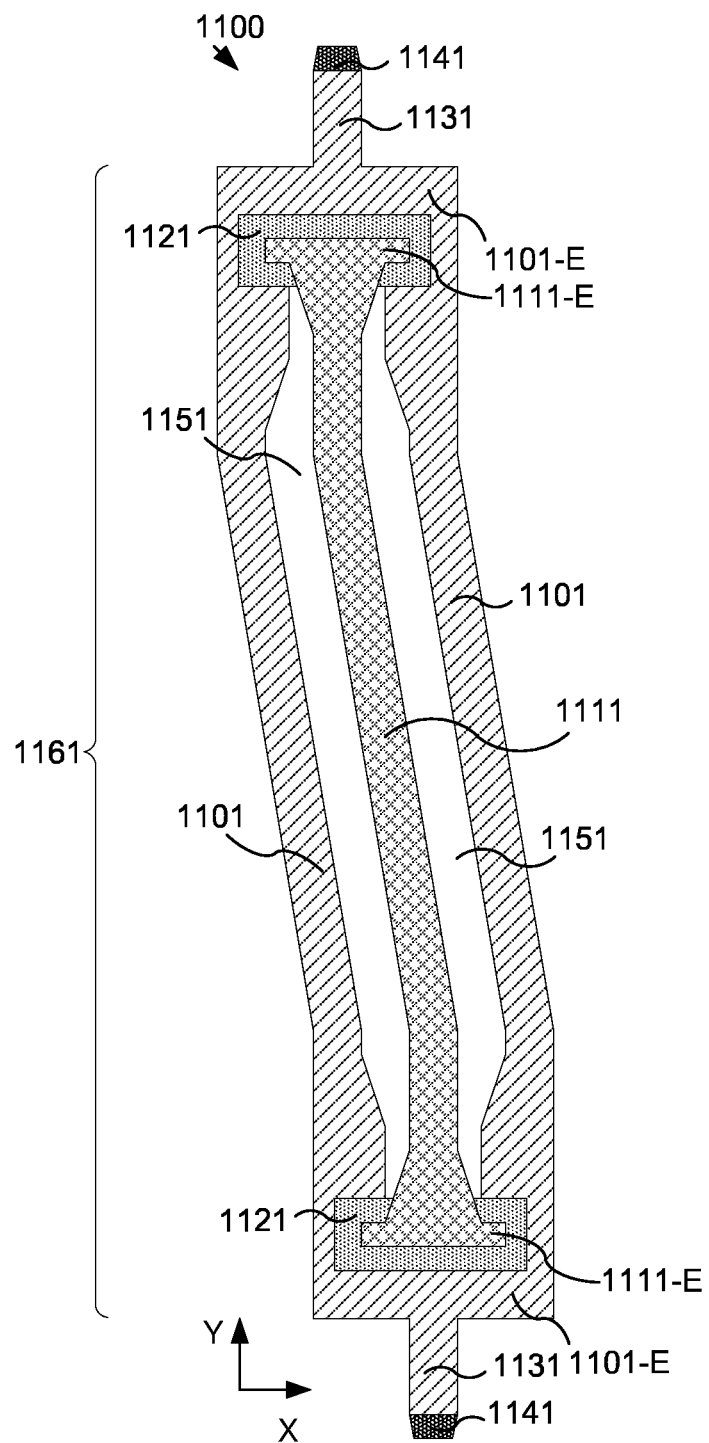
FIGS. 11A-11O respectively provide a top view, a side view, and a cut view of a probe according to another embodiment of the invention while FIGS. 11D-1-11D-5, respectively provide views of the structural materials of the first to fifth layers that form the various elements or features of the probe wherein the probe is formed with probe tips as part of the third layer, supporting elements, or tip arms, formed as part of the second-fourth layers, probe end bodies, including dielectric elements, formed as part of the first-fifth layers, a pair of outer current carrying beams formed as part of the first layer and another pair of current carrying beams formed as part of the fifth layer, and an inner or central structural beam formed as part of the third layer.
Figures 5, 11D:
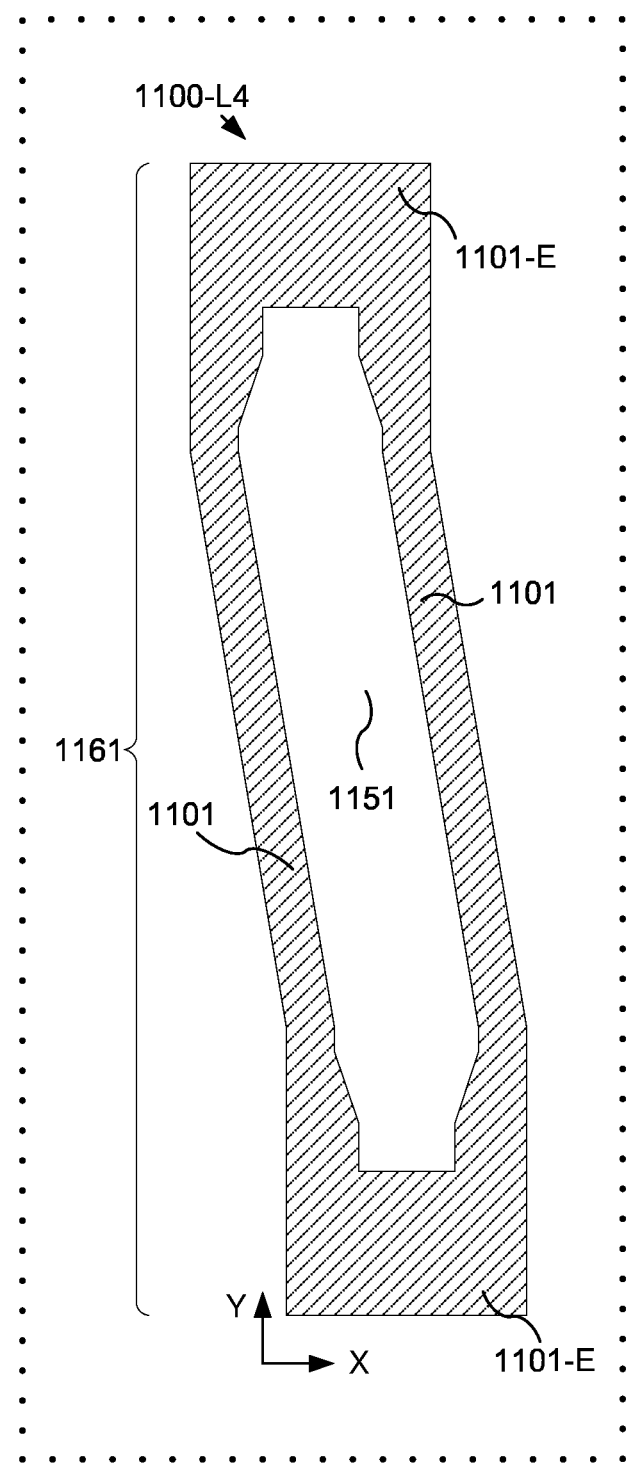

From FIG. 7F-5, it can be seen that the current carrying beam 701, the tip extensions 731, and the tips 741 form a complete conductive path that extends from one probe end to the other with tip extensions 731 including tip ends 731-E which include widened features 731-W (see FIGS. 7C-7D) and the current carrying beam end 701-E which includes widened features 701-W (see FIG. 7D) and are fully embedded in the layer by dielectric material which in turn is surrounded on the sides and partially on longitudinally interior and exterior portions by structural beam material. In fact, it is clear that the inward laterally facing X-extents and Z-extents of the structural beam material 711 overlap outward laterally facing X-extents and Z-extents of the current carrying beam material 701 (as is also true for outward facing longitudinal extents) such that the intervening dielectric material is sandwiched between well bonded layers of conductive structural beam material and well bonded layers of conductive extension material which places the dielectric material into compression when it is stressed by tip-to-tip movement (i.e. compression) when the probe is undergoing normal usage. As probe tips and associated deflection of the beam elements occurs, the current carrying beam 701 is held relative to the conductive materials not only, or even necessarily primarily by, adhesion forces between the dielectric and the conductive materials but by the compressive strength of the dielectric material as it is fixedly held by the tip extension and structural beam materials.

From FIGS. 7F-4 and 7F-6, it can be seen that similar features are formed as those of FIG. 7F-5 with the exception that the distal end of the tip arm regions extend beyond their respective ends as shown in FIG. 7F-5 such that they laterally capture and help retain the tip material of layer L5 not only by an adhesive material connection but by mechanical meshing and/or interference. In some variations, additional material indentions and protrusions may be provided to enhance interlocking and the material-to-material connection.

In FIGS. 7F-3 and 7F-7, the widened regions of current carrying beam material and tip extension material can be seen but without longitudinally inward extending portions of current carrying beams themselves and without longitudinally outward extending portions of tip arms being formed. As can be seen, the insulating dielectric material and surrounding regions of widen structural beam material capture the widen regions of current carrying and tip extension material both laterally and longitudinally in both directions.

In FIGS. 7F-2 and 7F-8, it can be seen that both tip arm and current carrying features do not exist but instead dielectric material 721 completely fills the junction region between the end regions 711-E of the structural beams 711 which completes the dielectric enclosure and shielding of the current carrying beam ends 701-E and widened end portions 701-W (see FIG. 7D) and the tip extensions (or arms) 731 and ends 731-E.

In FIGS. 7F-1 and 7F-9, the final (or most lateral) regions of the structural beams 711 and joining region of the structural beams 711-E can be seen which captures and laterally retains the dielectric material of FIGS. 7F-2 and 7F-8. These layers (L1 and L9) lock the dielectric material between the exterior regions of structural beam material (found on each of layers L1-L9) and the interior regions of current carrying beams (found on each of layers L4-L6) and tip extension conductive material (found on each layers L4-L6) so that a probe with isolated structural beams 711 and current carrying beams 701 is formed where the isolating dielectric 721 is captured and retained in a manner that provide for enhanced stability and compressive retention of the dielectric material when stressed.

As with the other embodiments, numerous variations to the embodiment of FIGS. 7A-7F-9 are possible. Some such variations were set forth above and others are set forth below while still others may be created by combinations of features of the other embodiments with those of the present embodiment or by combining alternatives associated with the other embodiments with those of the present embodiment.

FIGS. 8A-8E respectively provide a top view, a side view, and three cross-sectional views of a probe according to another embodiment of the invention while FIGS. 8F-1-8F-9, respectively provide views of the structural materials of the first to ninth layers that form the various elements or features of the probe wherein probe tips are formed as part of the fifth layer, supporting elements, or tip arms, for the probe tips are formed as part of the fourth-sixth layers, with probe end bodies formed as part of the first-ninth layers including dielectric elements (L2-L8), an outer pair of structural beams formed on the second-eighth layers, and an inner or central beam for carrying current formed as part of the intermediate fourth-sixth layers.

The probe 800 of FIGS. 8A-8F-9 is similar to the probe 700 of FIGS. 7A-7F-9 with the primary exception that both structural beam elements 711 and structural beam ends 711-E of probe 700 are formed as part of layers 7F-1 and 7F-9 while only structural beam ends 811-E of probe 800 form part of layers 8F-1 and 8F-9. Thus the structural beams 811 (excluding end regions 811-E) of probe 800 are formed only as part of layers L2-L8 while the structural beams 711 and ends 711-E of probe 700 are formed as part of all of layers L1-L9.

Figure 9C:
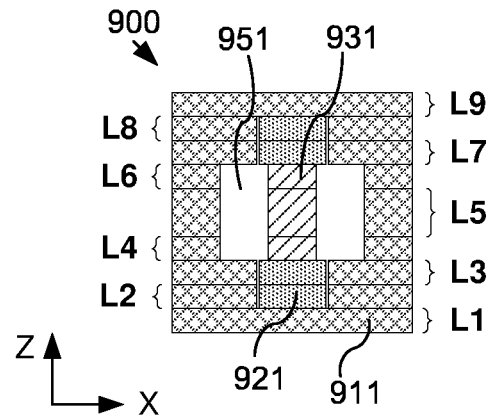
Figure 9D:
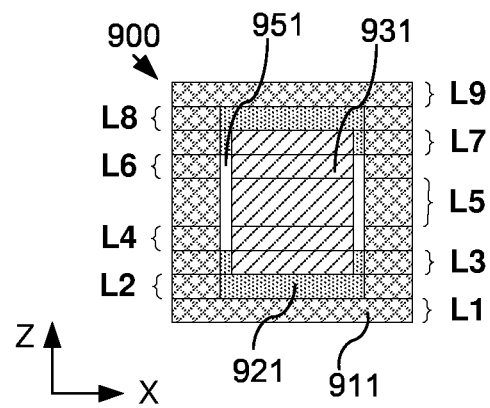
Figure 9E:
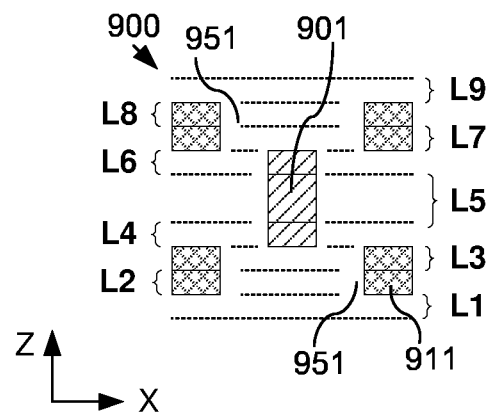
Figures 9, 9F:
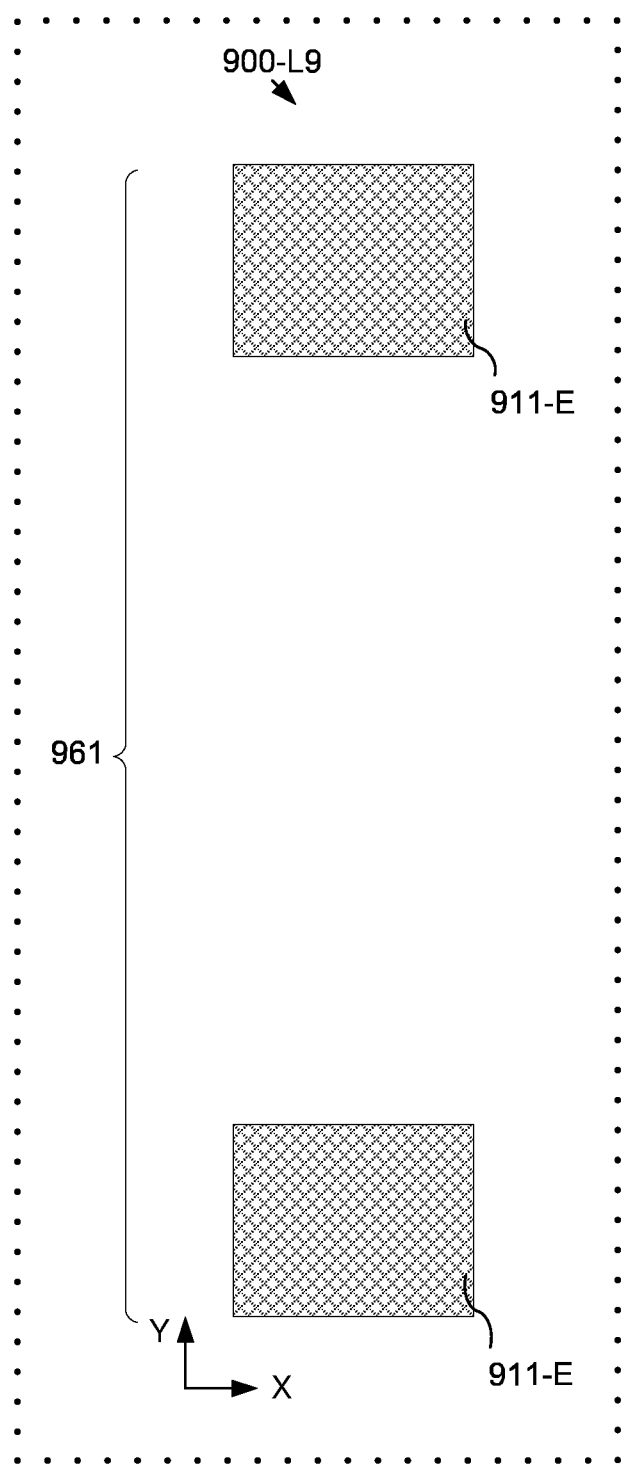

FIGS. 9A-9E respectively provide a top view, a side view, and three cross-sectional views of a probe according to another embodiment of the invention which provide similar perspectives to those of FIGS. 7A-7C and 8A-8C. FIGS. 9F-1-9F-9, respectively, provide views of the structural materials of the first to ninth layers that form the various elements or features of probe 900. Several difference exist between probe 800 and probe 900. One difference is that probe 900 includes four structural beams 911 instead of the two structural beams 811 of probe 800. Another difference is that probe 900 incorporates dielectric material via only four layers instead of the seven layers incorporated into probe 800 which provides for air gaps within the joining of end regions of the probe body while still providing required electric isolation and compressive capture of the current carrying beam. A further difference is that the probe 900 provides no indication of difference between the material of the tip arm 931 and the material of the current carrying beam 901. Probe 900 is formed with probe tips 941 as part of L5, tip arms 931, and current carrying beam 901 as part of L4-L6, tip arm ends 931-E with widened regions and conductive beam end elements 901-E with widened regions as part of layers L3-L7, and a pair of structural beams as part of L2 and L3 and another pair of structural beams as part of L7 and L8, and with the only lateral ends or caps of the joining regions of the body portion 961 formed on layers L1 and L9.

The embodiment of FIGS. 9A-9F-9 uses similar reference numbers as those used with the other embodiments but with the 900 series forming the basis of the numbers. It is believed that the similarities and differences between probe 900 and probes 700 and 800 will be readily understood by those of skill in the art in view of the above description and the insights that are shown in the figures. As with the other embodiments, numerous alternatives exist and will be apparent to those of skill in the art with such alternatives including those noted above and those noted hereafter in association with other embodiments.

FIGS. 10A-10E provide cut views of various example probes according to another group of embodiments where the probes, like those of FIGS. 6A-6C, are illustrated as having beams that are not straight, linear beams (while in an undeflected state) but instead define two-dimensional paths (and possibly three-dimensional paths) in space, wherein the probes each are illustrated as having three beams with a center beam being the structural beam while the outer beams are the current carrying beams and wherein the structural beams are electrically isolated from the current carrying beams by dielectric end caps that are part of the probe body ends which are located near the ends of the beams and wherein various levels of interlocking of different materials are provided to enhance integrity of joined regions.

Figure 10A:
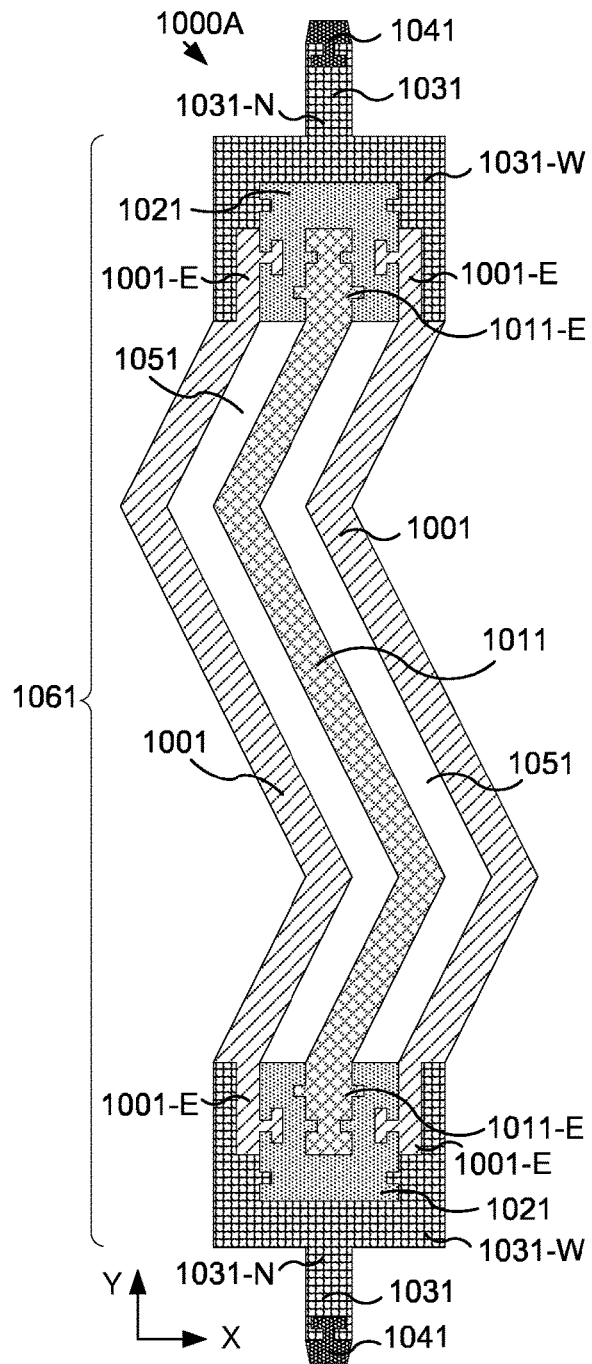
FIGS. 10A-10E provide cut views of various example probes according to another group of embodiments where the probes, like those of FIGS. 6A-6C are illustrated as having beams that are not straight, linear beams (while in an undeflected state) but instead define two-dimensional paths (and possibly three-dimensional paths) in space, wherein the probes each are illustrated as having three beams with a center beam being the structural beam while the outer beams are the current carrying beams and wherein the structural beams are electrically isolated from the current carrying beams by dielectric end caps that are part of the probe body ends which are located near the ends of the beams and wherein various levels of interlocking of different materials is provided to enhance integrity of joined regions.

FIG. 10A provides a side view or cross-sectional view of a probe 1000A with planar S-shaped arms or beams (or three-dimensional S-shaped arms) where the ends of the structural beam 1011 fit into a complementary configuration of encapsulating dielectric material 1021 which in turn is surrounded by extension material 1031 and electrical arms or beams 1001 wherein a number of protruding, and even interlocking, elements engage complementary features of other materials to provide enhanced connections between such materials. Probe 1000A also includes tips having a similar configurations to those of FIGS. 7A-9F-9. As with the embodiments of FIGS. 6A-6C, in some variations of this embodiment, lateral adhesion may be extended by formation of one or more additional layers to provide front and/or back capping of beam ends by dielectric material or by conductive material (e.g. structural beam material, current carrying beam material, or tip extension material) which could also help further secure the beam ends and tip arms at the ends of the body portion 1061 of the probe while maintaining appropriate conductive isolation.

As can be seen in FIG. 10A, the ends 1001-E of current carrying or electric beam 1001 include laterally inward facing reentrant structures around which dielectric material is captured and thus retained in absence of a cohesive failure of either the dielectric 1021 or the features of the beam end 1001-E. The ends of current carrying arms also provide both end-to-end and side-to-side interfaces or meshing with the tip arm material which also tends to improve structural integrity of the interfaces. Similarly the left and right sides of the tip arm 1031 include inward facing extensions or bosses around with dielectric material is located with neither of the extensions having a reentrant configuration alone but when taken together forming a reentrant configuration that captures and retains the dielectric against the tip arm in absence of a cohesive failure of the dielectric or tip arm material. A similar combined re-entrant configuration and capturing of dielectric material occurs by the bosses and pockets formed as part of the structural beam end 1011-E. In alternative embodiments, other combinations of single feature inter-locking configurations, combined feature inter-locking configurations, and/or meshing configurations (microscale or microscale lateral and longitudinal interfaces) may be used or even configurations that combine such elements. As noted above, additional layers may be added to provide additional interface integrity or strength and retention capability with the additional layers adding additional interlocking, meshing or simple face-to-face interfaces.

Figure 10B:
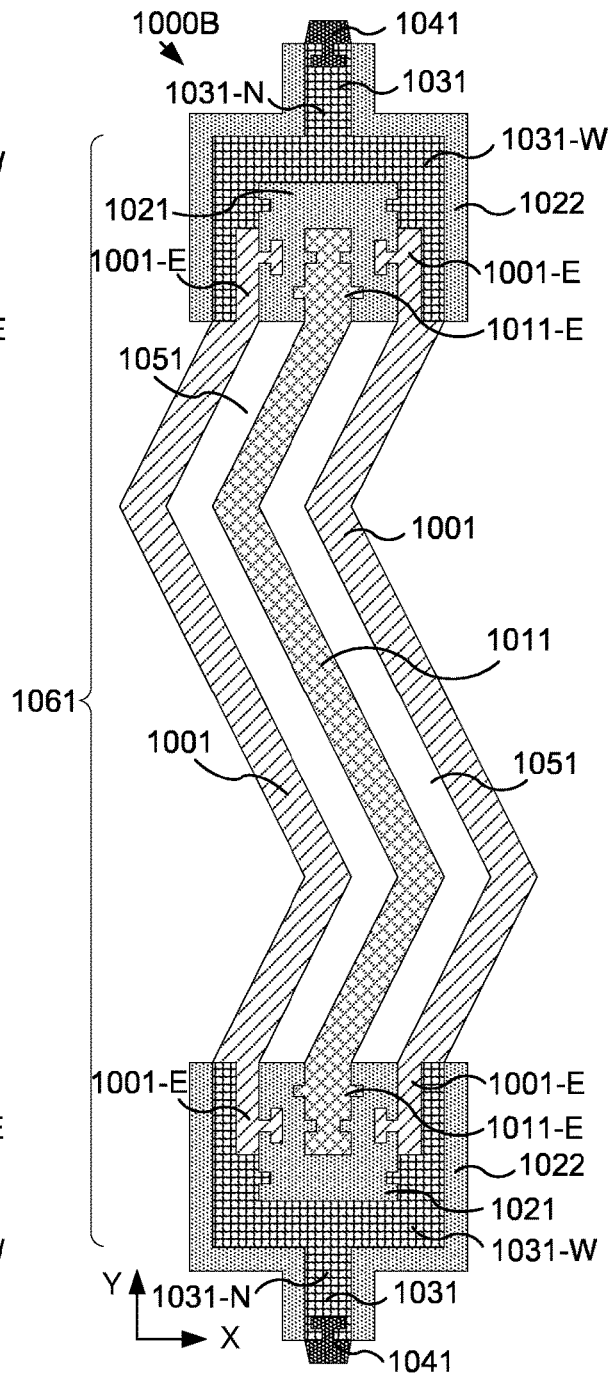

FIG. 10B provides a cross-sectional view of a probe 1000B similar to that of the FIG. 10A with the exception that a dielectric material 1022 extends around and over the tip extension material 1031 on both ends of the probe so that the only way to electrically engage the electrical beams 1001 (at least in the plane shown) is via the contact tip 1041 itself. As noted above, additional layers may be added to provide additional interface integrity or strength and retention capability with the additional layers adding additional interlocking, meshing or simple face-to-face interfaces. The additional layers may also provide for front and back dielectric material that completely limits electrical engagement to the probe tips themselves or selectively allows electrical engagement at specific locations (e.g. conductive contact via guide plate or other mounting structures could be eliminated or controlled).

Figure 10C:
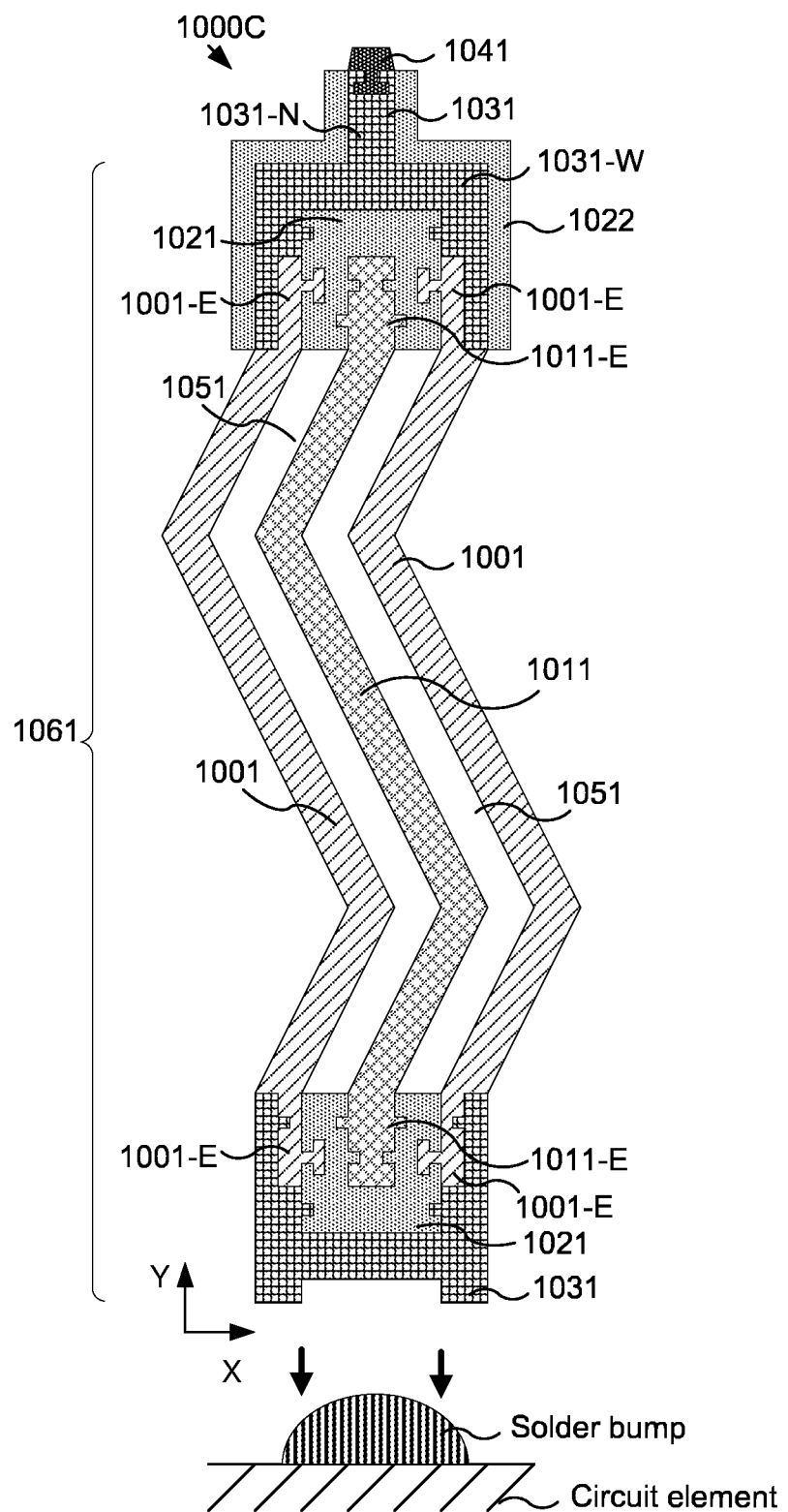

FIG. 10C provides a cross-sectional view of a probe 1000C similar to that of FIG. 10B with the exception that the probe does not have a bottom contact tip but instead is provided with a configuration of the tip arm 1031 with an indented center to allow connection to, and possible centering on, a solder bump of a surface to be engaged.

Figure 10D:
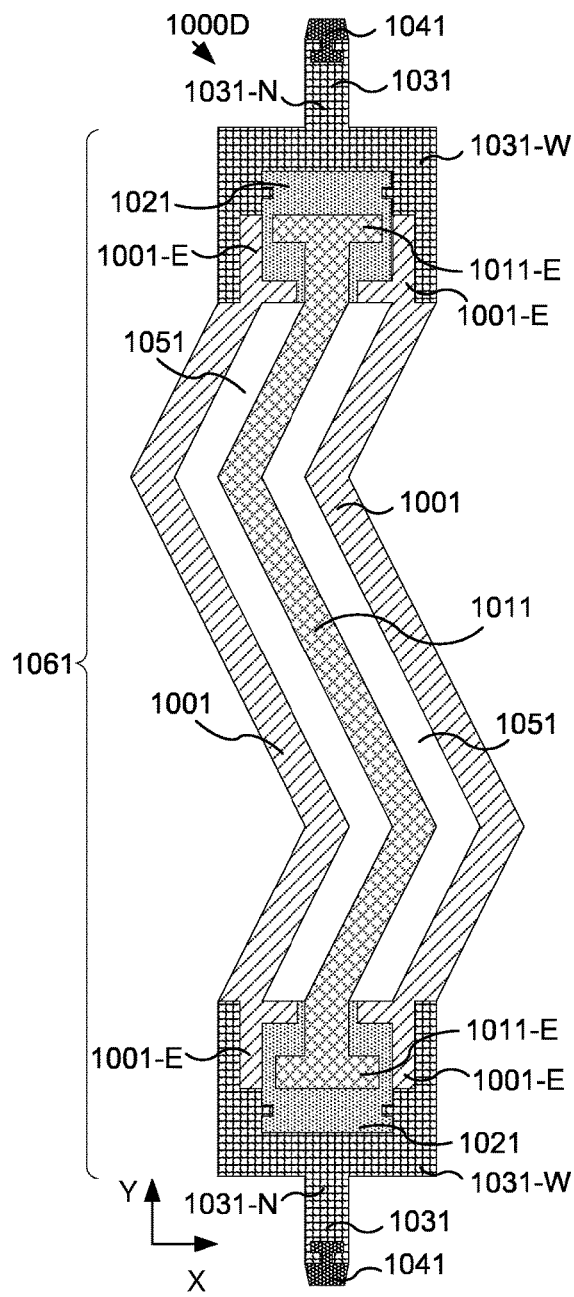

FIG. 10D provides a cross-sectional view of a probe 1000D similar to that of FIG. 10A but with the interlocking structures on the ends of current carrying beam 1001-E replaced with lateral extensions that bound a majority of the lateral length of the inside surface of the dielectric 1021 while the combination of bosses and recesses located on the end of structural beam 1011-E of FIG. 10A are replaced by a large tab that provides anchoring of the beam in the dielectric and where the combination of current carrying beam extensions and the anchor of the structural beam provide laterally overlapped regions that capture dielectric material between them and the surrounding tip arm material such that any stress that the dielectric would experience during normal operation of the probe would place the interfaces of the dielectric and surrounding conductive materials on compression, thus ensuring that structural failure will not occur in absence of a cohesive structure failure of one or more of the individual materials as opposed to an adhesive failure that can occur at a lower stress level. As noted above, additional layers may be added to provide additional interface integrity or strength and retention capability with the additional layers adding additional interlocking, meshing or simple face-to-face interfaces.

Figure 10E:
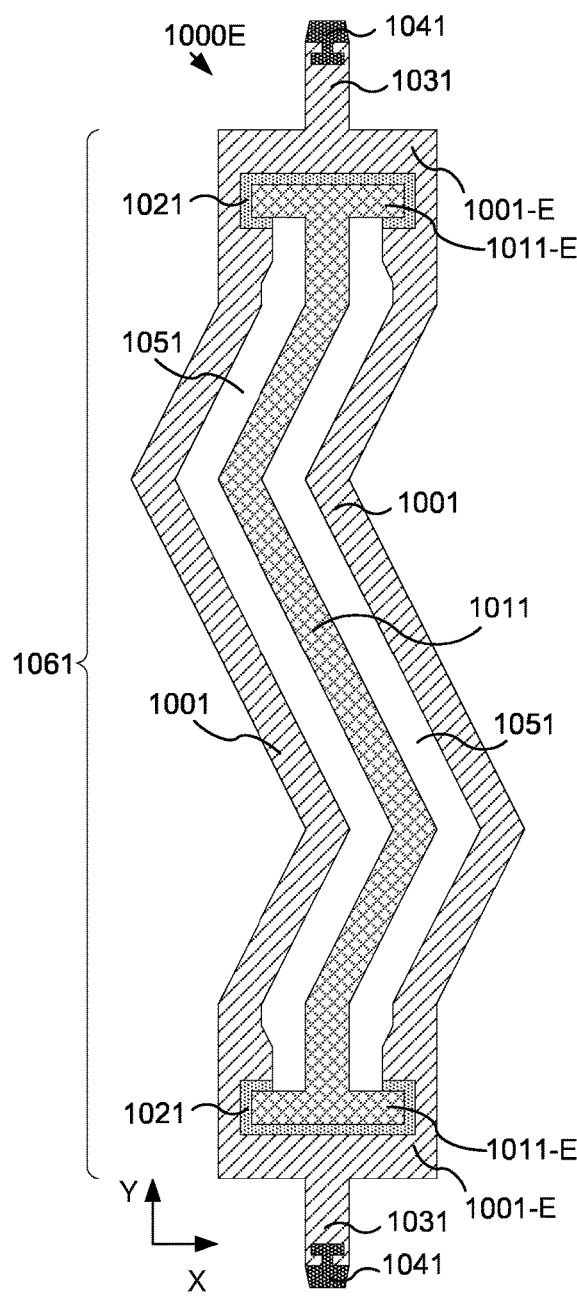

FIG. 10E provides a cross-sectional view of a probe 1000E similar to that of FIG. 10D but with current carrying beam 1001 extensions being less pronounced and with the lateral overlap of the such extensions relative to tab on the structure at the end of the structural beam 1011-E being less pronounced but none the less present. These extensions and anchoring structures provide anchoring of the beam in the dielectric as noted with regard to FIG. 10D. As noted above, additional layers may be added to provide additional interface integrity or strength and retention capability with the additional layers adding additional interlocking, meshing or simple face-to-face interfaces.

FIGS. 11A-11O respectively provide a top view, a side view, and a cut view of a probe 1100 which represents a variation of the probe 1000C according to another embodiment of the invention while FIGS. 11D-1-11D-5, respectively, provide views of the structural materials of the first to fifth layers L1-L5 that form the various elements or features of the probe wherein the probe is formed with probe tips 1141 as part of the third layer L3, tip arms or extensions 1131 formed as part of the second-fourth layers L2-L4, probe end bodies 1161-E, including the dielectric elements 1121 of L2-L4, formed as part of the first-fifth layers L1-L5, a pair of outer current carrying beams 1101 formed as part of the first layer L1 and another pair of current carrying beams 1101 formed as part of the fifth layer L5, and an inner or central structural beam 1111 formed as part of the third layer L3.

The embodiment of FIGS. 11A-11D-5 uses similar reference numbers as those used with the other embodiments but with the 1100 series forming the basis of the numbers. It is believed that the similarities and differences between probe 1100 and probe 1000C, as well as the other probes set forth herein, will be readily understood by those of skill in the art in view of the above description and the insights that are shown in the figures. As with the other embodiments, numerous alternatives exist and will be apparent to those of skill in the art with such alternatives including those noted above and those noted hereafter in association with other embodiments.

Figure 12A:
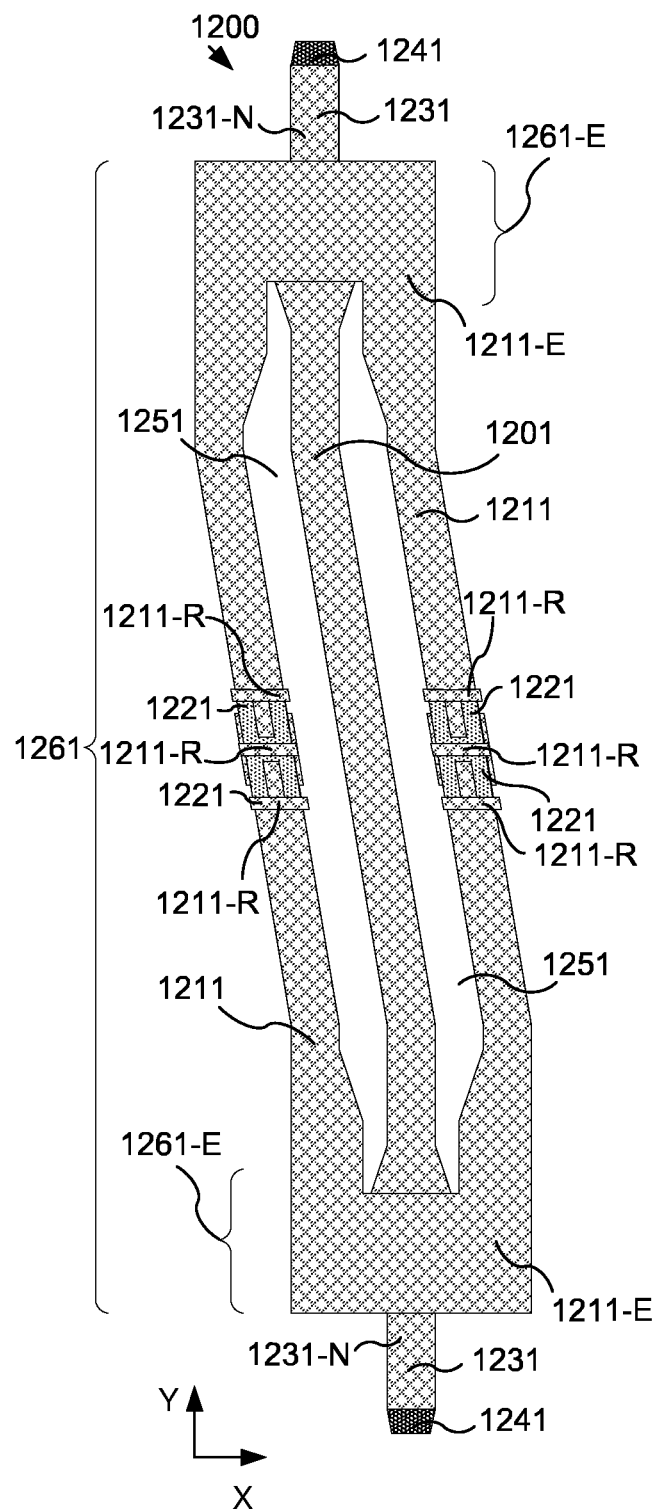
FIGS. 12A-12C respectively provide a top view, a side view, and a cut view of a probe according to another embodiment of the invention while FIGS. 12D-1-12-D9, respectively, provide views of the structural materials of the first-ninth layers that form the various elements or features of the probe wherein the probe provides a central conducting arm and four structural beams with dielectric barriers located in the middle of the beams as opposed to being on one or both ends of the beams, wherein the probe is formed with probe tips as part of the fifth layer, supporting elements, or tip arms, formed as part of the fourth-sixth layers, probe end bodies, formed as part of the second-eighth layers, a central current carrying beam as part of the fifth layer, and pairs of structural beams as part of both the second and eighth layers.
Figure 12B:
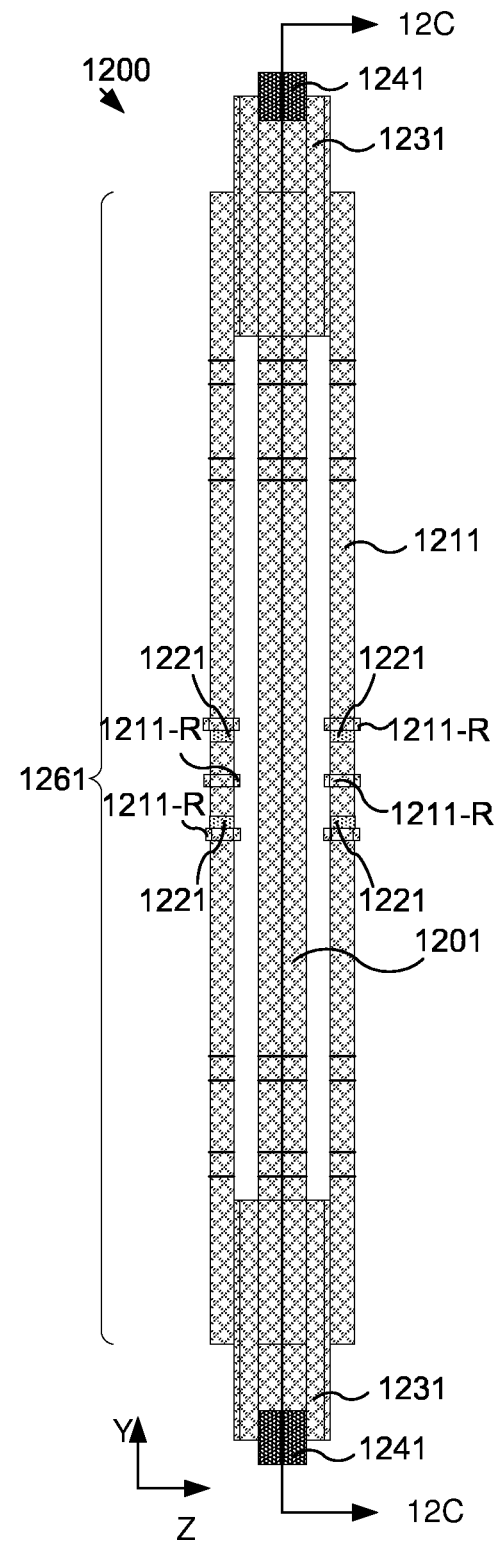
Figure 12C:
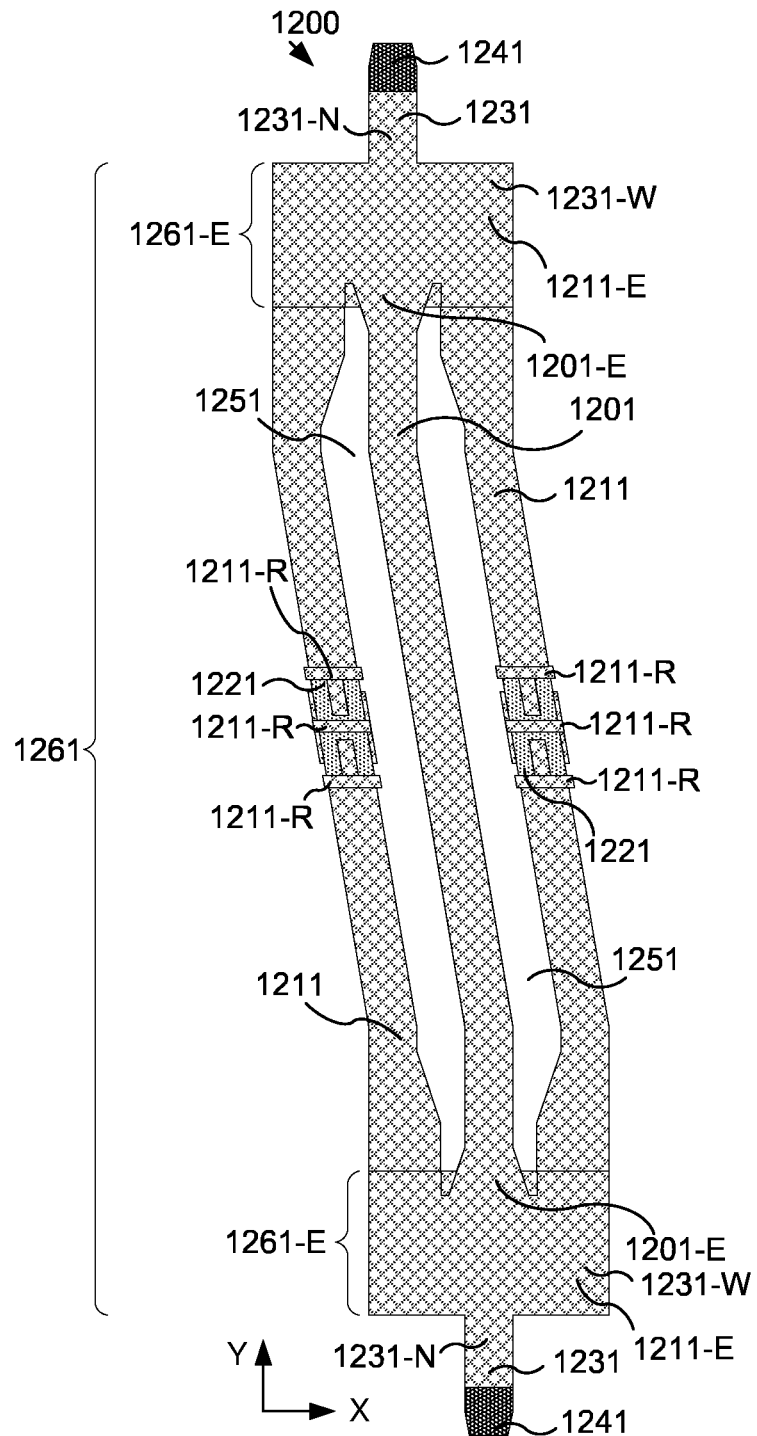
Figures 9, 12D:
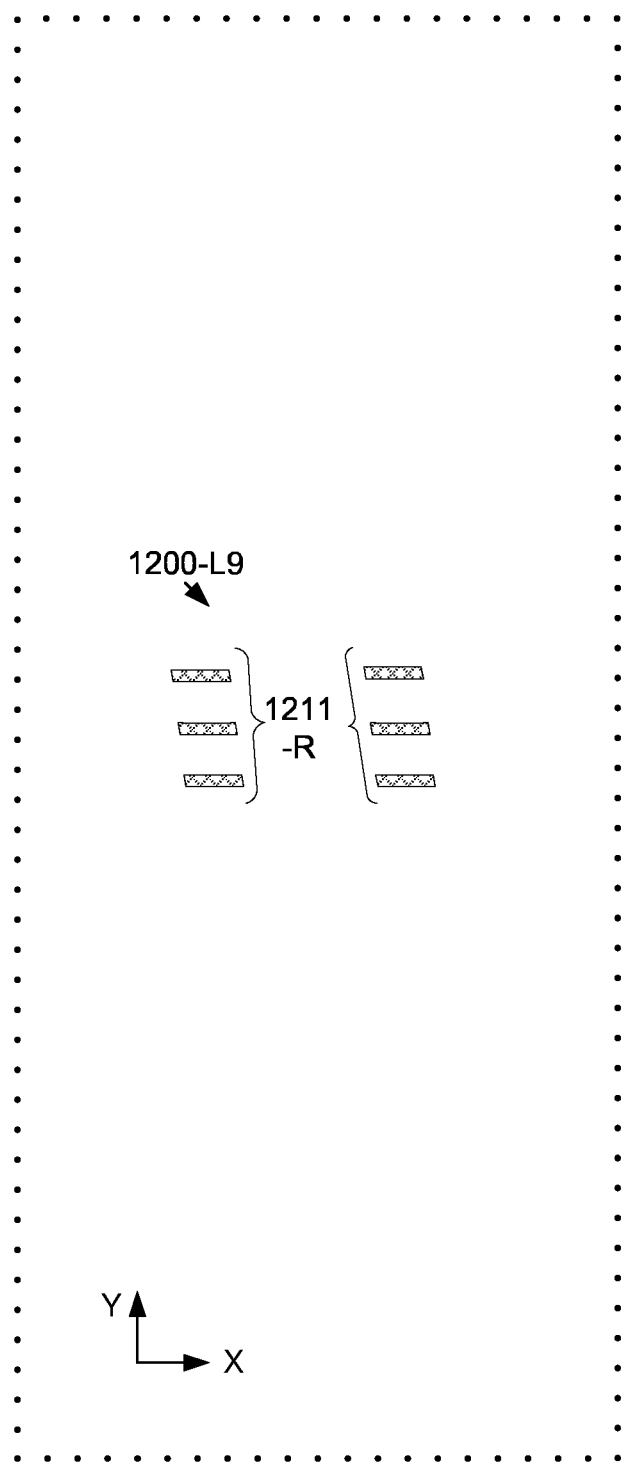

FIGS. 12A-12C respectively provide a top view, a side view, and a cut view of a probe 1200 according to an another embodiment of the invention while FIGS. 12D-1-12-D9, respectively, provide views of the structural materials of the first-ninth layers L1-L9 that form the various elements or features of the probe wherein the probe provides a central current carrying beam 1201 and four structural beams 1211 with dielectric barriers 1221 located in the middle of the beams as opposed to being on one or both ends of the beams (as was the case with the other specific embodiments set forth herein), wherein the probe 1200 is formed with probe tips 1241 as part of the fifth layer L5, tip arms or tip extensions 1231, formed as part of the fourth-sixth layers L4-L6, probe end bodies 1261-E, formed as part of the second-eighth layers L2-L8, a central current carrying beam 1201 as part of the fifth layer L5, and pairs of structural beams 1211 along with central dielectric element 1221 as part of both the second and eighth layers L2 and L8, along with bridge or retention elements 1211-R formed as parts of the first to third layers L1-L3 and seventh to ninth layers L7-L9 that clamp and secure the dielectric elements of the second and eight layers L2 and L8. The central bridge elements 1211-R on L1-L3 only contact dielectric material and thus do not form a conductive bridge that extends across the dielectric barrier to connect conductive material on either side. The bridge elements displaced from the central axis of the probe contact both dielectric and conductive material on their sides of the dielectric but again do not form a bridge that longitudinally crosses the dielectric barrier to connect conductive material on both sides. The central bridge and the other two bridges act to place the dielectric barrier associated with each beam in compression. In the embodiment of probe 1200, the dielectric material preferably has sufficient elastic compliance that it can withstand any deformation and stress induced in the central portions of their respective beams though in some embodiment variations, the central portions of the structural beams may be thickened or widened to reduce stress in the dielectric region by shifting the stress and associated deflection to other beam regions. As with the other embodiments, numerous other alternatives exist and will be apparent to those of skill in the art with such alternatives including those noted above with regard to other embodiments or those associated with embodiments set forth in the patent applications incorporated herein by reference. In some such embodiments, additional layers may be formed such that dielectric material may be added to the layers above and below the structural arms with the bridging element 1211-R above and below the structural beams pushed up and down one or more layers such that they can have larger areas and only contact dielectric material.

Further Comments and Conclusions

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more other materials, beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 (P-US032-A-SC), which is entitled "Electrochemical Fabrication Methods Incorporating Dielectric Materials and/or Using Dielectric Substrates"; (2) U.S. Patent Application No. 60/533,932 (P-US033-A-MF), which is entitled "Electrochemical Fabrication Methods Using Dielectric Substrates"; (3) U.S. Patent Application No. 60/534,157 (P-US041-A-MF), which is entitled "Electrochemical Fabrication Methods Incorporating Dielectric Materials"; (4) U.S. Patent Application No. 60/533,891 (P-US052-A-MF), which is entitled "Methods for Electrochemically Fabricating Structures Incorporating Dielectric Sheets and/or Seed layers That Are Partially Removed Via Planarization"; and (5) U.S. Patent Application No. 60/533,895 (P-US070-B-

MF), which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent application Ser. No. 11/139,262 (P-US144-A-MF), filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216 (P-US128-A-MF), filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (4) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (6) U.S. patent application Ser. No. 11/325,405 (P-US152-A-MF), filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931 (P-US075-A-MG), by Brown, et al., which was filed on Jun. 27, 2003, now U.S. Pat. No. 7,239,219, and which is entitled "Miniature RF and Microwave Components and Methods for Fabricating Such Components"; (8) U.S. patent application Ser. No. 10/841,006 (P-US104-A-MF), by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295 (P-US061-A-MG), by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556 (P-US081-A-MG), by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in U.S. patent application Ser. No. 10/841,384 (P-US103-A-SC), which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| US Pat App No., Filing Date US App Pub No., Pub Date US Patent No., Pub Date | First Named Inventor, Title |
|---|---|
| 10/271,574 - Oct. 15, 2002 2003-0127336 - Jul. 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-0221968 - Dec. 4, 2003 — | Cohen, "Electrochemical Fabrication Method and Application for Producing Three-Dimensional Structures Having Improved Surface Finish" |
| 10/434,289 - May 7, 2003 2004-0065555 - Apr. 8, 2004 | Zhang, "Conformable Contact Masking Methods and Apparatus Utilizing In Situ Cathodic Activation of a Substrate" |
| 10/434,294 - May 7, 2003 2004-0065550 - Apr. 8, 2004 | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Oct. 29, 2003 2004-0146650 - Jul. 29, 2004 | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |

| US Pat App No., Filing Date US App Pub No., Pub Date US Patent No., Pub Date | First Named Inventor, Title |
|---|---|
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some methods of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, and/or rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference), and they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A probe for testing a device under test (DUT), comprising:
   (a) a first tip for making electrical contact to an electrical circuit element, the first tip having a contact region and an attachment region;
   (b) a first extension arm connecting directly or indirectly to the attachment region of the first tip;
   (c) a compliant spring structure comprising at least one electrical beam and at least one structural beam which are decoupled from one another such that no electrical current flows through the at least one structural beam and is physically decoupled such that no heat is conducted from the at least one electrical beam to the at least one structural beam along more than 67% of the length of the at least one structural beam wherein the at least one electrical beam contributes to a percentage of spring force selected from the group consisting of: (1) less than 30%, (2) less than 20%, (3) less than 10%, (4) less than 5% as compared to a probe lacking the at least one electrical beam during an operational state selected from the group consisting of: (1) a steady state operation of the probe, and (2) an initial compression of the probe prior to steady state operation, and wherein the compliant spring structure comprises at least one dielectric material that provides a property selected from the group consisting of: (1) partial electrical isolation between at least one electrical beam and the at least one structural beam, (2) dielectric spacing between at least one portion of at least one electrical beam and the at least one structural beam, (3) enhanced thermal isolation between at least one portion of at least one electrical beam and at least one structural beam;
   (d) a second extension arm joining a second region of the compliant spring structure such that relative displacement of the first and second extension arms results in elastic movement of at least one spring segment of the compliant spring structure; and
   (e) a second tip having a first attachment region and a second region wherein the first attachment region of the second tip directly or indirectly joins the second extension arm, wherein the second region of the second tip is configured for making an electrical connection to a second circuit element, wherein the configuration is selected from the group consisting of: (1) a tip for making a contact connection, and (2) a tip for making an attached connection,
   wherein a connection between the dielectric and one of the beams is selected from the group consisting of: (1) a structural beam, and (2) an electrical beam comprising an attachment selected from the group consisting of: (1) a meshed connection, (2) an interlocked connection, (3) a combined meshed and interlocked connection.

2. The probe of claim 1 wherein the at least one structural beam comprises at least two structural beams.

3. The probe of claim 1 wherein the at least one structural beam comprises at least three structural beams.

4. The probe of claim 1 wherein the at least one electrical beam comprises at least two electrical beams.

5. The probe of claim 1 wherein the at least one electrical beam comprises at least three electrical beams.

6. The probe of claim 1 wherein both the at least one electrical beam and the at least one structural beam comprise metals.

7. The probe of claim 1 wherein the first tip, the second tip, or both comprises a metal.

8. The probe of claim 1 wherein the extension arms comprise a metal.

9. The probe of claim 1 wherein at least a portion of at least one of the at least one structural beam comprises a ceramic.

10. The probe of claim 9 wherein the ceramic is a dielectric.

11. The probe of claim 1 wherein at least a portion of at least one of the at least one structural beam comprises dielectric silicon.

12. The probe of claim 11 wherein a super majority more than 67% of the at least one structural beam that comprises dielectric silicon is dielectric silicon.

13. The probe of claim 1 wherein at least two of a structural beam, an electrical beam, a tip extension, and a tip comprise a common metal.

14. The probe of claim 1 wherein at least three of a structural beam, an electrical beam, a tip extension, and a tip comprise a common metal.

15. The probe of claim 14 wherein at least one structural beam and at least one electric beam comprise the same metal.

16. The probe of claim 14 wherein at least one structural beam and at least one electric beam comprise different metals.

17. The probe of claim 1 wherein a connection that places at least a portion of a dielectric in compression between features selected from the group consisting of: (i) at least one structural beam and at least one current carrying beam, (ii) at least one structural beam and a tip extension, (iii) at least one current carrying beam and a tip extension, (iv) at least one widened portion of a current carrying beam and a structural beam, (v) at least one widened portion of a current carrying beam and a tip extension, (vi) at least one widened portion of a structural beam and a current carrying beam, (vii) at least one widened portion of a structural beam and a tip extension, (viii) at least one widened portion of a tip extension and a current carrying beam, (ix) at least one widened portion of a tip extension and a structural beam, (x) two electrically isolated portions of a structural beam, (xi) two at least partially opposing tip extension regions, (xii) two at least partially opposing portions of at least two current carrying beams, and (xiii) two at least partially opposing portions of at least two structural beams.

18. A probe for testing electronic components, comprising:
   a first tip for making electrical contact to a first electronic component, the first tip having a contact region and an attachment region;
   a first tip extension arm connecting directly or indirectly to the attachment region of the first tip;
   a compliant spring structure comprising at least one electrical beam and at least one structural beam which are electrically and physically decoupled from one another such that no electrical current flows through the at least one structural beam and no heat is conducted from the at least one electrical beam to the at least one structural beam along a length of the at least one structural beam;
   a second tip extension arm joining a second region of the compliant spring structure such that relative displacement of the first and second tip extension arms results in elastic movement of the compliant spring structure; and
   a second tip having an attachment region and a contact region wherein the attachment region of the second tip directly or indirectly joins the second tip extension arm and the contact region of the second tip is configured for making an electrical connection to a second electronic component, wherein the configuration is selected from a group consisting of: (i) a tip for making a contact connection, and (ii) a tip for making an attached connection, wherein the compliant spring structure comprises at least one dielectric material disposed between the at least one electrical beam and the at least one structural beam, and wherein a connection between the at least one dielectric material and one of the beams being a structural beam or an electrical beam comprises an attachment selected from a group consisting of: (i) a meshed connection, (ii) an interlocked connection, and (iii) a combined meshed and interlocked connection.

19. The probe of claim 18 wherein no heat is conducted from the at least one electrical beam to the at least one structural beam along a length chosen in a group consisting of: (i) greater than 50% of the length of the at least one structural beam; (ii) greater than 67% of the length of the at least one structural beam; (iii) greater than 80% of the length of the at least one structural beam; and (iv) equal to 90% of the length of the at least one structural beam.

20. The probe of claim 18 wherein the at least one electrical beam contributes to a percentage of spring force selected from a group consisting of:
(i) less than 30%, (ii) less than 20%, (iii) less than 10%; and (iv) less than 5% as compared to a probe lacking the at least one electrical beam during an operational state selected from a group consisting of: (i) a steady state operation of the probe, and (ii) an initial compression of the probe prior to steady state operation.

21. The probe of claim 18 wherein the at least one dielectric material is chosen to provide a property selected from a group consisting of: (i) partial electrical isolation between the at least one electrical beam and the at least one structural beam, (ii) dielectric spacing between at least one portion of at least one electrical beam and the at least one structural beam, (iii) enhanced thermal isolation between at least one portion of at least one electrical beam and at least one structural beam.

22. The probe of claim 18 wherein the at least one structural beam is selected from a group consisting of: (i) the at least one structural beam comprises at least two structural beams; and (ii) the at least one structural beam comprises at least three structural beams.

23. The probe of claim 1 wherein the at least one electrical beam is selected from a group consisting of: (i) the at least one electrical beam comprises at least two electrical beams; and (ii) the at least one electrical beam comprises at least three electrical beams.

24. The probe of claim 1 wherein at least one between the at least one electrical beam, the at least one structural beam, the first and second tips, and the first and second tip extension arms comprise a metal.

25. The probe of claim 1 wherein at least two between a structural beam, an electrical beam, a tip extension arm, and a tip comprise a same metal.

26. The probe of claim 1 wherein at least three between a structural beam, an electrical beam, a tip extension arm, and a tip comprise a same metal.

27. The probe of claim 1 wherein at least a portion of the at least one structural beam comprises a material selected from a group consisting of: (i) a ceramic; (ii) a dielectric ceramic; and (iii) a dielectric silicon.

28. The probe of claim 18 wherein the connection between the at least one dielectric material and one of the beams being a structural beam or an electrical beam comprises a connection that places at least a portion of a dielectric in compression between features selected from a group consisting of: (i) at least one structural beam and at least one electrical beam, (ii) at least one structural beam and a tip extension arm, (iii) at least one electrical beam and a tip extension arm, (iv) at least one widened portion of an electrical beam and a structural beam, (v) at least one widened portion of an electrical beam and a tip extension arm, (vi) at least one widened portion of a structural beam and an electrical beam, (vii) at least one widened portion of a structural beam and a tip extension arm, (viii) at least one widened portion of a tip extension arm and an electrical beam, (ix) at least one widened portion of a tip extension arm and a structural beam,
 (x) two electrically isolated portions of a structural beam, (xi) two at least partially opposing tip extension regions, (xii) two at least partially opposing portions of at least two electrical beams, and (xiii) two at least partially opposing portions of at least two structural beams.

29. The probe of claim 1 wherein the at least one dielectric material connects between the at least one electrical beam and the at least one structural beam according to a disposition selected in a group consisting of: (i) a side of the at least one electrical beam with an end of the at least one structural beam; (ii) a side of the at least one electrical beam with a side of the at least one structural beam; (iii) a side the at least one structural beam with an end of the at least one electrical beam via a tip extension arm; and (iii) a side the at least one structural beam with a side of the at least one electrical beam via a tip extension arm.

30. The probe of claim 29 wherein the at least one dielectric material surrounds at least one end of the at least one structural beam.

31. The probe of claim 18 further comprising a dielectric barrier material attached to at least one beam between the at least one electrical beam and the at least one structural beam.

32. The probe of claim 31 wherein the dielectric barrier material coats at least one beam between the at least one electrical beam and the at least one structural beam.

33. The probe of claim 31 wherein at least one beam between the at least one electrical beam and the at least one structural beam has at least one end separated by at least one of the first and second tip extension arms by a gap, the at least one end contacting inner walls of the gap upon deflection of the probe.

34. The probe of claim 18 wherein the first and second tip extension arms comprise notches engaging at least one end of at least one beam between the at least one electrical beam and the at least one structural beam.

35. The probe of claim 34 wherein the first and second tip extension arms and at least one end of at least one between the at least one electrical beam and the at least one structural beam engaged one another comprises a number of protruding, interlocking, elements engage complementary features.

36. The probe of claim 18 further comprising at least one bridge element connected to the at least one structural beam and connecting opposite sides thereof.

37. The probe of claim 18 wherein the at least one electrical beam and the at least one structural beam have shapes selected from a group consisting of: (i) straights (ii) defining two-dimensional paths; (iii) defining three-dimensional paths in space: (iv) planar S- shapes; and (iv) three-dimensional S-shapes.

38. A probe for testing electronic components, comprising:
- a first tip for making electrical contact to a first electronic component, the first tip having a contact region and an attachment region;
- a first tip extension arm connecting directly or indirectly to the attachment region of the first tip;
- a compliant spring structure comprising at least one electrical beam and at least one structural beam which are electrically and physically decoupled from one another such that no electrical current flows through the at least one structural beam and no heat is conducted from the at least one electrical beam to the at least one structural beam along a length of the at least one structural beam;
- a second tip extension arm joining a second region of the compliant spring structure such that relative displacement of the first and second tip extension arms results in elastic movement of the compliant spring structure; and
- a second tip having an attachment region and a contact region wherein the attachment region of the second tip directly or indirectly joins the second tip extension arm and the contact region of the second tip is configured for making an electrical connection to a second electronic component, wherein the configuration is selected from a group consisting of: (i) a tip for making a contact connection, and (ii) a tip for making an attached connection,
- wherein the compliant spring structure comprises at least one dielectric material disposed between the at least one electrical beam and the at least one structural beam, and
- wherein the probe further comprises at least one bridge element connected to the at least one structural beam and connecting opposite sides thereof.

39. The probe of claim 38 wherein no heat is conducted from the at least one electrical beam to the at least one structural beam along a length chosen in a group consisting of: (i) greater than 50% of the length of the at least one structural beam; (ii) greater than 67% of the length of the at least one structural beam; (iii) greater than 80% of the length of the at least one structural beam; and (iv) equal to 90% of the length of the at least one structural beam.

40. The probe of claim 38 wherein the at least one electrical beam contributes to a percentage of spring force selected from a group consisting of: (i) less than 30%, (ii) less than 20%, (iii) less than 10%; and (iv) less than 5% as compared to a probe lacking the at least one electrical beam during an operational state selected from a group consisting of: (i) a steady state operation of the probe, and (ii) an initial compression of the probe prior to steady state operation.

41. The probe of claim 38 wherein the at least one dielectric material is chosen to provide a property selected from a group consisting of: (i) partial electrical isolation between the at least one electrical beam and the at least one structural beam, (ii) dielectric spacing between at least one portion of at least one electrical beam and the at least one structural beam, and (iii) enhanced thermal isolation between at least one portion of at least one electrical beam and at least one structural beam.

42. The probe of claim 38 wherein the at least one structural beam is selected from a group consisting of: (i) the at least one structural beam comprises at least two structural beams; and (ii) the at least one structural beam comprises at least three structural beams.

43. The probe of claim 38 wherein a connection between the at least one dielectric material and one of the beams being a structural beam or an electrical beam comprises an attachment selected from a group consisting of: (i) a meshed connection, (ii) an interlocked connection, (iii) a combined meshed and interlocked connection, (iv) a connection that places at least a portion of a dielectric in compression between features selected from a group consisting of: (i) at least one structural beam and at least one electrical beam, (ii) at least one structural beam and a tip extension arm, (iii) at least one electrical beam and a tip extension arm, (iv) at least one widened portion of an electrical beam and a structural beam, (v) at least one widened portion of an electrical beam and a tip extension arm, (vi) at least one widened portion of a structural beam and an electrical beam, (vii) at least one widened portion of a structural beam and a tip extension arm, (viii) at least one widened portion of a tip extension arm and an electrical beam, (ix) at least one widened portion of a tip extension arm and a structural beam, (x) two electrically isolated portions of a structural beam, (xi) two at least partially opposing tip extension regions, (xii) two at least partially opposing portions of at least two electrical beams, and (xiii) two at least partially opposing portions of at least two structural beams.

44. The probe of claim 43 wherein the at least one dielectric material surrounds at least one end of the at least one structural beam.

45. The probe of claim 38 further comprising a dielectric barrier material attached to at least one beam between the at least one electrical beam and the at least one structural beam.

46. The probe of claim 45 wherein the dielectric barrier material coats at least one beam between the at least one electrical beam and the at least one structural beam.

47. The probe of claim 45 wherein at least one beam between the at least one electrical beam and the at least one structural beam has at least one end separated by at least one of the first and second tip extension arms by a gap, the at least one end contacting inner walls of the gap upon deflection of the probe.

48. The probe of claim 38 wherein the first and second tip extension arms comprise notches engaging at least one end of at least one beam between the at least one electrical beam and the at least one structural beam.

49. The probe of claim 48 wherein the first and second tip extension arms and at least one end of at least one between the at least one electrical beam and the at least one structural beam engaged one another comprises a number of protruding, interlocking, elements engage complementary features.

50. The probe of claim 38 wherein the at least one electrical beam and the at least one structural beam have shapes selected from a group consisting of: (i) straights (ii) defining two-dimensional paths; (iii) defining three-dimensional paths in space: (iv) planar S-shapes; and (iv) three-dimensional S-shapes.

* * * * *